US007288931B2

(12) United States Patent
Granig et al.

(10) Patent No.: US 7,288,931 B2
(45) Date of Patent: Oct. 30, 2007

(54) METHOD FOR DETERMINING RESIDUAL ERROR COMPENSATION PARAMETERS FOR A MAGNETORESISTIVE ANGLE SENSOR AND METHOD FOR REDUCING A RESIDUAL ANGLE ERROR IN A MAGNETORESISTIVE ANGLE SENSOR

(75) Inventors: Wolfgang Granig, Sachsenburg (AT); Dirk Hammerschmidt, Villach (AT); Juergen Zimmer, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/421,308

(22) Filed: May 31, 2006

(65) Prior Publication Data

US 2006/0290545 A1 Dec. 28, 2006

(30) Foreign Application Priority Data

May 31, 2005 (DE) .................... 10 2005 024 879

(51) Int. Cl.
*G01R 35/00* (2006.01)

(52) U.S. Cl. ............ 324/202; 324/207.12; 324/207.21; 324/207.23; 324/207.25; 341/118; 702/85; 702/151

(58) Field of Classification Search ................. 324/202
See application file for complete search history.

(56) References Cited

U.S. PATENT DOCUMENTS

| 6,304,074 | B1 * | 10/2001 | Waffenschmidt ............ 324/202 |
| 6,374,190 | B2 * | 4/2002 | Schupfner .................... 702/94 |
| 6,401,052 | B1 | 6/2002 | Herb et al. ................. 702/150 |
| 6,496,784 | B1 * | 12/2002 | Dukart et al. ................ 702/94 |
| 6,534,969 | B1 * | 3/2003 | Dietmayer ............ 324/207.12 |
| 6,686,733 | B2 | 2/2004 | Muth ......................... 324/202 |
| 6,693,423 | B2 * | 2/2004 | Weser .................... 324/207.25 |
| 6,943,544 | B2 | 9/2005 | Waffenschmidt ....... 324/207.21 |
| 2003/0042894 | A1 | 3/2003 | Waffenschmidt ....... 324/207.21 |
| 2003/0076009 | A1 | 4/2003 | Hoffman et al. ............ 310/332 |
| 2005/0278137 | A1 | 12/2005 | Hammerschmidt et al. . 702/151 |

FOREIGN PATENT DOCUMENTS

| DE | 10052609 A1 | 10/2000 |
| DE | 100 34 733 A1 | 2/2001 |
| DE | 101 30 988 A1 | 6/2001 |
| DE | 10130988 A1 | 6/2001 |
| DE | 101 48 918 A1 | 10/2001 |
| DE | 10148918 A1 | 10/2001 |
| DE | 10163528 A1 | 12/2001 |
| DE | 100 52 609 A1 | 5/2002 |
| DE | 101 54 153 A1 | 5/2003 |
| DE | 101 54 154 A1 | 5/2003 |
| DE | 101 63 528 A1 | 7/2003 |
| DE | 10260862 | 7/2004 |
| DE | 10 2004 024 398 A1 | 12/2005 |
| DE | 10 2004 029 815 A1 | 1/2006 |
| EP | 1544580 | 6/2005 |

* cited by examiner

*Primary Examiner*—Khai M. Nguyen
(74) *Attorney, Agent, or Firm*—Eschweiler & Associates, LLC

(57) ABSTRACT

In a method of determining residual error compensation parameters for a magnetoresistive angle sensor providing a first measurement signal depending on a rotational angle the step of generating a plurality of value pairs for a plurality of rotational angle values is provided, wherein each value pair has a rotational angle value and an associated measurement signal value. The method further includes ascertaining a sinusoidal fit function the course of which is adapted to the plurality of value pairs. Finally, residual error compensation parameters can be generated from a difference between the ascertained sinusoidal fit function and the associated measurement signal values of the measurement signal for the plurality of rotational angle values.

64 Claims, 18 Drawing Sheets

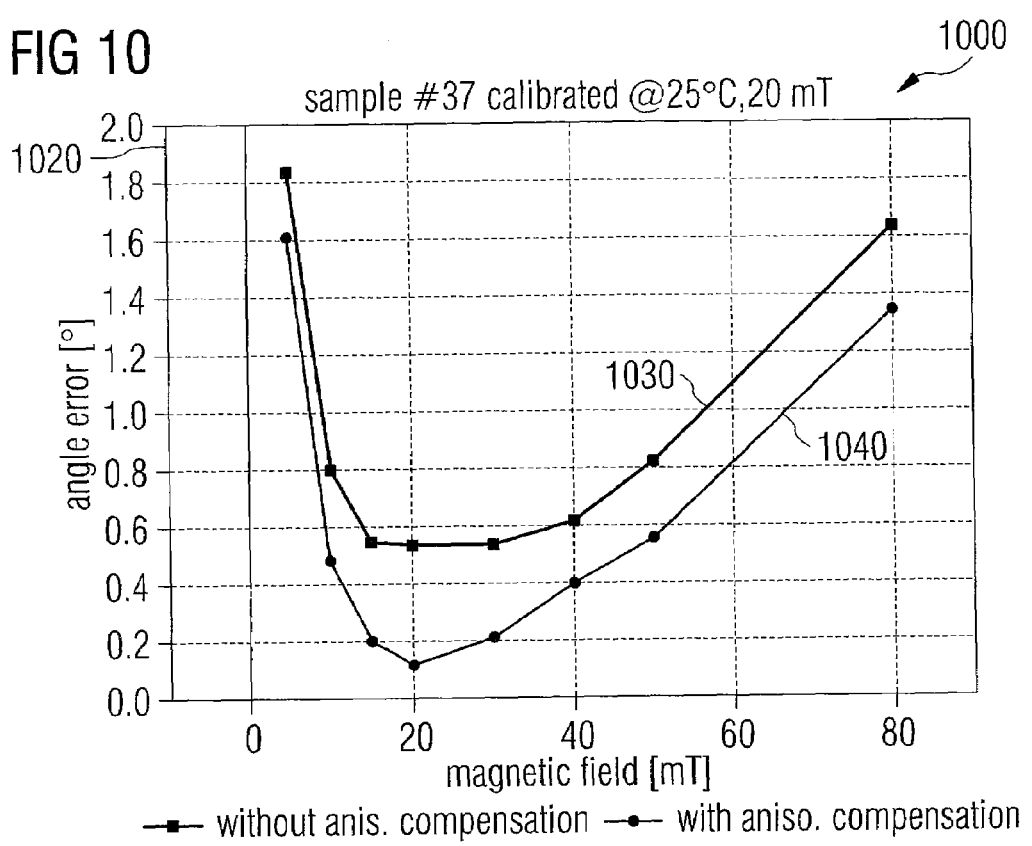
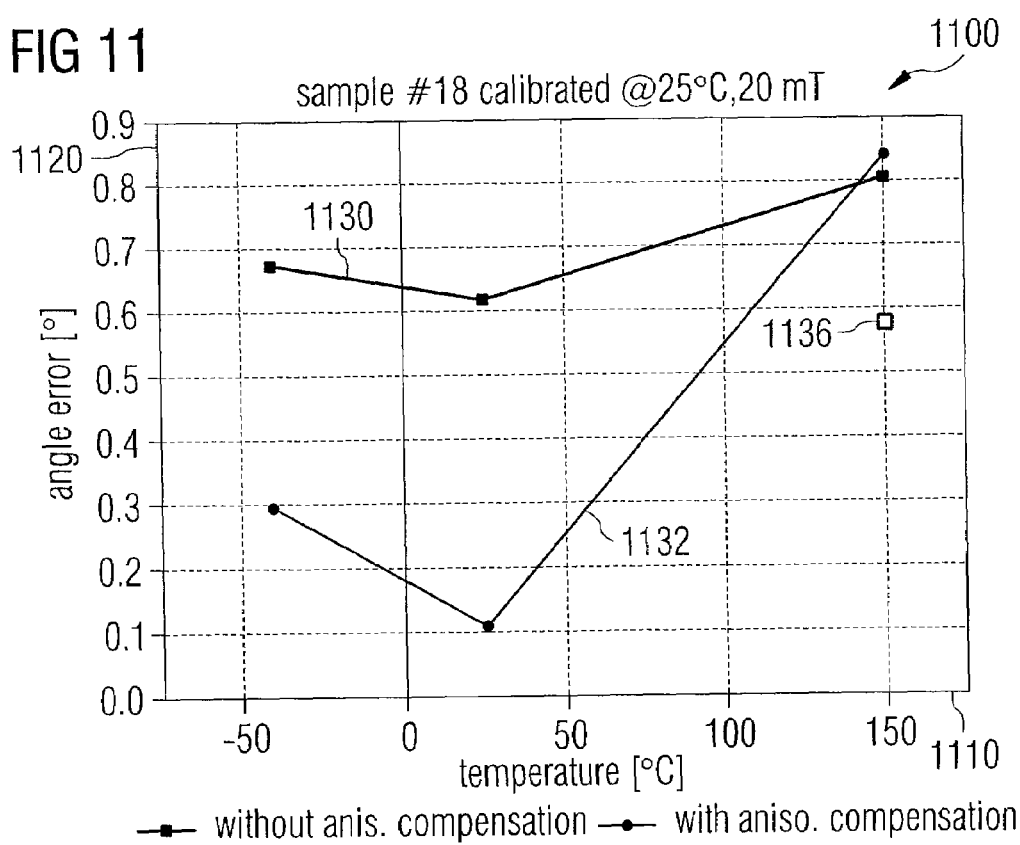

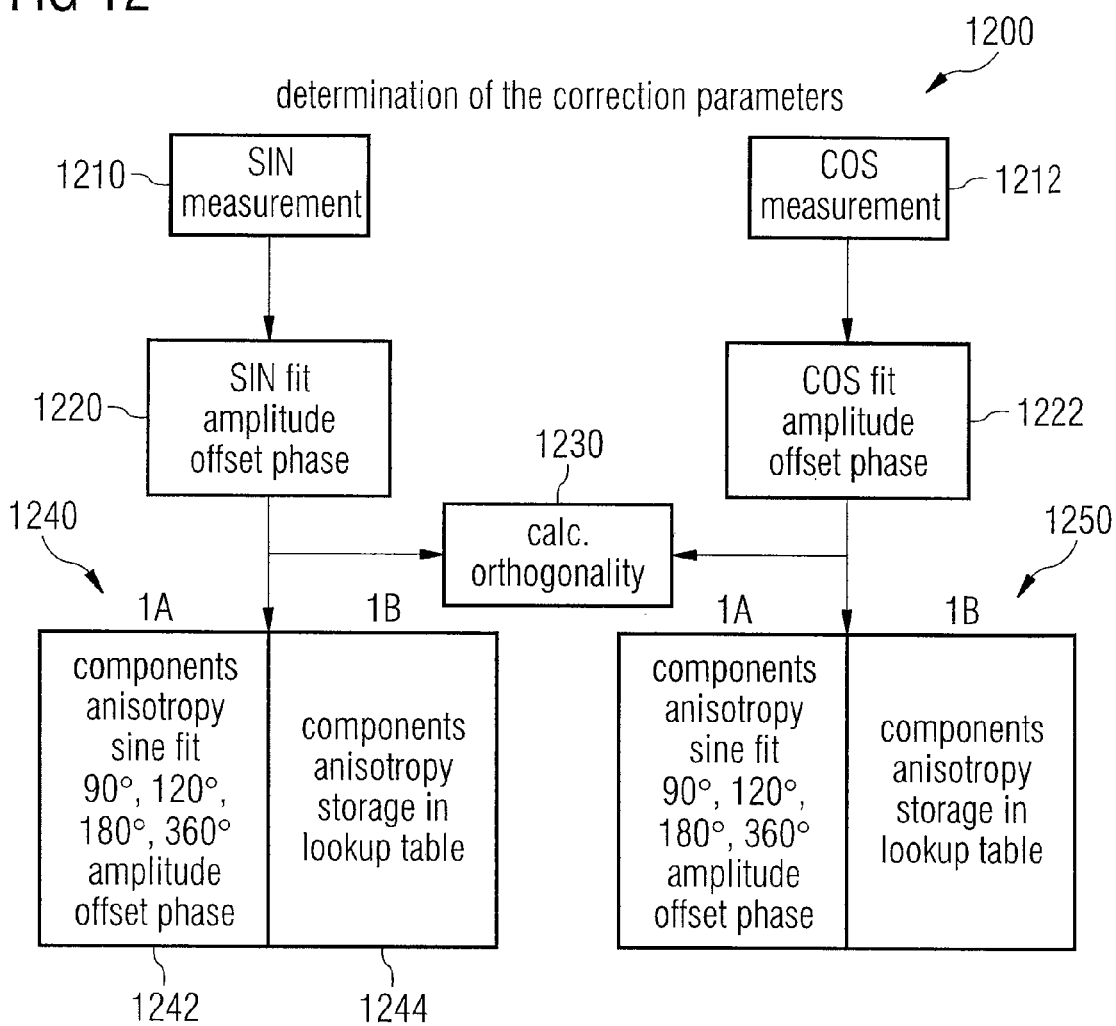

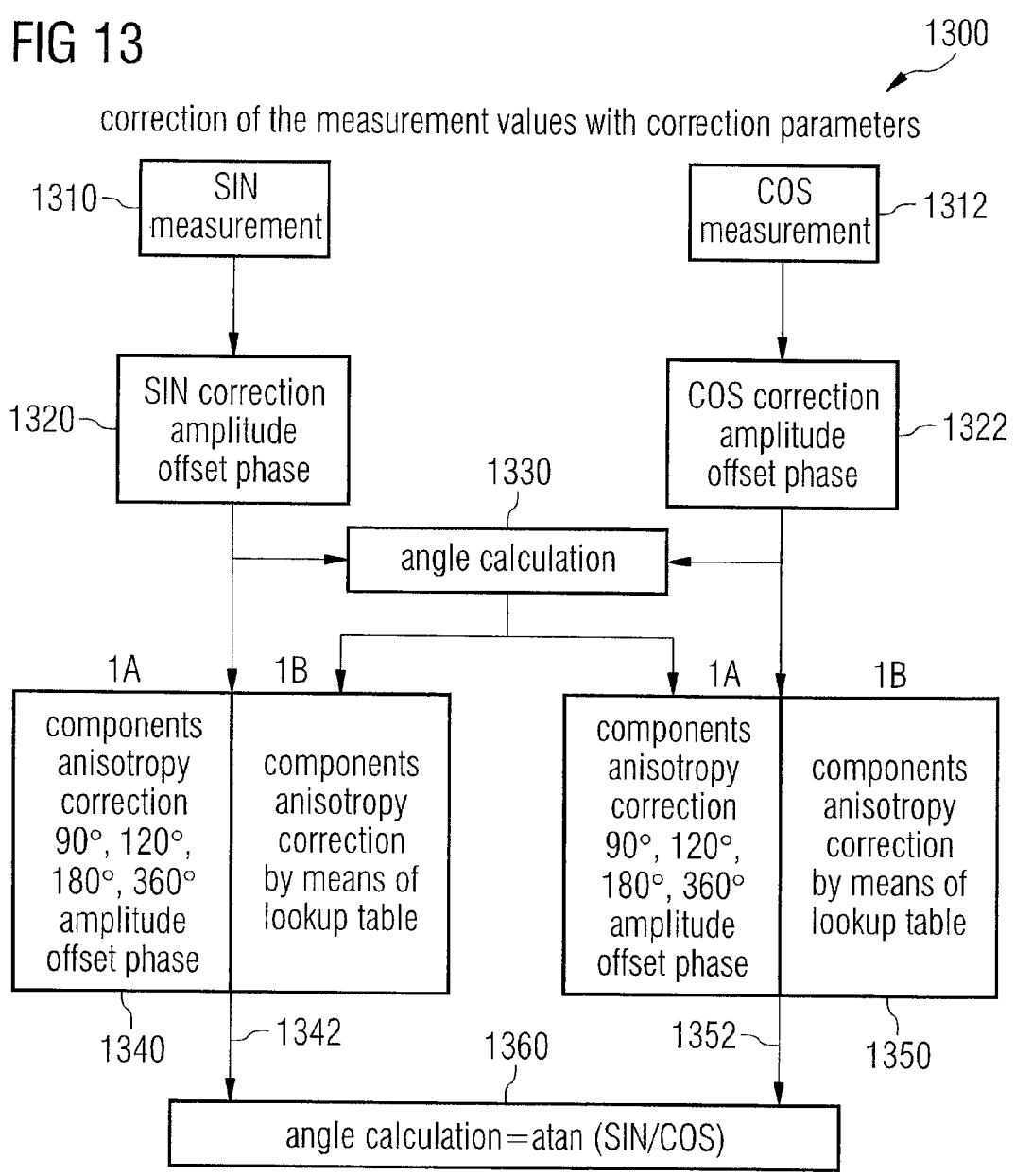

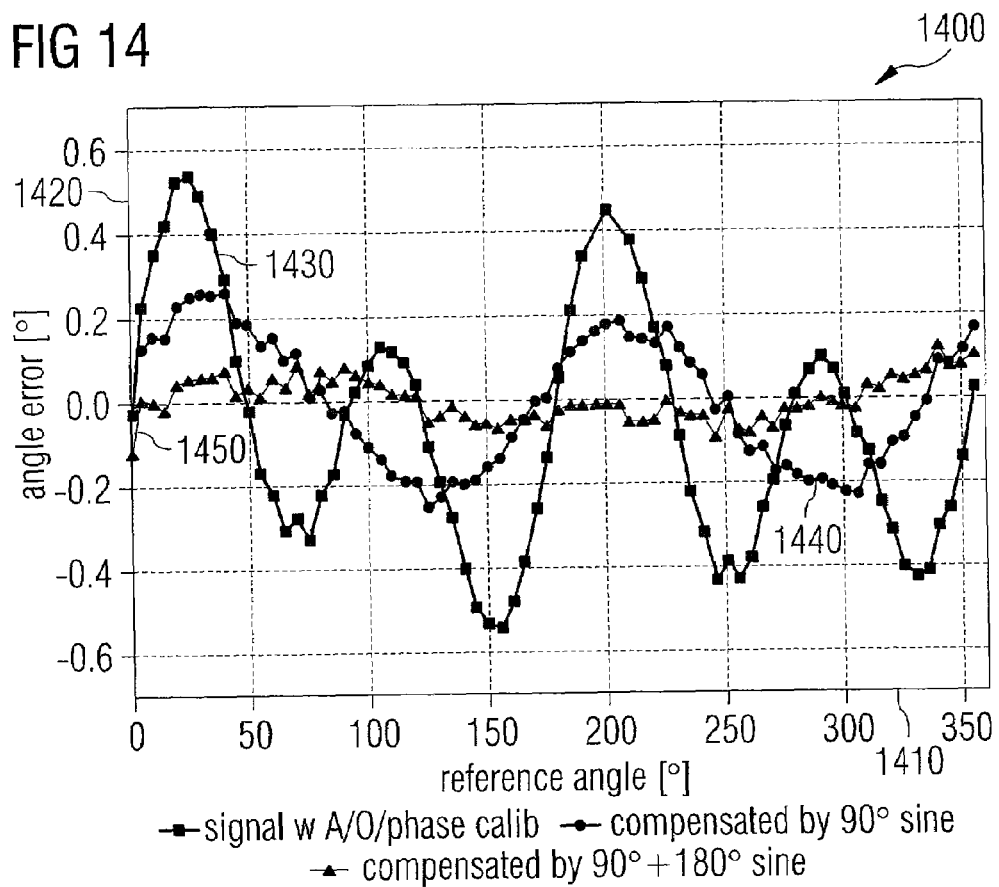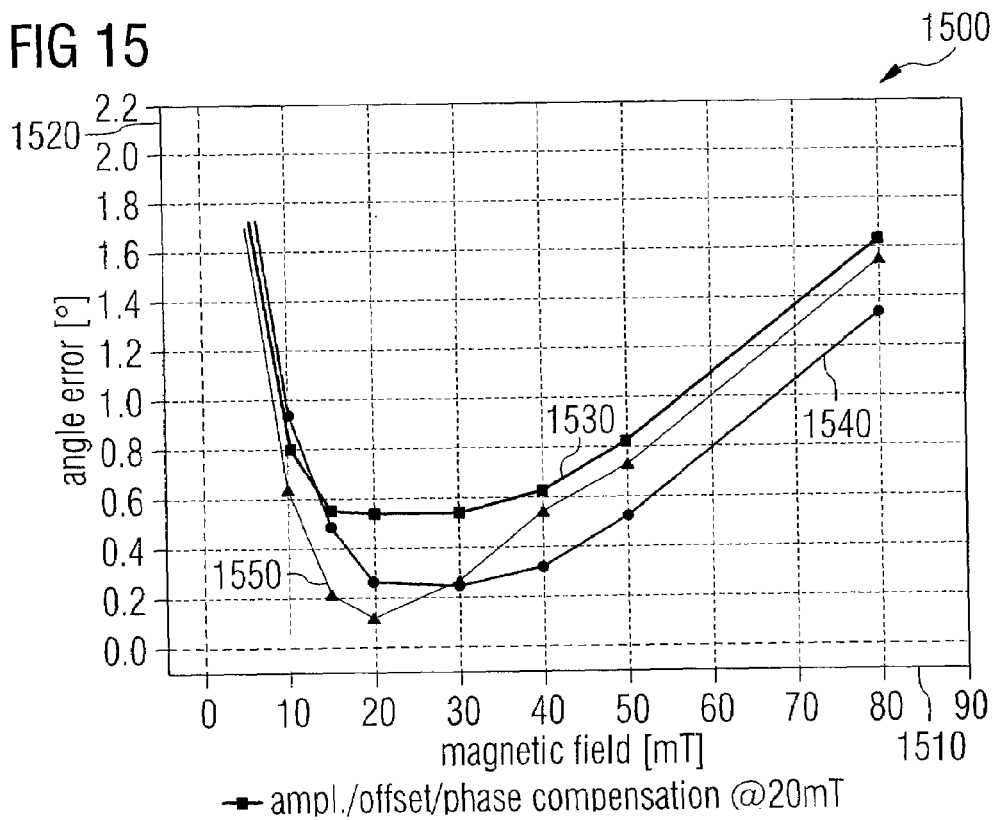

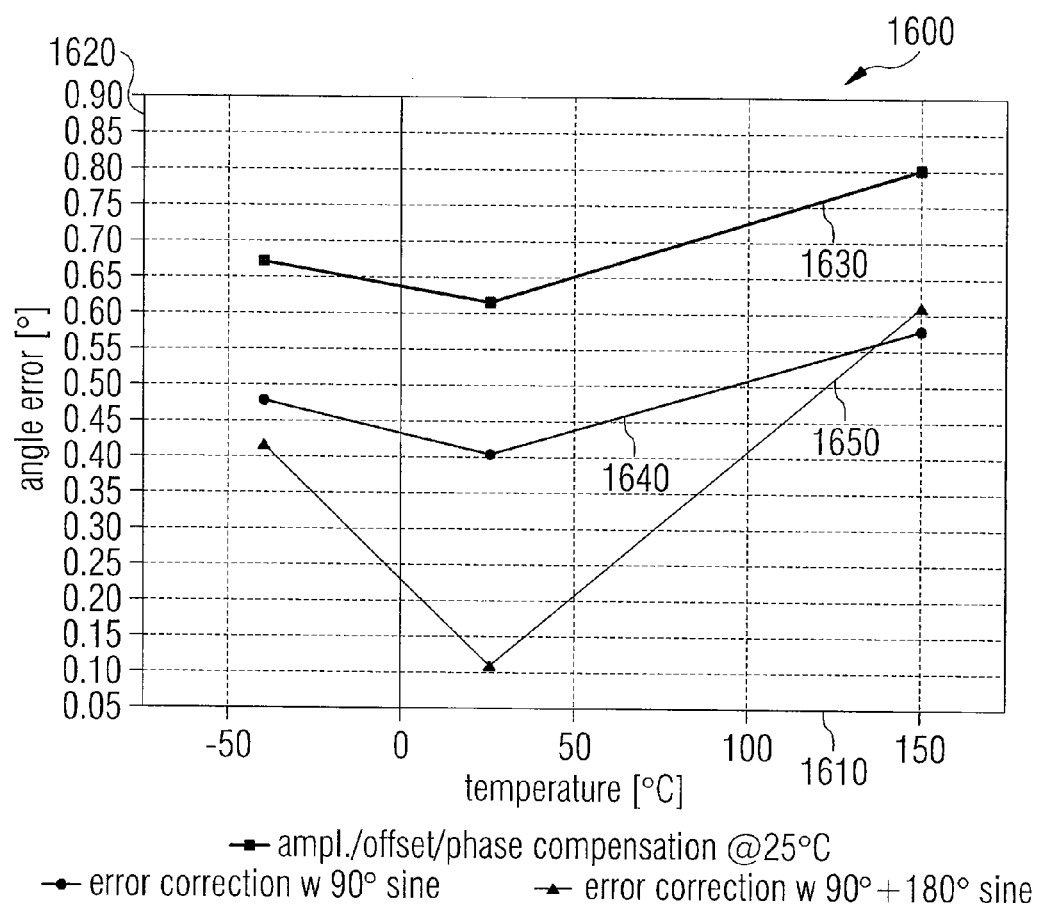

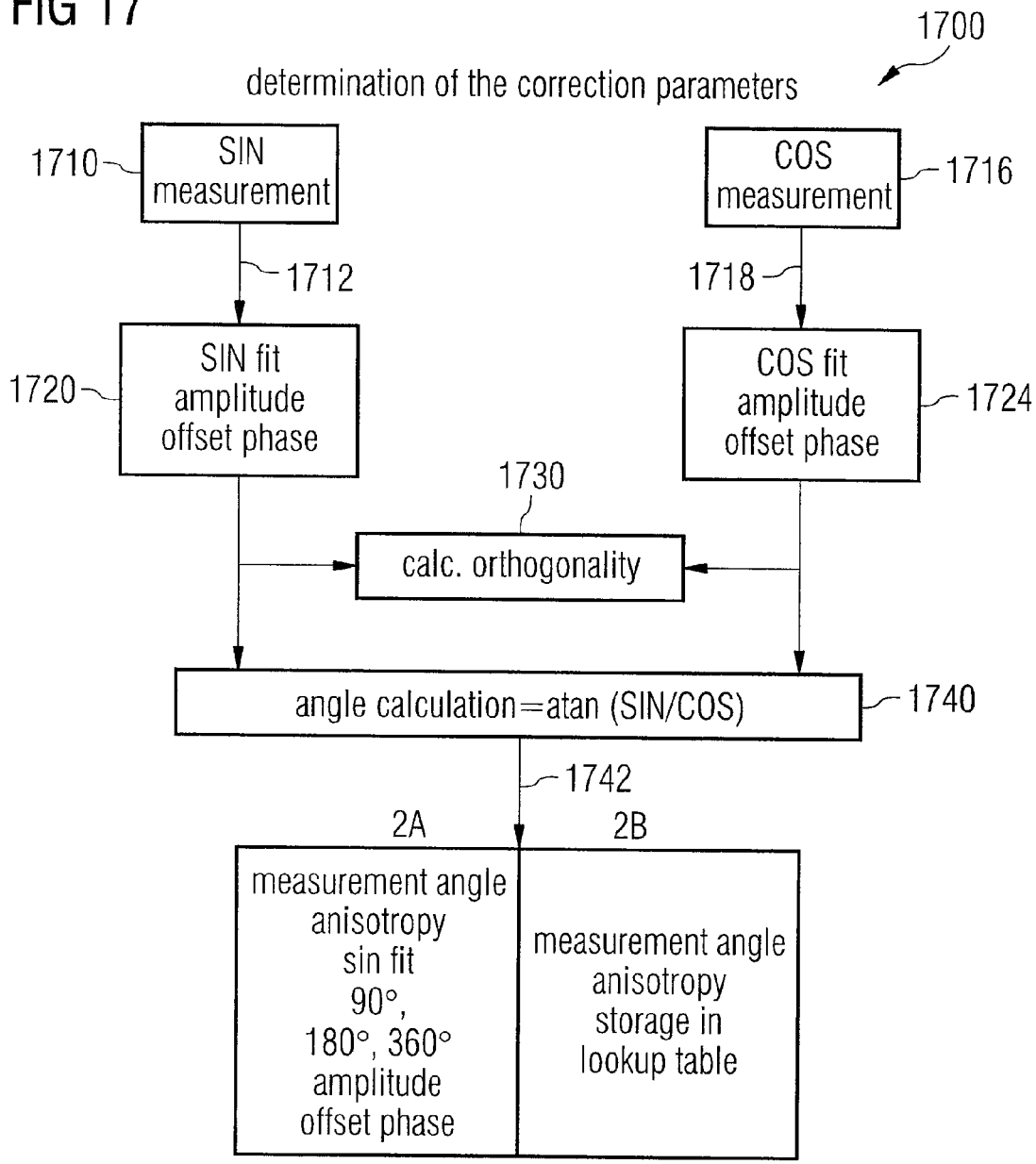

METHOD FOR DETERMINING RESIDUAL ERROR COMPENSATION PARAMETERS FOR A MAGNETORESISTIVE ANGLE SENSOR AND METHOD FOR REDUCING A RESIDUAL ANGLE ERROR IN A MAGNETORESISTIVE ANGLE SENSOR

CROSS-REFERENCE TO RELATED APPLICATIONS

This application claims priority from German Patent Application No. 10 2005 024 879.9, which was filed on May 31, 2005, and is incorporated herein by reference in its entirety.

TECHNICAL FIELD

The present invention generally relates to methods for determining residual error compensation parameters for a magnetoresistive angle sensor and methods for reducing a residual angle sensor in a magnetoresistive angle sensor, in particular to methods for anisotropy angle error reduction in GMR sensors for angle measurement applications and to methods for angle error calibration/compensation optimized for simple calculating units for the reduction of the residual angle error in magnetoresistive sensors for angle measurement applications.

BACKGROUND

Rotational angle sensors for non-contact sensing of rotations are increasingly used particularly in automobile technology. Rotational angle sensors on the basis of giant magneto resistance (GMR effect) according to the spin valve principle have several advantages as compared to the AMR sensors (sensors using the anisotropic magneto resistance; AMR: anisotropic magneto resistance) currently used. For example, rotational angle sensors on the basis of the GMR effect have an inherent 360° unambiguousness, when a bridge assembly is used, as well as a significantly higher sensitivity than common AMR sensors. Therefore, the use of rotational angle sensors on the basis of the GMR effect may involve both performance advantages and cost advantages.

Basically, spin valve systems are constructed of two ferromagnetic layers separated by a non-magnetic intermediate layer. The direction of the magnetization of one of the two ferromagnetic layers is pinned by coupling to a magnetically hard anti-ferromagnetic layer. The strength of this coupling is described by the so-called exchange bias field. The other ferromagnetic layer, i.e. the layer whose magnetization is not pinned, is free to move its magnetization in an external magnetic field so that the angle between the magnetizations of the pinned and the free layers changes in a rotating external magnetic field. As, with giant magneto resistance (GMR effect), an electric resistance of a layer system depends on the mentioned angle, the angle may be concluded by means of resistance measurement.

In order to realize a 360° detection by means of spin valve GMR/TMR structures (TMR: tunnel magneto resistance), several layer systems are connected to form two Wheatstone bridges. In this way, a maximum signal may be achieved. One of the bridges has reference magnetizations perpendicular to the reference magnetizations of the other bridge. Within each of the two bridges, the reference magnetizations are arranged anti-parallel. Thus, both bridges provide sinusoidal main signals depending on the rotational angle of an external magnetic field which (ideally) are phase-shifted by 90° with respect to each other. Hereinafter, the two main signals are also referred to as sine main signal and cosine main signal.

As, due to process reasons, individual signals and/or measurement signals from the two bridges may differ in amplitude, may be provided with an offset and may exhibit a deviation of orthogonality, the measurement signals are first calibrated/compensated. Thereafter, the angle to be ascertained may be determined via an arctan calculation of the two signals.

For ideally sinusoidal measurement signals from the Wheatstone bridges, the described calculation would provide the accurate angle. In reality, however, it can be seen that there is still a residual angle error related to a measurement angle even after offset, amplitude and orthogonality calibrations/compensations. The residual angle error includes so called anisotropy errors and hysteresis errors.

It has been shown that the anisotropy error is typically about three to five times the hysteresis error. For a highly accurate angle measurement having an angle error of less than 1° over a sufficient field and temperature range, it is necessary to reduce the largest angle error contribution remaining after offset, amplitude and orthogonality calibration/compensation, i.e. the anisotropy error.

The term anisotropy error includes all errors remaining after offset, amplitude and orthogonality calibration. The mentioned errors include contributions due to excessively high magnetic anisotropy, for example a form anisotropy due to strip width of the sensor elements and growth or process-induced uniaxial magnetic anisotropies. The errors also include deviations caused by slight movements of the pinned layer as well as the reference layer in the external magnetic field. Such movements of the pinned layer and the reference layer indicate insufficient anisotropy.

Angle errors depending on the output angle from which a certain angle is approached are referred to as hysteresis errors.

As the anisotropy error comprises a dominant part of the whole residual angle error, a compensation or reduction of the anisotropy error may lead to a significant improvement of sensor accuracy.

German patent application DE 101 54 153 A1 shows a method for offset calibration of angle sensors determining the angle to be measured on the basis of a corresponding sinusoidal and cosine signal. For the improvement of measurement accuracy of an angle sensor, a sample of the sinusoidal signal is taken when the cosine signal has a zero crossing, and a sample of the cosine signal is taken when the sinusoidal signal has a zero crossing. An offset is determined by averaging opposing samples. Furthermore, DE 101 54 153 teaches to take at least three pairs of measurement values by determining the sinusoidal signal and the cosine signal for at least three different angles. Thereupon an error square adaptation to a hypothetical circle may be performed for these measurement values, thus allowing to determining the offset.

German patent application DE 101 54 154 A1 shows a method for the compensation of an offset drift of an angle sensor and an angle sensor with an offset compensation. The angle sensor determines an angle to be measured on the basis of a corresponding sinusoidal signal and a cosine signal. The above reference teaches to first ascertain an amplitude of the cosine signal and/or the sinusoidal signal and to determine an associated offset value on the basis of the ascertained amplitude value. This allows to correct the sinusoidal and cosine signals generated by the goniometer, thus also allowing to determine a measurement value for the angle with improved accuracy at the same time.

German patent application DE 101 48 918 A1 describes a method for the offset compensation of a magnetoresistive path or angle measurement system. The path or angle measurement system includes at least one Wheatstone bridge having four locally staggered magnetoresistive resistors provided with DC voltage. A permanent magnet is moved past the magnetoresistive resistors, the respective bridge voltage being measured. According to the above reference, a calibrating cycle is performed when starting up the measurement system by moving the permanent magnet past the at least one bridge for a measurement period. Extremes of the bridge voltages measured in that way are evaluated by forming their average values. Then corresponding compensation values are formed from the above average values as offset values to be taken into account by the measurement system. The compensation values are then stored in a register.

German patent application DE 100 52 609 A1 describes a method for the compensation of an offset drift of a goniometer. According to the above reference, a goniometer is located on a rotatable shaft and comprises a generator scanned by an associated sensor element. According to the rotational angle of the rotatable shaft, a sinusoidal or cosine signal is provided to an evaluating unit. For the compensation of a temperature offset, a third order polynomial is used. In addition, averaging is performed for correcting a long-term drift. This allows to gradually correct a long-term drift. If the long-term drift exceeds a given limit, a diagnostic function helps to detect this error and to output a corresponding message.

German patent application DE 101 30 988 A1 describes an angle sensor and a method for adjusting an angle sensor. According to the above reference, the angle sensor provides two measurement voltages whose amplitude courses plotted in a plane form a circle. The angle sensor further includes an evaluating circuit for evaluating the measurement voltages dropping at the bridge circuits during an angle measurement. The evaluating circuit is provided for a calculation and a correction of a measured angle and provides an output signal for further processing of the calculated and corrected angle. The evaluating circuit supplies a correction quantity to the output signal for the correct adjustment of the angle calculated from the measurement voltages. The evaluating circuit calculates the correction quantity from the Cartesian coordinates of a center of a circle on the circumference of which there are measurement voltages of an angle measurement.

German patent application DE 101 63 528 A1 describes a method for error compensation of sine/cosine position measurement systems, wherein offset, amplitude and phase errors may be corrected. An offset, amplitude and phase error of a sine and cosine track is determined from measurement values. Thus, offset, amplitude and phase errors may be compensated for an evaluation of a fine position. When performing the method, there is further a temperature compensation of error parameters.

The German patent application having the application number 10 2004 024 398 A1 describes a method and a device for adjusting a determination rule of an angle sensor. The above patent application describes a method for adjusting a determination rule for an error compensation of an angle sensor designed to detect a first component oriented along a first axis and a second component oriented along a second axis. Based on the first component and the second component, an angle is then determined according to the determination rule. For a calculation of offset and/or amplitude and/or axis angle errors, component pairs consisting of values of a first and a second predetermined component are detected. According to a first embodiment, component pairs are inserted into an ellipse equation system, whereupon at least one ellipse coefficient is determined from the ellipse equation system. The determination rule is then adjusted depending on the one determined ellipse coefficient or the plurality of determined ellipse coefficients. In a further embodiment, extremes or zero points are used for a determination of the offset and/or amplitude and/or axis angle errors.

It is apparent from the above prior art that current magnetic field sensors and/or rotational angle sensors using the anisotropic magnetoresistive effect (abbreviated as AMR sensors) do not provide any correction for the anisotropy error because the anisotropy error is not important in AMR sensors. In sensors using the giant magnetoresistive effect (abbreviated as GMR sensors), no effective correction of the anisotropy error is known either.

Influencing the causes for anisotropy errors is difficult and results in large technical effort and has further disadvantages. In principle, it is possible to achieve a limited reduction of an anisotropy error due to excessively high anisotropy of the sensor layer by influencing the causes. For example, the so-called form anisotropy may be reduced by increasing a width of the GMR resistance structures. However, this results in an increased area need, because, for reasons of limited current consumption, resistance for the GMR resistors may not drop below a certain level. However, a larger area need for the GMR resistors opposes a cost-optimized realization of magnetic circuits and is thus not advantageous. An increase of coupling strengths of the reference magnetic system as a possible measure against the case of too little anisotropy, however, is nearly impossible due to given material properties.

Thus, a measurement method is conventionally used in angle measurement with GMR resistors and/or GMR elements that is not able to compensate anisotropy errors.

According to prior art, an angle measurement using GMR resistors and/or GMR elements includes determining calibration parameters for signal main components (sine main component, cosine main component) as a part of an angle sensor calibration and calibrating/compensating the measured main components (sine main component, cosine main component) in an angle measurement in the sensor arrangement. When determining the calibration parameters for signal main components, a first step comprises taking measurement data for measurement angles in the angle range between 0° and 360°, i.e. for a full revolution. Values of the two main components (ideally of a main sine signal and a main cosine signal) are taken for a plurality of angles. Then a sinusoidal signal is respectively fitted to the course of the main components of the measurement signal (i.e. the main sine signal and the main cosine signal). For this purpose, one of the known methods for curve fit may be used. In this way, an offset (main offset) and an amplitude (main amplitude) may be determined for each of the two main signals (main sine signal, main cosine signal). Furthermore, a potential deviation with respect to an orthogonality between the main sine signal and the main cosine signal may be determined. Thus, the parameters of two sinusoidal curves are known which approximate the main signals provided by two angularly offset sensors.

The gained calibration parameters (i.e. of the main offset and the main amplitude for the two main signals and of a parameter for an orthogonality correction) are then used in an evaluation of an angle measurement in the sensor arrangement. An angle measurement includes a calibration/compensation of the measured main components and starts with a measurement of the individual components (main components) provided by the sensor, i.e. the main sine signal and the main cosine signal. In a further step, the main components are calibrated, wherein there is a calibration of offset, amplitude and orthogonality. Here, the calibration parameters determined in a calibration, i.e. for example the main offset parameters, the main amplitude parameters and an orthogonality parameter, are used. With the help of the calibrated components, an angle to be determined and/or an angle position of an external magnetic field to be calculated is then calculated.

If a sensor is operated in calibration conditions, i.e. in the external conditions in which the calibration parameters were determined, an overall residual error after the described compensation, i.e. after a calibration of the main components with regard to offset, amplitude and orthogonality, is composed of the anisotropy error and the hysteresis error. The share of the anisotropy error in the overall residual error is typically about 80%.

Thus it can be said that a noticeable reduction of an anisotropy share in the angle error may contribute to a significant increase in sensor accuracy. However, according to prior art, no device and no method is known that allows a significant reduction of the anisotropy error in a rotational angle sensor in a way realizable in a technically advantageous manner.

Summarizing, prior art does not know any satisfying solution to compensate anisotropy errors in a magnetoresistive angle sensor. The only thing known are merely devices and methods for compensating offset errors, amplitude errors and phase errors.

SUMMARY

Thus it is the object of the present invention to provide a method for determining residual error compensation parameters for a magnetoresistive angle sensor and a method for reducing a residual angle error in an angle sensor allowing to reduce anisotropy errors of a magnetoresistive angle sensor.

In accordance with a first aspect, the present invention provides a method of determining residual error compensation parameters for a magnetoresistive angle sensor, wherein the angle sensor provides a first measurement signal depending on a rotational angle describing an angle between a magnetic field direction of a measurement magnetic field and a preferred direction of the magnetoresistive angle sensor, with the steps of: generating a first plurality of value pairs for a plurality of rotational angle values, wherein each value pair of the first plurality of value pairs has a rotational angle value and an associated measurement signal value of the first measurement signal; ascertaining a first sinusoidal fit function, the course of which is adapted to the first plurality of value pairs; and generating the residual error compensation parameters from a difference between the ascertained first sinusoidal fit function and the associated measurement signal values of the first measurement signal for the plurality of rotational angle values.

In accordance with a second aspect, the present invention provides a method of decreasing a residual angle error in a magnetoresistive angle sensor, wherein the magnetoresistive angle sensor provides a first measurement signal and a second measurement signal depending on a rotational angle describing an angle between a magnetic field direction of a measurement magnetic field and a preferred direction of the magnetoresistive angle sensor, with the steps of: ascertaining of a residual-errored angle quantity using the first measurement signal and the second measurement signal; providing residual error compensation parameters and further residual error compensation parameters according to a method of determining residual error compensation parameters for a magnetoresistive angle sensor, wherein the angle sensor provides a first measurement signal depending on a rotational angle describing an angle between a magnetic field direction of a measurement magnetic field and a preferred direction of the magnetoresistive angle sensor, with the steps of: generating a first plurality of value pairs for a plurality of rotational angle values, wherein each value pair of the first plurality of value pairs has a rotational angle value and an associated measurement signal value of the first measurement signal; ascertaining a first sinusoidal fit function, the course of which is adapted to the first plurality of value pairs; and generating the residual error compensation parameters from a difference between the ascertained first sinusoidal fit function and the associated measurement signal values of the first measurement signal for the plurality of rotational angle values; ascertaining a first correction quantity using the residual error compensation parameters and the residual-errored angle quantity; ascertaining a second correction quantity using the further residual error compensation parameters and the residual-errored angle quantity; correcting the first measurement signal with the first correction quantity, in order to obtain a first residual-error-corrected measurement signal; correcting the second measurement signal with the second correction quantity, in order to obtain a second residual-error-corrected measurement signal; and ascertaining a residual-error-corrected angle quantity using the first residual-error-corrected measurement signal and the second measurement-error-corrected measurement signal.

In accordance with a third aspect, the present invention provides a method of determining residual error compensation parameters for a magnetoresistive angle sensor, wherein the magnetoresistive angle sensor provides a first measurement signal and a second measurement signal depending on a rotational angle describing an angle between a magnetic field direction of a measurement magnetic field and a preferred direction of the magnetoresistive angle sensor, with the steps of: ascertaining a plurality of residual-errored angle values based on the first measurement signal and the second measurement signal for a plurality of reference rotational angle values, so that the residual-errored angle values are associated with the reference rotational angle values; and ascertaining the residual error compensation parameters by evaluating angle-dependent differences between the ascertained residual-errored angle values and the reference rotational angle values for the plurality of reference rotational angle values.

In accordance with a fourth aspect, the present invention provides a method of decreasing a residual angle error in a magnetoresistive angle sensor, wherein the magnetoresistive angle sensor provides a first measurement signal and a second measurement signal depending on a rotational angle describing an angle between a magnetic field direction of a measurement magnetic field and a preferred direction of the magnetoresistive angle sensor, with the steps of: ascertaining a residual-errored angle quantity using the first measurement signal and the second measurement signal; providing residual error compensation parameters according to a method of determining residual error compensation parameters for a magnetoresistive angle sensor, wherein the magnetoresistive angle sensor provides a first measurement signal and a second measurement signal depending on a rotational angle describing an angle between a magnetic field direction of a measurement magnetic field and a preferred direction of the magnetoresistive angle sensor, with the steps of: ascertaining a plurality of residual-errored angle values based on the first measurement signal and the second measurement signal for a plurality of reference rotational angle values, so that the residual-errored angle values are associated with the reference rotational angle values; and ascertaining the residual error compensation parameters by evaluating angle-dependent differences between the ascertained residual-errored angle values and the reference rotational angle values for the plurality of reference rotational angle values; wherein ascertaining the residual error compensation parameters has approximating the angle-dependent differences between the ascertained residual-errored angle values and the reference rotational angle by an angle-dependent function, wherein, in approximating, function parameters of the angle-dependent function are ascertained such that the angle-dependent function approximates the angle-dependent differences between the ascertained residual-errored angle values and the reference rotational angle values in a sufficiently accurate manner with reference to a mathematical distance measure; and wherein the ascertained function parameters of the angle-dependent function form the residual error compensation parameters; and ascertaining a residual-error-corrected angle quantity using the residual error compensation parameters and the residual-errored angle quantity.

In accordance with a fifth aspect, the present invention provides a method of decreasing a residual angle error in a magnetoresistive angle sensor, wherein the angle sensor provides a first measurement signal and a second measurement signal depending on a rotational angle describing an angle between a magnetic field direction of a measurement magnetic field and a preferred direction of the magnetoresistive angle sensor, with the steps of: providing residual error compensation parameters according to a method of determining residual error compensation parameters for a magnetoresistive angle sensor, wherein the magnetoresistive angle sensor provides a first measurement signal and a second measurement signal depending on a rotational angle describing an angle between a magnetic field direction of a measurement magnetic field and a preferred direction of the magnetoresistive angle sensor, with the steps of: ascertaining a plurality of residual-errored angle values based on the first measurement signal and the second measurement signal for a plurality of reference rotational angle values, so that the residual-errored angle values are associated with the reference rotational angle values; and ascertaining the residual error compensation parameters by evaluating angle-dependent differences between the ascertained residual-errored angle values and the reference rotational angle values for the plurality of reference rotational angle values, wherein ascertaining the residual error compensation parameters has the further steps of: distorting the first measurement signal by applying a non-linear transfer function to the first measurement signal, wherein the first non-linear transfer function is described by a first set of parameters; optimizing the parameters of the first set of parameters, so that the angle-dependent differences between the residual-errored angle values and the reference rotational angle values become sufficiently small with reference to a mathematical distance measure, wherein ascertaining the residual-errored angle values takes place using the distorted first measurement signal, and wherein the optimized parameters of the first set of parameters form the residual error compensation parameters or a subset of the residual error compensation parameters; ascertaining a first residual-error-corrected measurement signal based on the first measurement signal using the residual error compensation parameters; ascertaining a second residual-error-corrected measurement signal based on the second measurement signal using the residual error compensation parameters; and ascertaining a residual-error-corrected angle quantity using the first residual-error-corrected measurement signal and the second residual-error-corrected measurement signal.

The present invention provides a first method for determining residual error compensation parameters for a magnetoresistive angle sensor, wherein the angle sensor provides a first measurement signal depending on a rotational angle describing an angle between a magnetic field direction of a measurement magnetic field and a preferred direction of the magnetoresistive angle sensor. The inventive method includes a step of generating a first plurality of value pairs for a plurality of rotational angle values, wherein each value pair of the first plurality of value pairs comprises a rotational angle value and an associated measurement signal value of the first measurement signal. The method further includes ascertaining or determining a first sinusoidal adaptation function whose course is adapted to the first plurality of value pairs, and generating the residual error compensation parameters from a difference between the ascertained first sinusoidal adaptation function and the associated measurement signal values of the first measurement signal for the plurality of rotational angle values.

The present invention further includes a second method for determining residual error compensation parameters for a magnetoresistive angle sensor, wherein the magnetoresistive angle sensor provides a first measurement signal and a second measurement signal depending on a rotational angle describing an angle between a magnetic field direction of a measurement magnetic field and a preferred direction of the magnetoresistive angle sensor. The second method includes ascertaining a plurality of residual-errored angle values based on the first measurement signal and the second measurement signal for a plurality of reference rotational angle values, so that the residual-errored angle values are associated with the reference rotational angle values. The second method further includes ascertaining or determining the residual error compensation parameters by evaluating differences between the residual-errored angle values and the reference rotational angle values for the plurality of reference rotational angle values.

The present invention further describes methods for reducing a residual angle error in a magnetoresistive angle sensor using the residual error compensation parameters.

The main idea of the present invention is that it is necessary to compensate a residual angle error occurring in a magnetoresistive angle sensor and essentially caused by an anisotropy error, and that such an error may advantageously be described by residual error compensation parameters. A description having a low number of residual error compensation parameters is possible, because the residual angle error has a deterministic and periodic angle dependence. Such a periodic dependence of the anisotropy error may be found both in the measurement signals provided by the angle sensor and in an angle quantity calculated from the measurement signals provided by the angle sensor. Correspondingly, the determination of the residual error compensation parameters may be done both on the basis of the measurement signals provided by the angle sensor and on the basis of the angle quantity calculated without residual error compensation.

In the first method, determining the residual error compensation parameters thus includes generating a first plurality of value pairs for the plurality of rotational angle values, wherein each value pair of the first plurality of value pairs comprises a rotational angle value and an associated measurement signal value of the first measurement signal. Furthermore, the first method includes ascertaining a first sinusoidal adaptation function whose course is adapted to the first plurality of value pairs, and generating the residual error compensation parameters from a difference between the ascertained first sinusoidal adaptation function and the associated measurement signal values of the first measurement signal for the plurality of rotational angle values. The main idea of the first method is that the first measurement signal provided by the angle sensor may be approximated by a sinusoidal adaptation function depending on the rotational angle, and that an anisotropy error-induced residual error of the first measurement signal is reflected in the difference between the ascertained sinusoidal adaptation function and the associated measurement signal values of the first measurement signal. This difference shows a periodic and deterministic course and may thus be described by a few residual error compensation parameters. Furthermore, it is very advantageous to be able to correct anisotropy error-induced deviations of the measurement signal by knowing the residual error compensation parameters. It is further to be noted that, according to the first inventive method, the residual error of the first measurement signal is known as a function of an angle, wherein the angle may be an angle measured and/or determined by an external arrangement (reference angle) or an angle determined by the angle sensor using the measurement signals. It has been shown that the residual error of the first measurement signal (just as the residual error of the second measurement signal) has a sufficiently slow angle dependence, so that a sufficiently accurate description of the angle-dependent residual error of the first measurement signal is possible even when the associated angle is known only in low accuracy. These little requirements for the angle measurement significantly facilitate the measurement setup necessary for taking the differences between the ascertained first sinusoidal adaptation function and the associated measurement signal values of the first measurement signal for the plurality of rotational angle values. Thus, costs may be reduced when determining the residual error compensation parameters. Furthermore it is possible to use rotational angle values in the angle-dependent calculation of the residual error compensation parameters that are determined by an evaluation of the measurement signals provided by the angle sensor. Sufficiently accurate rotational angle values having a deviation of less than +/−2° may be achieved from the measurement signals even without a correction of the anisotropy-induced residual errors. It has been shown that rotational angle values having the mentioned tolerance of about +/−2° are sufficiently accurate for the generation of the residual error compensation parameters, so that an external precise and costly determination of the rotational angle values is not necessary.

In a further preferred embodiment, the angle sensor further provides a second measurement signal, and the method for determining residual error compensation parameters further includes determining further residual error compensation parameters on the basis of the second measurement signal. Such a procedure has the advantage that anisotropy-induced residual errors may be corrected on both measurement signals of an angle sensor required for a calculation of a rotational angle.

In a further preferred embodiment of the first method, generating the residual error compensation parameters includes approximating the angle-dependent differences between the ascertained first sinusoidal adaptation function and the associated measurement signal values of the first measurement signal by a first angle-dependent function. When approximating, function parameters of the first angle-dependent function are ascertained such that the first angle-dependent function approximates the angle-dependent differences between the ascertained first sinusoidal adaptation function and the associated measurement signal values of the first measurement signal in the best possible manner with respect to a mathematical distance measure. The ascertained function parameters of the first angle-dependent function then constitute the residual error compensation parameters. Approximating the angle-dependent differences between the ascertained first sinusoidal adaptation function and the associated measurement signal values of the first measurement signal by a first angle-dependent function is advantageous because a function approximating the angle-dependent differences in a sufficiently accurate way may be described by only few residual error compensation parameters and is further easily evaluated by an electronic calculating means. Furthermore, it is an advantage of a function and particularly a continuous function that it is preferably defined for a continuous range of input values. Particularly the use of a continuous function thus facilitates evaluating the function. Furthermore it is to be noted that a variety of functions is known that help to approximate any smooth course using only few parameters. For example, for the first angle-dependent function, there are preferably used functions that do not have any jumps and non-differentiable points, because the residual error of the first measurement signal and the second measurement signal also has an approximately smooth course.

By optimizing function parameters, for example polynomial coefficients in the case of a polynomial function or amplitude, phase and offset coefficients in the case of a sinusoidal function, the first angle-dependent function may be adapted so that it approximates the angle-dependent differences between the ascertained first sinusoidal adaptation function and the associated measurement signal values of the first measurement signal in a sufficiently good or optimal manner. In other words, function parameters of the first angle-dependent function may be ascertained or determined such that distances between the first angle-dependent function and values and/or value pairs describing the angle-dependent difference between the ascertained first sinusoidal adaptation function and the associated measurement signal values of the first measurement signal become as small as possible with respect to a predefined mathematical distance measure. The distance measure may, for example, be a 1 norm, a 2 norm, an N norm or a ∞ norm. The distances are typically formed for a plurality of rotational angles, wherein a difference between the first angle-dependent function and the angle-dependent differences for the plurality of angle values enters into the formation of the distance measure. In other words, the angle-dependent differences between the ascertained first sinusoidal adaptation function and the associated measurement signal values of the first measurement signal are fitted by an adaptation function (fit function), wherein the parameters of the adaptation function constitute the residual error compensation parameters.

An analogous method may also advantageously be performed for further residual error compensation parameters, wherein angle-dependent differences between the ascertained second sinusoidal adaptation function and associated measurement signal values of the second measurement signal are approximated by a second angle-dependent function.

Furthermore, it is preferred that the first angle-dependent function and the second angle-dependent function each have a periodic angle dependence. This is advantageous because it has been found that the angle-dependent difference between the ascertained first sinusoidal adaptation function and the associated measurement signal values of the first measurement signal has a periodic angle dependence itself. Besides it has been found that a periodic function having particularly few function parameters to be ascertained may be described. Furthermore it has been found that an approximation of the angle-dependent differences may be done particularly well and using particularly few free parameters when a fit function (i.e. the first angle-dependent function and/or the second angle-dependent function) is adapted to the angle-dependent course of the differences with respect to a basic course.

Furthermore, it is preferred that the first angle-dependent function is a sine function, wherein the function parameters of the first angle-dependent function to be ascertained include an amplitude of the sine function and a phase position of the sine function. A sinusoidal function represents a particularly advantageous form of a periodic function. Besides, it is to be noted that the term "sine function" describes each function having a sinusoidal course, i.e. for example also a cosine function or a sinusoidal function with any phase position. Here, the sine function is a function of angle values describing, for example, the rotational angle. The use of a sine function is based on the finding that the angle-dependent course of the differences to be approximated has a course that is sinusoidal in good approximation.

Furthermore it is preferred to determine an offset of the sine function constituting the first angle-dependent function. This results in further freedom in the approximation of the angle-dependent differences.

Setting a period of the sine function representing the first angle-dependent function is preferably done on the basis of a basic period of the first sinusoidal adaptation function. The first sinusoidal adaptation function adapted to an angle-dependent course of the first measurement signal has the basic period. The basic period is thus an angle describing a periodicity of the first sinusoidal adaptation function, i.e. a minimum angle, wherein after sweeping the same the angle-dependent course of the first sinusoidal adaptation function repeats itself. The period of the first angle-dependent function is preferably equal to a fraction of the basic period. What is considered as a fraction of the basic period is the basic period itself, half the basic period, a third of the basic period, a fourth of the basic period, etc. In other words, the period of the first angle-dependent function is an N-th of the basic period, wherein N is a natural number. Thus all parameters of the first sinusoidal adaptation function (period, phase position, amplitude, and offset) are defined with the period of the first sinusoidal adaptation function and/or may be ascertained or determined by an adaptation of the first angle-dependent function to the angle-dependent differences between the determined first sinusoidal adaptation function and the associated measurement signal values of the first measurement signal. Besides it is to be noted that, by presetting the period of the sinusoidal first angle-dependent function, only amplitude, phase position and offset of the first angle-dependent function remain to be determined. This significantly facilitates the calculation of the function parameters still unknown and reduces the calculating effort.

Presetting the period is possible due to symmetries of the angle sensor, whereby the angle-dependent differences have such periods that are equal to a fraction of the basic period.

In a further preferred embodiment of an angle sensor, the first sinusoidal adaptation function has a basic period of 360°, while the first angle-dependent function has a period of 120°. This selection of the basic period and the period of the first angle-dependent function is particularly advantageous due to the geometry of a magnetoresistive angle sensor from which such periodicities of the first measurement signal and the angle-dependent differences result.

Furthermore it may be assumed for simplification that the offset of the first angle-dependent function is 0. This is given because the approximation of the first measurement signal by the first sinusoidal adaptation function may be done in such a uniform way that the differences between the first sinusoidal adaptation function and the associated measurement signal values of the first measurement signal have a negligible offset. If a sinusoidal function with a period of 120°, in which the offset is set to 0 at the same time, is used as the first angle-dependent function, only the amplitude and the phase position of the sinusoidal function are to be ascertained as unknown parameters. Thus, the first angle-dependent function may finally be described by only two parameters, which firstly may be determined with comparatively little calculating effort and secondly require only little storage space in a residual error compensation parameter memory.

In a further preferred embodiment, the first angle-dependent function is a superposition of at least two sinusoidal functions. The function parameters of the first angle-dependent function to be ascertained include amplitudes and phase positions of the at least two superposed sinusoidal functions. Periods of the at least two sinusoidal functions may be set a priori or may be determined when adapting the difference values by the first angle-dependent function. Something similar applies to offset values. By using at least two sinusoidal functions, the angle-dependent course of the differences may be approximated even better than when using only one sinusoidal function. Besides, the use of sinusoidal parts again corresponds very well to the angle-dependent course of the differences.

In a further preferred embodiment, generating the residual error compensation parameters includes depositing the differences between the ascertained first sinusoidal adaptation function and the associated measurement signal values of the first measurement signal for the plurality of rotational angle values in the lookup table. In other words, differences between the ascertained first sinusoidal adaptation function and the associated measurement signal values of the first measurement signal are deposited in a lookup table for various rotational angle values. Thus, the angle-dependent course of the differences is available for later use. The entries of the lookup table constitute the residual error compensation parameters. Such a procedure is advantageous because the differences change only sufficiently slowly depending on the rotational angle so that only a small number of differences has to be deposited in the value table. Besides, periodicities of the angle-dependent course of the differences may be made use of. Thus it is sufficient to store entries of the value table only for a subinterval of a whole range of rotational angle values, assuming that the differences repeat themselves for the other rotational angle values with the same or opposite signs. Using the described periodicity, the size of a lookup table may be reduced such that it may be implemented in a cost-effective way in the angle sensor and/or an evaluating unit of the angle sensor.

The first method for determining residual error compensation parameters further preferably includes ascertaining a field strength dependence of the residual error compensation parameters. For this purpose, the steps of generating the first plurality of value pairs for a plurality of rotational angle values, ascertaining a first sinusoidal adaptation function and generating the residual error compensation parameters are repeated for at least two field strength values of the measurement magnetic field going through the angle sensor. It has been found that the residual error compensation parameters depend on the field strength of the measurement magnetic field. This is because of a change of the magnitude of the first measurement signal and the second measurement signal with the field strength of the measurement magnetic field. In addition, it has been found that anisotropy errors decrease with increasing field strength. When ascertaining the field strength dependence, residual error compensation parameters may, for example, be determined for various discrete field strength values. Likewise it is possible to describe the change of the residual error compensation parameters with the field strength by a functional relationship or by a value table. Thus a compensation of field strength changes is possible by adaptation of the residual error compensation parameters for a later evaluation of the measurement signals.

Similarly it is preferred to ascertain a temperature dependence of the residual error compensation parameters. The temperature dependence may preferably be described by a temperature coefficient of the residual error compensation parameters. The determination of the temperature dependence and/or the temperature coefficients of the residual error compensation parameters is advantageous because in that way the temperature dependence may be calculated when evaluating the measurement signals.

In a further preferred embodiment, the first method includes ascertaining an amplitude dependence of the residual error compensation parameters. For this purpose, generating the first plurality of value pairs for a plurality of rotational angle values, ascertaining the first sinusoidal adaptation function and generating the residual error compensation parameters is repeated for at least two amplitude values of the first measurement signal. An amplitude dependence of the residual error compensation parameters may then be described by parameters of a functional relationship (for example an amplitude coefficient) or by a value table. Likewise it is possible to store the residual error compensation parameters for various amplitude values. Determining the amplitude dependence of the residual error compensation parameters is advantageous because, when the amplitude dependence is known, an evaluation and correction of the measurement signals of the angle sensor may be done such that a change of the signal amplitude of the first measurement signal or the second measurement signal does not have any lasting influence on the quality of the residual error compensation anymore. The use of an amplitude dependence is particularly advantageous for several further reasons. On the one hand, influences caused by variations of the field strength of the measurement magnetic field and influences of the temperature at which the angle sensor is are reflected in the amplitude of the first measurement signal and the second measurement signal. On the other hand, the amplitude of the first measurement signal and/or the second measurement signal is easily measured in an electric way without requiring additional sensors. Thus the amplitude of one of the measurement signals is a quantity very well suited to make conclusions regarding temperature and field strength influences and to finally make a correction of the residual error compensation parameters.

In a further preferred embodiment, the inventive first method further includes a precorrection, by which amplitude, offset and phase errors of sensor signals provided by the angle sensor may be reduced. For example, the precorrection includes determining amplitude, offset and phase of a first sensor signal provided by the angle sensor and a second sensor signal provided by the angle sensor. Preferably, the precorrection further includes calibrating/compensating an amplitude and an offset of the first sensor signal, thus obtaining a precorrected first sensor signal. The precorrection also includes precorrecting a second sensor signal provided by the angle sensor by calibrating/compensating an amplitude of the second sensor signal and an offset of the second sensor signal. Thus, a precorrected second sensor signal is obtained. Finally, precorrecting may also include combining the precorrected first sensor signal and the precorrected second sensor signal, thus obtaining the first measurement signal and the second measurement signal. Combining the precorrected first sensor signal and the precorrected second sensor signal is done such that the first measurement signal and the second measurement signal have a phase shift of 90° for a change of the rotational angle. The precorrection has the advantage that amplitude, offset and phase errors of the first measurement signal and the second measurement signal may be compensated. Thus, a total of two error correction mechanisms is available. The precorrection is intended to compensate errors caused by a deviation of the signal amplitude, the offset and the phase position of the first measurement signal and the second measurement signal from an ideal value. A residual error compensation and the determination of residual error compensation parameters, however, aims to reduce anisotropy errors. Anisotropy errors are errors by which the first measurement signal and the second measurement signal deviate from an ideal sinusoidal course. Thus, a combination of the precorrection with the determination of residual error compensation parameters, as the result, allows the correction of all errors occurring in an angle sensor, i.e. errors causing a shift of the sinusoidal course of the measurement signals and errors causing a distortion of the sinusoidal course of the measurement signals.

When the compensation parameters for a magnetoresistive angle sensor are determined according to the first inventive method, they preferably help to reduce a residual angle error in a magnetoresistive angle sensor. The magnetoresistive angle sensor preferably provides a first measurement signal and a second measurement signal depending on a rotational angle describing an angle between a magnetic field direction of the measurement magnetic field and a preferred direction of the magnetoresistive angle sensor. According to the invention, a residual-errored angle quantity is determined using the first measurement signal and the second measurement signal. Furthermore, residual error compensation parameters are provided that are determined according to the first inventive method. Using the residual error compensation parameters and the residual-errored angle quantity, there is then determined a first correction quantity and a second correction quantity. The first measurement signal is then corrected with the first correction quantity to obtain a first residual error-corrected measurement signal, and the second measurement signal is corrected with the second correction quantity to obtain a second residual error-corrected measurement signal. Finally, a residual error-corrected angle quantity is ascertained using the first residual error-corrected measurement signal and the second measurement error-corrected measurement signal.

The described method is thus based on the basic idea that a residual-errored angle quantity may be calculated with sufficient accuracy based on the first measurement signal and the second measurement signal, and that then, depending on the residual-errored angle quantity, correction quantities for the first measurement signal and the second measurement signal may be determined. As the correction quantities only have a comparably slow variation over the rotational angle, the residual error of the residual-errored angle quantity does not play any significant role and may be neglected when determining the correction quantities. From the first measurement signal corrected with the first correction quantity and the second measurement signal corrected with the second correction quantity, a residual error-corrected angle quantity may be determined whose accuracy is significantly higher than that of the residual-errored angle quantity determined from the corrected first measurement signal and the second measurement signal.

The present method for reducing a residual angle error thus includes repeated calculating of angle quantities, wherein a slow dependence of the correction quantities on the rotational angle is used. Besides, it is to be noted that the correction quantities are small with respect to the first measurement signal and the second measurement signal. Thus it is possible to store the correction quantities with high accuracy and little storage requirements. Furthermore, by calculating a residual-errored angle quantity, it is possible to store the correction quantities depending on an angle. However, it has been shown that the correction quantities may be described depending on an angle in a particularly favorable form, for example by periodic and/or sinusoidal functions. The correction quantities also have a periodic angle dependence which, in turn, may be used when calculating the residual error-corrected angle quantity. Thus the angle-dependent correction of the measurement quantities is a particularly effective possibility of error correction.

Determining the first correction quantity is preferably achieved by evaluating the first angle-dependent function for the residual-errored angle quantity. The function parameters of the first angle-dependent function are set by the residual error compensation parameters. The first angle-dependent function may, for example, be a polynomial function or a sine function. Evaluating a function is advantageous because a function preferably provides function values in a continuous value range. Thus, any residual-errored angle quantity may be inserted in the function, thus generating a function value considering the function parameters. Besides, periodicities of the first angle-dependent function may be used when evaluating the first angle-depending function. For example, a function value of a sinusoidal function may be ascertained for any value by evaluating a sine function in a single quadrant. Besides, it is to be said that, by evaluating a function, only a minimum number of function parameters and/or residual error compensation parameters is required.

Furthermore, it is preferred that ascertaining the first correction quantity includes evaluating a sine function and/or a sinusoidal function for the residual-errored angle quantity. Amplitude, phase and offset of the sine function are set by the residual error compensation parameters. The advantages arising from the use of a sinusoidal function for ascertaining the correction quantity have been explained above. It merely will be mentioned once again that the period of the sinusoidal function is preferably in relation to the basic period of the first measurement signal and/or the second measurement signal.

Correcting the first measurement signal preferably includes adding the correction quantity to the first measurement signal or subtracting the correction quantity from the first measurement signal. It has been shown that the correction quantity may preferably be described as an additive term added to the measurement signal and/or subtracted from the measurement signal. Besides, it is to be noted that the residual error compensation parameters are formed due to a difference between the ascertained first sinusoidal adaptation function and the associated measurement signal values of the first measurement signal for the plurality of rotational angle values. Correspondingly, an approximately sinusoidal signal allowing a calculation of the residual error-corrected angle quantity may again be generated by adding the first correction quantity to the first measurement signal.

Furthermore, it is possible that ascertaining the first correction quantity includes reading out the first correction quantity from a field of the lookup table pertinent to the residual-errored angle quantity. In other words, based on the residual-errored angle quantity, a field of the lookup table is selected from which then the first correction quantity is read out. Thus the lookup table contains values of the first correction quantity for various values of the residual-errored angle quantity. If the lookup table does not contain any field for a given value of the residual-errored angle quantity, the field for a value of the residual-errored angle quantity closest to the given value of the residual-errored angle quantity is read out. Besides, evaluating the lookup table may be further improved by performing an interpolation between two or more entries of the lookup table. Using a value table is advantageous in that evaluating a function rule thus becomes unnecessary. Thus, the calculating effort is reduced, because only one value for the first correction quantity has to be looked for in the lookup table. It is to be noted that, especially for small, simple calculating units, the evaluation of sinusoidal functions includes a comparably large effort. Thus the use of the lookup table may reduce calculating effort. Besides, it is to be noted that, although the lookup table typically requires more storage space than is necessary for storage of few function parameters, on the other hand the lookup table allows a more accurate approximation of the angle-dependent course of the first correction quantity than a description by a functional relationship in the form of function parameters.

Furthermore, it is preferred that ascertaining the first correction quantity is done taking into account a temperature dependence of the first correction quantity. It has been shown that the first correction quantity should be adapted with a change of temperature. For example, it is advantageous to scale the first correction quantity depending on the temperature using a temperature coefficient, wherein the temperature coefficient is a measure for a change of the signal amplitude of the first measurement signal with a change of temperature at which the angle sensor is. This has the advantage that temperature-induced changes of the signal amplitude may be compensated by determining the temperature at which the sensor is, wherein the correction quantities are also adapted.

Ascertaining the first correction quantity may also preferably include scaling the first correction quantity depending on the signal amplitude of the first measurement signal. As described above, the signal amplitude of the measurement signal is a quantity that may be ascertained without additional sensors by an electronic evaluating circuit. Thus, the determination of the signal amplitude is possible in a very simple and cost-effective way. Besides, the signal amplitude provides information on how much the first correction quantity has to be scaled.

It is further to be noted that, in addition to the first correction quantity, the residual error compensation parameters may also be scaled with the temperature or the signal amplitude of the first measurement signal. The scaling may be done either linearly (using an amplitude and/or temperature coefficient), using a non-linear mapping rule or with the aid of a value table. The determination of the corresponding scaling rule for the first correction quantity or the residual error compensation parameters may be done as described above.

Furthermore, it is preferably possible to scale the first correction quantity or the residual error compensation parameters depending on a magnetic field strength of the measurement magnetic field, provided the strength of the measurement magnetic field is known. This, in turn, allows to compensate tolerance-induced deviations of the measurement magnetic field, thus increasing the accuracy of the residual error compensation.

Furthermore, it is advantageous to perform the precorrection already explained also when performing the method for reducing a residual angle error. The advantages of a precorrection have already been described. Summarizing, it can be said that the precorrection allows the compensation of amplitude, offset, phase errors of the sensor signals.

A second method for determining residual error compensation parameters for a magnetoresistive angle sensor includes ascertaining a plurality of residual-errored angle values based on the first measurement signal and the second measurement signal for a plurality of reference rotational angle values, so that the residual-errored angle values are associated with the reference rotational angle values. The second method further includes ascertaining the residual error compensation parameters by evaluating differences between the residual-errored angle values and the reference rotational angle values for the plurality of reference rotational angle values. The magnetoresistive angle sensor provides a first measurement signal and a second measurement signal depending on a rotational angle describing an angle between a magnetic field direction of a measurement magnetic field and a preferred direction of the magnetoresistive angle sensor.

The second method for determining residual error compensation parameters is based on the basic idea that a reduction of an anisotropy-induced residual error may be allowed by ascertaining residual error compensation parameters. Furthermore, the present invention is based on the finding that the residual error compensation parameters may advantageously be determined from a difference between the residual-errored angle values and the reference rotational angle values. This is because the mentioned difference is deterministic and furthermore periodic, which may be used when determining the residual error compensation parameters. For example, the differences do not have to be known and evaluated for the whole angle range, but only for a period.

Furthermore, it is preferred that ascertaining the residual error compensation parameters includes approximating the angle-dependent differences between the ascertained residual-errored angle values and the reference rotational angle values by an angle-dependent function. When approximating, the function parameters of the angle-dependent function are ascertained such that the angle-dependent function approximates the angle-dependent differences between the ascertained residual-errored angle values and the reference rotational angle values in a manner that is sufficiently accurate with respect to a mathematical distance measure. The ascertained function parameters of the angle-dependent function then constitute the residual error compensation parameters. Here it again applies that the angle-dependent differences between the ascertained residual-errored angle values and the reference rotational angle values are such in nature that they may be approximated by a function and/or a continuous function defined on a continuous interval. Advantages of such an approximation have already been described above, wherein the essential properties of the angle-dependent differences between the ascertained residual-errored angle values and the reference rotational angle values match the properties of the differences between the ascertained first sinusoidal adaptation function and the associated measurement signal values of the first measurement signal.

Correspondingly, it is preferred that the angle-dependent function has a periodic angle dependence. Furthermore, it is particularly advantageous when the angle-dependent function is a sine function, wherein the function parameters of the angle-dependent function to be determined include an amplitude of the sine function and a phase position of the sine function. In addition, an offset of the sine function may preferably also belong to the function parameters of the angle-dependent function to be determined.

If the first measurement signal is periodic with respect to the rotational angle and has a basic period, it is preferred that the angle-dependent function has a period equal to a fraction of the basic period. In other words, the period of the angle-dependent function is equal to the basic period of the first measurement signal or equal to an N-th of the basic period of the first measurement signal (wherein N is a natural number).

Furthermore it is preferred that the basic period of the first measurement signal is 360°, and that the period of the first angle-dependent function is 90°. It has been shown that the angle-dependent differences between the ascertained residual-errored angle values and the reference rotational angle values may be approximated very well by a sinusoidal course with a period of 90°.

An offset of the first angle-dependent function is preferably assumed to be 0, so that a determination of the offset is not necessary. This, in turn, facilitates the determination of the remaining residual error compensation parameters.

Also when approximating the angle-dependent differences between the ascertained residual-errored angle values and the reference rotational angle values, it is advantageous that the angle-dependent function is a superposition of at least two sinusoidal functions, wherein the function parameters of the angle-dependent function to be determined are amplitudes and phase positions of the at least two sinusoidal functions. Again, the superposition of the at least two sinusoidal functions is particularly advantageous due to the periodicity of the angle-dependent course of the differences.

The angle-dependent function is preferably a superposition of at least a first sinusoidal function whose period is a quarter of the basic period of the first measurement signal and a second sinusoidal function whose period is equal to one half of the basic period. If the basic period of the first measurement signal is 360°, the angle-dependent function is consequently preferably the superposition of two sinusoidal functions with periods of 90° and 180°, respectively. It has been shown that the angle-dependent course of the mentioned differences may be optimally approximated by such a superposition of two sinusoidal signals, wherein only two amplitudes, two phase positions and two offset values of the sinusoidal functions are to be determined.

Furthermore, it is preferred that generating the residual error compensation parameters includes depositing the differences between the residual-errored angle values and the reference rotational angle values for the plurality of rotational angle values in a lookup table. The deposited entries of the lookup table constitute the residual error compensation parameters. Depositing the differences in the lookup table allows a description of the differences with high accuracy. Besides, no further calculations are thus necessary for the determination of the residual error compensation parameters.

In a further preferred embodiment, generating the residual error compensation parameters includes distorting the first measurement signal by applying a first non-linear transfer function to the first measurement signal, wherein the first non-linear transfer function is described by a first set of parameters. The generation of the residual error compensation parameters further includes distorting the second measurement signal by applying a second non-linear transfer function to the second measurement signal, wherein the second non-linear transfer function is described by a second set of parameters. Finally, generating the residual error compensation parameters includes optimizing the parameters of the first set of parameters and the parameters of the second set of parameters, so that the difference between the residual-errored angle values and the reference rotational angle values becomes sufficiently small with respect to a mathematical distance measure. Ascertaining of the residual-errored angle values is done using the distorted first measurement signal and the distorted second measurement signal. The optimized parameters of the first set of parameters together with the optimized parameters of the second set of parameters constitute the residual error compensation parameters. When the optimization is complete, the parameters of the first set of parameters and the parameters of the second set of parameters are determined so that residual error-corrected angle values may be formed using the distorted first measurement signal and the distorted second measurement signal. In other words, the parameters of the first set of parameters and the parameters of the second set of parameters are optimized so that a deviation between angle values formed using the distorted first measurement signal and the distorted second measurement signal and reference rotational angle values becomes as small as possible. The deviation is determined for a plurality of rotational angles and is evaluated by means of a mathematical distance measure. This may be done in the same way as already described above. For example, a mathematical norm (1 norm, 2 norm, N norm, ∞ norm) may be used as mathematical distance measure, but another suitable distance measure is also possible. When determining the distance, a weighting function may also be introduced, as it is known for the determination of distances. Any known optimization algorithm may be used for the optimization.

A distortion of the first measurement signal by applying a first non-linear transfer function and of the second measurement signal by applying a second non-linear transfer function is advantageous because it has been shown that, by a non-linear distortion, nearly sinusoidal signals may be reconstructed from the first measurement signal and the second measurement signal. In other words, the first measurement signal and the second measurement signal are non-linearly distorted by the magnetoresistive angle sensor, wherein the non-linear distortion may substantially be reversed again by applying the first non-linear transfer function and the second non-linear transfer function. Furthermore, it has been shown that the non-linear transfer function may be described by a parameterized representation, and that the parameters of the non-linear transfer function may be determined by performing an optimization of the parameters such that differences between the angle values calculated taking into account the non-linear transfer function and the associated reference rotational angle values become as small as possible. In other words, if the parameters of the non-linear transfer function are suitably selected, an angle equal to the reference rotational angle value (or differing only slightly therefrom) is determined based on the distorted first measurement signal and the distorted second measurement signal. Optimizing the parameters, wherein the difference between the residual-errored angle values and the associated reference rotational angle values is used as optimization criteria, allows an optimum determination of the parameters, because the parameters are determined so that the final result of the entire angle calculation, i.e. the residual-errored angle values, match expected values, the reference rotational angle values.

In a further preferred embodiment, the first non-linear transfer function is a first third order polynomial function, and the second non-linear transfer function is a second third order polynomial function. The parameters of the first set of parameters are polynomial coefficients of the first polynomial function, and the parameters of the set of parameters are polynomial coefficients of the second polynomial function. It has been shown that a third order polynomial function is suitable to reverse the non-linear distortion of the signals provided by the angle sensor. Furthermore, the third order polynomial functions may be calculated efficiently in a simple electronic calculating unit. When evaluating the polynomial functions, only multiplications and additions are necessary, which may be performed very effectively. In addition, a third order polynomial and/or a third order polynomial function only has four coefficients, so that the storage space required for the storage of the residual error compensation parameters is very little.

Furthermore, it is preferred that a quadratic term of the first third order polynomial function disappears, and that a quadratic term in the second third order polynomial function disappears. It has been shown that, due to a manner of distortion of the measurement signals and/or sensor signals in the rotational angle sensor, it is not necessary to take the quadratic terms into account. This is due to symmetries of an angle sensor structure. Neglecting the quadratic terms when evaluating the first polynomial function and the second polynomial function reduces calculating effort. Besides, due to the neglecting of the quadratic terms, fewer parameters have to be optimized, which significantly improves speed and reliability of a parameter optimization.

Furthermore, it is preferred to set the first non-linear transfer function by entries of a first lookup table, wherein the first lookup table determines an association between a value of the first measurement signal and a value of the distorted first measurement signal. The entries of the first lookup table constitute the first set of parameters. Similarly, the second non-linear transfer function may be set by entries of a second lookup table, wherein the second lookup table determines an association between a value of the second measurement signal and a value of the distorted second measurement signal. The entries of the second lookup table constitute the second set of parameters. The use of lookup tables may potentially result in an improvement of the accuracy when determining the distorted first measurement signal from the first measurement signal. Evaluating the lookup tables additionally requires less calculating effort than evaluating non-linear transfer functions given by parameterized functions. Besides, evaluating of the first lookup table and/or the second lookup table may be further improved by performing an interpolation between two or more entries of the first lookup table and/or the second lookup table.

Furthermore, it is preferred to combine the distorted first measurement signal and the distorted second measurement signal, wherein the combining is done such that two signals are formed by the combining that have a phase shift of 90° for a change of the rotational angle. The signals formed by combining may then be used for determining the plurality of residual-errored angle values. Combining the distorted first and second measurement signals has the advantage that two signals with a phase shift of 90° may be formed with high accuracy. It is to be noted here that the distorted first measurement signal and the distorted second measurement signal are sinusoidal with good accuracy when the parameters of the non-linear transfer functions are close to optimum values. Combining the two nearly sinusoidal signals (the first distorted measurement signal and the second distorted measurement signal) again results in two nearly sinusoidal signals. This is in contrast to a possible combining of the two undistorted measurement signals, wherein deviations from the sine form of both measurement signals would have consequences for the combined signals.

Combining the distorted first measurement signal and the distorted second measurement signal preferably includes summing the distorted first measurement signal and a product of the distorted second measurement signal and a time constant value. Such a combining of the distorted first measurement signal and the distorted second measurement signal effectively causes a shift of a relative phase position of the combined signals with respect to a relative phase position of the first measurement signal and the second measurement signal. Only a multiplication by a time constant and known value and an addition are performed. However, no evaluation of non-linear functions (for example sinusoidal functions) is necessary. Thereby, the calculating effort is significantly reduced as compared to conventional methods for changing a phase position of two sinusoidal signals. The calculations are thus possible in an efficient way with a very simple calculating unit.

The second method for determining residual error compensation parameters may further include precorrecting a first sensor signal provided by the angle sensor by calibrating/compensating an amplitude of the first sensor signal and an offset of the first sensor signal, thus obtaining the first measurement signal. Furthermore, precorrecting of a second sensor signal provided by the angle sensor may be done by calibrating/compensating an amplitude of the second sensor signal and an offset of the second sensor signal, thus obtaining the second measurement signal. By precorrecting, the measurement signals may be conditioned so that the distorting of the first measurement signal and the distorting of the second measurement signal may be done optimally. It is to be noted that distorting the first measurement signal and distorting the second measurement signal may be performed prior to the respective precorrecting. In this case, distorting the first and/or second measurement signal, precorrecting the first and/or second measurement signal and combining the distorted and precorrected first and second measurement signals is done in precisely this order.

When residual error compensation parameters have been ascertained by approximating the angle-dependent differences between the ascertained residual-errored angle values and the reference rotational angle values by an angle-dependent function, a residual angle error in a magnetoresistive angle sensor providing a first measurement signal and a second measurement signal may be reduced. The corresponding method includes ascertaining a residual-errored angle quantity using the first measurement signal and the second measurement signal. A residual error-corrected angle quantity may then be ascertained using the residual error compensation parameters and the residual-errored angle quantity. The described method is based on the basic idea that the residual angle error is described by the residual error compensation parameters depending on a residual-errored rotational angle (determined by a residual-errored angle quantity). Therefore, the residual-errored angle quantity must be determined for a correction of the residual angle error. Depending on the residual error compensation parameters and the residual-errored angle quantity, there may then be calculated a correction quantity that may be used for determining the residual error-corrected angle quantity.

It is preferred that determining the residual error-corrected angle quantity includes evaluating the angle-dependent function for the residual-errored angle quantity, thus obtaining the correction quantity. The function parameters of the angle-dependent function are set by the residual error compensation parameters. The correction quantity is finally added to the residual-errored angle quantity or subtracted from the residual-errored angle quantity, thus obtaining the residual error-corrected angle quantity.

Similarly, the residual error-corrected angle quantity may be obtained by evaluating a lookup table, if such a table has previously been created. The correction quantity is read out from a field of the lookup table pertinent to the residual-errored angle quantity. The correction quantity is further added to the residual-errored angle quantity or subtracted from the residual-errored angle quantity, thus obtaining the residual error-corrected angle quantity. The correction quantity may be deposited in the lookup table with very high accuracy so that a very accurate correction of the residual-errored angle quantity is possible. In addition, evaluating the lookup table involves little calculating effort.

Similar to what is described above, temperature dependence of the correction quantity or the residual error compensation parameters may be taken into account when reducing a residual angle error. The correction quantity or the residual error compensation parameters may be scaled with temperature. An adaptation of the correction quantity or the residual error compensation parameters to a field strength of the measurement magnetic field or an amplitude of the first measurement signal and the second measurement signal is also possible, as explained in detail above. Thus, a significant improvement of a residual error correction is possible in a broad temperature and/or magnetic field range.

When the residual error compensation parameters have been determined by distorting the first measurement signal and the second measurement signal and by optimizing parameters describing the distortion, there may also be reduced the residual angle error in a magnetoresistive angle sensor. The corresponding method includes providing the residual error compensation parameters and ascertaining a first residual error-corrected measurement signal based on the first measurement signal using the residual error compensation parameters. In other words, the first measurement signal is mapped to a residual error-corrected first measurement signal, wherein the residual error compensation parameters describe a mapping. Similarly, a second residual error-corrected measurement signal is ascertained based on the second measurement signal using the residual error compensation parameters. Finally, a residual error-corrected angle quantity may be calculated using the first residual error-corrected measurement signal and the second residual error-corrected measurement signal. This method is thus based on the basic idea that a residual angle error may be reduced by mapping the first measurement signal and the second measurement signal to residual error-corrected measurement signals. This is possible because, by such a non-linear mapping and/or distortion of the first measurement signal and the second measurement signal, signals may be formed that have a substantially sinusoidal course. Thus, a residual error-corrected angle quantity may be generated which describes an actual rotational angle substantially better than the residual-errored angle quantity directly calculated from the first measurement signal and the second measurement signal.

It is preferred that determining the first residual error-corrected measurement signal includes applying the first polynomial function to the first measurement signal, wherein a function value of the first polynomial function represents the first residual error-corrected measurement signal, and wherein the polynomial coefficients of the second polynomial function are set by the residual error compensation parameters. Similarly, determining the second residual error-corrected measurement signal includes applying the second polynomial function to the second measurement signal, wherein a function value of the second polynomial function represents the second residual error-corrected measurement signal, and wherein the polynomial coefficients of the second polynomial function are set by the residual error compensation parameters. The first polynomial function and the second polynomial function may be evaluated in a highly efficient way, because only multiplications and additions are required. They may be efficiently performed in a simple calculating unit. Furthermore, the polynomial functions are well suited to reverse a distortion of the first measurement signal and the second measurement signal occurring in the sensor.

Similarly, ascertaining the residual error-corrected measurement signals may be done by reading out value tables, if the value tables have previously been created. Ascertaining the first residual error-corrected measurement signal includes reading out a first entry from the first value table set by the first residual-errored measurement signal, and determining a residual error-corrected measurement signal based on the first entry. Ascertaining the second residual error-corrected measurement signal is done analogously using a second entry from the second value table. The evaluation of the value tables may again be realized in a very efficient way by a microprocessor. In addition, any mapping may be defined by the value tables, wherein an accuracy of a representation is determined only by the number of the entries stored in the value table. An increase in accuracy may further be achieved by methods for the interpolation of two or more entries contained in the value tables.

Precorrecting of sensor signals provided by the angle sensor is also advantageous in connection with the above method.

Ascertaining the residual error-corrected angle quantity may preferably include combining the first residual error-corrected measurement signal and the second residual error-corrected measurement signal, thus generating orthogonality-corrected signals from which the residual error-corrected angle quantity may be derived.

The residual error compensation parameters may again be adapted to temperature or signal amplitude of the sensor signals. Here, all methods already described above may be used.

BRIEF DESCRIPTION OF THE DRAWINGS

These and other objects and features of the present invention will become clear from the following description taken in conjunction with the accompanying drawings, in which:

FIG. 10 is a graphical representation of a residual angle error at a temperature of 25° C. as a function of a strength of a magnetic rotating field in the case of a calibration for a magnetic rotating field of the strength 20 mT and in the case of a calibration for a magnetic rotating field of the strength 20 mT including an anisotropy correction;

FIG. 11 is a graphical representation of a residual angle error for a magnetic rotating field of the strength 20 mT as a function of temperature in the case of a calibration for a magnetic rotating field of the strength 20 mT and for the case of the calibration with a magnetic rotating field of the strength 20 mT including an anisotropy correction;

FIG. 12 is a flow diagram of an inventive method for determining correction parameters according to a first embodiment of the present invention;

FIG. 13 is a flow diagram of an inventive method for the correction of measurement values using correction parameters ascertained with the method according to the first embodiment of the present invention;

FIG. 14 is a graphical representation of an angle error as a function of a reference angle in the case of a compensation of component offset, component amplitudes and orthogonality, in the case of a residual error compensation with a sine signal periodic in 90°, and in the case of a residual error compensation with a sine signal periodic in 90° and a sine signal periodic in 180°;

FIG. 15 is a graphical representation of an angle error at a temperature of 25° C. as a function of a strength of a magnetic rotating field in the case of a compensation of component offset, component amplitudes and orthogonality, in the case of a residual error compensation with a sine signal periodic in 90°, and in the case of a residual error compensation with a sine signal periodic in 90° and a sine signal periodic in 180°;

FIG. 16 is a graphical representation of an angle error for a magnetic rotating field of the strength 20 mT as a function of temperature in the case of a compensation of component offset, component amplitudes and orthogonality, in the case of a residual error compensation with a sine signal periodic in 90°, and in the case of a residual error compensation with a sine signal periodic in 90° and a sine signal periodic in 180°;

FIG. 17 is a flow diagram of an inventive method for determining correction parameters according to a second embodiment of the present invention;

DETAILED DESCRIPTION

In order to facilitate understanding of the present invention, the following will first explain, based on measurement and simulation results, how magnetic anisotropies disadvantageously affect the properties of a steering angle sensor after the giant magneto resistance (GMR). Furthermore, the following will show by which approaches these unwanted effects of anisotropies may be eliminated and/or overcome in signal processing.

FIGS. 1*a*, 1*b*, 2*a*, 2*b*, 3*a* and 3*b* show graphical representations of simulated resistance signals and graphical representations of the angle-dependent courses of deviations between the simulated resistance signals and ideal signal courses. FIGS. 1*a*, 1*b*, 2*a*, 2*b*, 3*a* and 3*b* are based on simulations in which only a uniaxial anisotropy was taken into account via an effect of the form anisotropy. The strip width of the GMR elements (giant magneto resistance elements) is 2 μm in these simulations. Other anisotropies or couplings are ignored.

The form anisotropy is responsible for pinning the magnetization of a sensor layer along a longitudinal axis of a GMR structure with a certain strength, so that the magnetization of the sensor layer is not completely free to move in an external magnetic rotating field. If the sensor layer did not experience any other forces than the external rotating field, a sinusoidal dependence of the resistance of the GMR element would result as a function of the rotational angle.

Figure 1A:
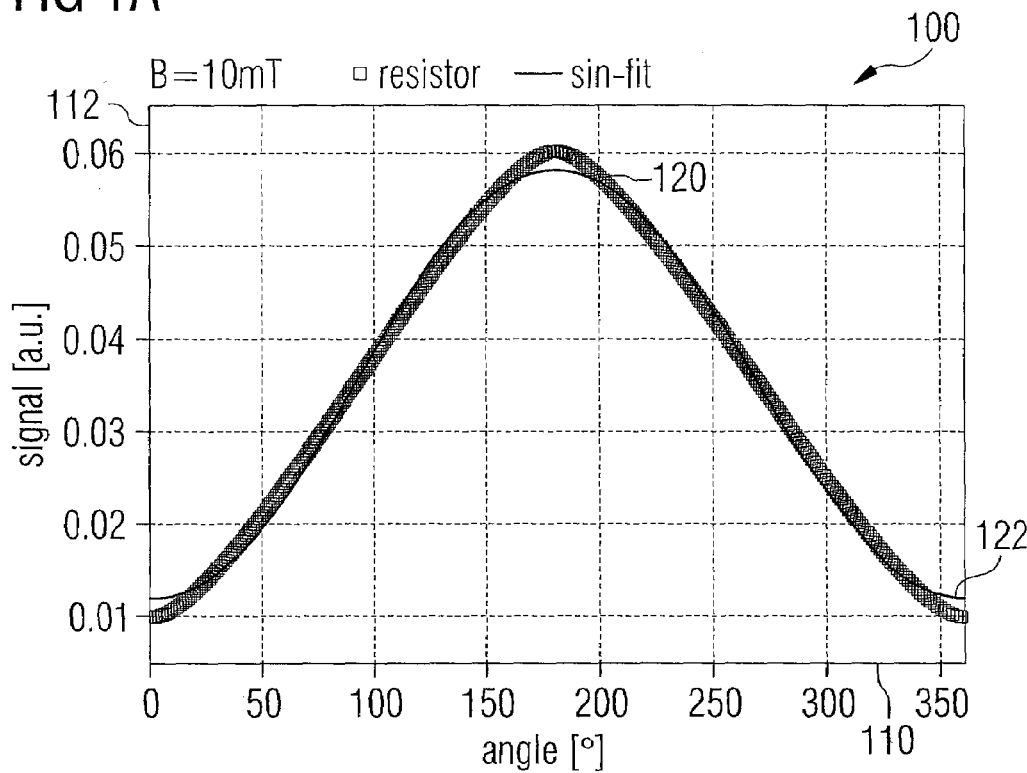
FIG. 1a is a graphical representation of a resistance behavior of a single resistor as a function of a rotational angle for an external rotating field of the strength 10 mT.

FIG. 1*a* shows a graphical representation of a resistance behavior of a single resistor as a function of a rotational angle for an external rotating field of the strength 10 mT. The graphical representation is designated 100 in its entirety. A rotational angle between 0° and 360° is plotted on an abscissa 110. An ordinate 112 shows a magnitude of a resistance signal in arbitrary units (a. u.). A first curve 120 represented as a bold line in the graphical representation 100 describes the angle-dependent resistance behavior of the single resistor for an external rotating field of 10 mT. A second curve 122 shows a sinusoidal course adapted (fitted) to the first curve 120. The second curve 122 is represented by a thin line. The course of the second curve 122 essentially corresponds to the course of the first curve 120, wherein major deviations may only be detected close to the extremes of the two curves. It is to be seen from the described graphical representation 100 that the magnetization of the sensor layer noticeably differs alternatingly from an external field vector. Thus, there is a difference between the ideal behavior described by the second curve 122 and the real behavior represented by the first curve 120 as a function of the angle.

It is also to be noted that the ideal sinusoidal course represented in the second curve 122 represents a fit to the first (measured or simulated) curve 120, wherein a non-linear fit, in which the sum of the error squares was minimized, was used (non-linear least square fit). In other words, the ideal sine is a "non-linear least square" fit to the measured and/or simulated curve 120. For the ideal sinusoidal second curve 122, the result for the fit is an amplitude slightly smaller than the amplitude of the measured and/or simulated first curve 120, by minimization of the error. Such a deviation of the amplitude between an ideal (fitted) course and a real course also results for a calibration of a GMR rotational angle sensor.

Figure 1B:
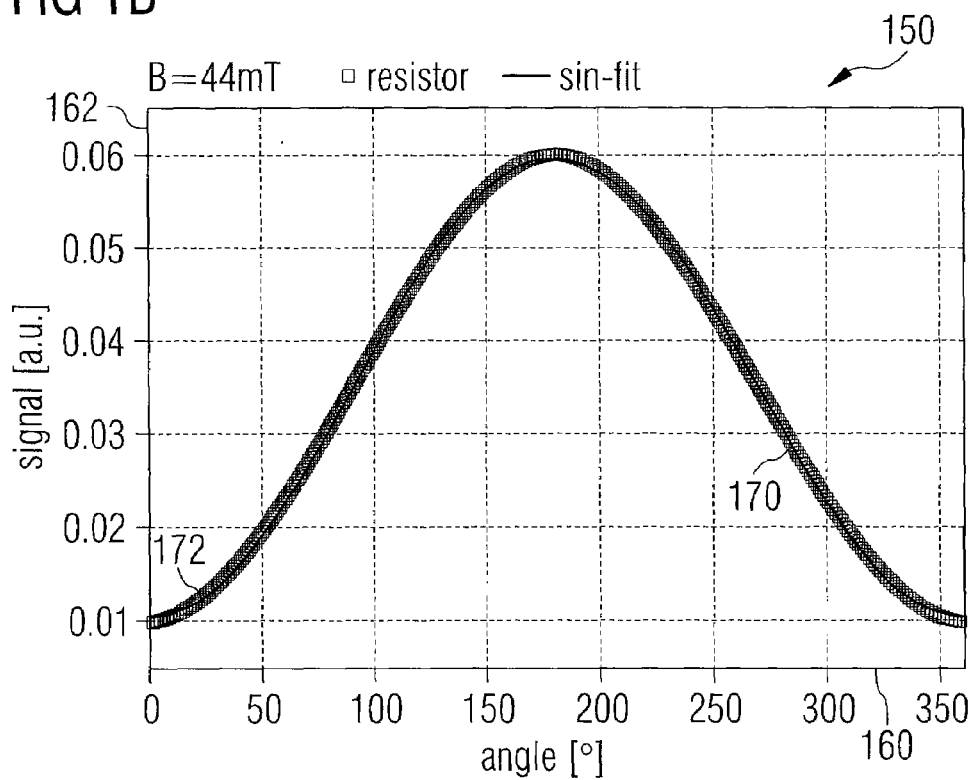
FIG. 1b is a graphical representation of a resistance behavior of a single resistor as a function of a rotational angle for an external rotating field of the strength 44 mT.

FIG. 1b shows a graphical representation of a resistance behavior of a single resistor as a function of a rotational angle for an external rotating field of the strength 44 mT. The graphical representation is designated 150 in its entirety. Exactly as in the graphical representation 100, an abscissa 160 shows a rotational angle between 0° and 360°. An ordinate 162 again shows a resistance signal in arbitrary units (a. u.). The graphical representation 150 further shows a first curve 170 describing a measured or simulated resistance course. The first curve 170 is drawn as a bold line. A second curve 172 drawn as a thin line describes an ideal sinusoidal course, wherein the sinusoidal course is adapted to the resistance course described by the first curve 170 by a curve fit. It is to be noted that the second curve 172 runs completely within the bold line of the first curve 170, because the two curves differ only slightly.

A comparison of the graphical representation 100 for a magnetic field of the strength 10 mT and the graphical representation 150 for a magnetic field of the strength 44 mT thus shows that the sine fit curve 172 (shown in the graphical representation 150) for a magnetic field of the strength 44 mT approximates the resistance course represented by the first curve 170 better than the sine fit curve 122 (shown in the graphical representation 100) for a magnetic field of the strength 10 mT approximates the resistance course 120.

Figure 2A:
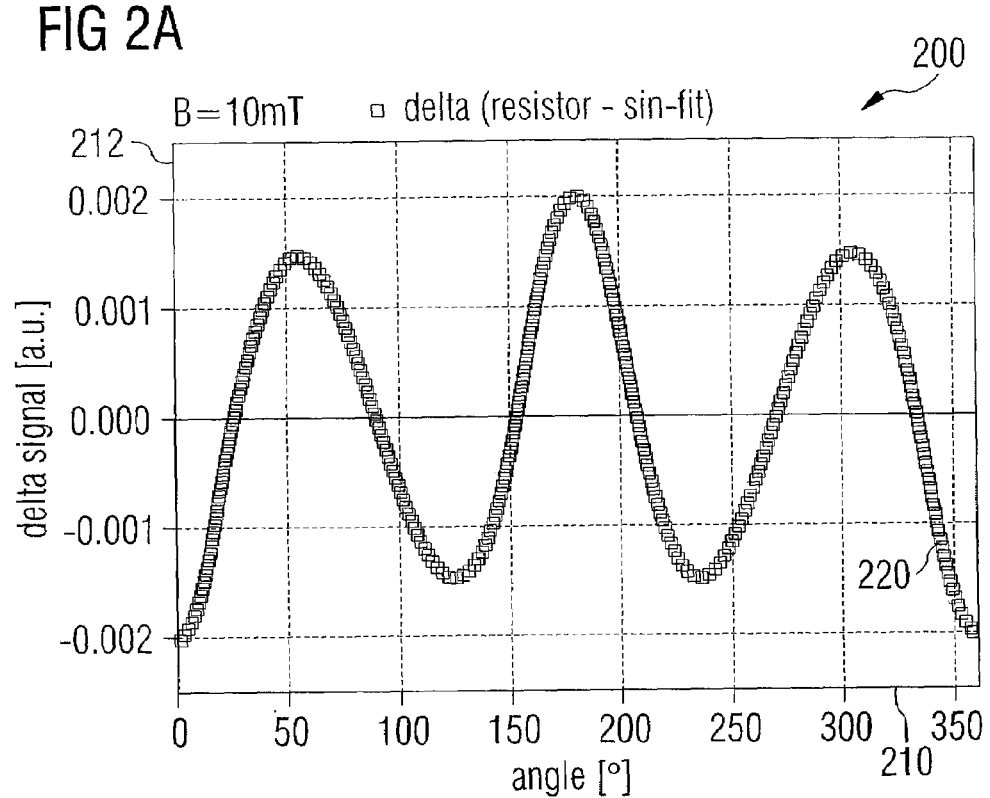
FIG. 2a is a graphical representation of a difference between a resistance signal of a single resistor and a corresponding sine fit for an external rotating field of the strength 10 mT.

FIG. 2a shows a graphical representation of a difference between a resistance signal of the single resistor and a corresponding sine fit for an external rotating field of the strength 10 mT. The graphical representation shown in FIG. 2a is designated 200 in its entirety. An angle between 0° and 360° is plotted on an abscissa 210. An ordinate 212 shows the magnitude of a difference between an ideal sinusoidal signal and a sine signal provided by a single resistor in arbitrary units (a. u.). A curve 220 thus describes a difference between an ideal sinusoidal course (sine fit) and a resistance signal provided by a single resistor as a function of the rotational angle. In other words, the curve 220 describes a difference between the resistance signal, as shown by the first curve 120 in FIG. 1a, and the corresponding sine fit, as shown by the second curve 122 in FIG. 1a. Thus, if a resistance signal of a single resistor is approximated by a sine fit curve as a function of the external field angle, a difference results as the difference between the resistance signal of the single resistor and the associated sine fit curve that may be described as a function of the angle with a main part periodic in 120°. The course of this difference is exemplarily represented as curve 220 in FIG. 2a.

Figure 2B:
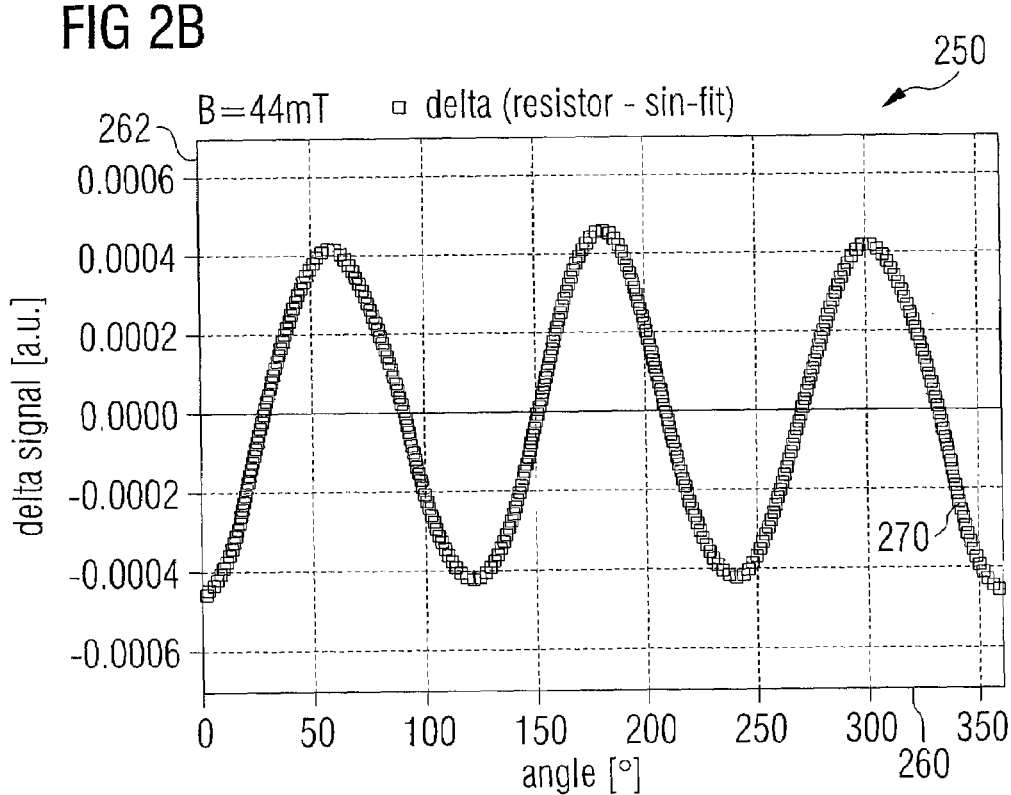
FIG. 2b is a graphical representation of a difference between a resistance signal of a single resistor and a corresponding sine fit for an external rotating field of the strength 44 mT.

Analogously to FIG. 2a, FIG. 2b shows a graphical representation of a difference between a resistance signal of a single resistor and a corresponding sine fit for an external rotating field of the strength 44 mT. The graphical representation shown in FIG. 2b is designated 250 in its entirety. A rotational angle between 0° and 360° is plotted on an abscissa 260. An ordinate 262 shows a difference between the resistance signal of a single resistor and a corresponding sine fit in arbitrary units (a. u.). A curve 270 exemplarily describes the course of the difference for an external rotating field of the strength 44 mT as a function of the rotational angle plotted on the abscissa 260. It can be seen that the difference between the resistance signal of a single resistor and the corresponding sine fit for a rotating field of the strength 44 mT is smaller by about a factor of 5 than for a rotating field of the strength 10 mT.

Figure 3A:
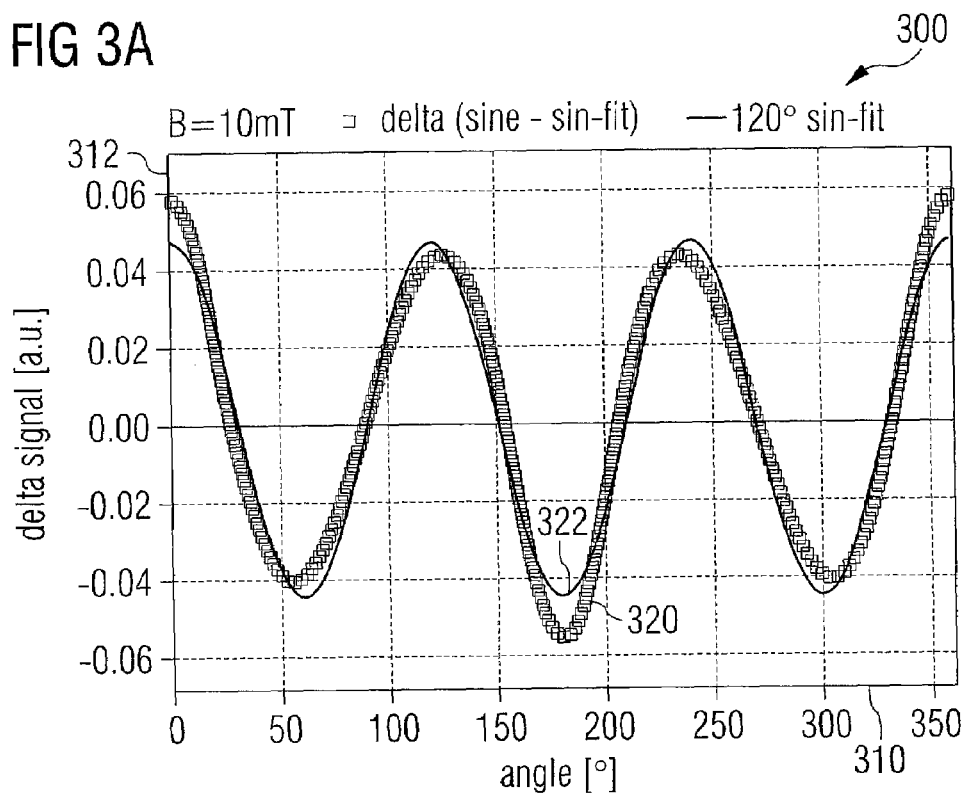
FIG. 3a is a graphical representation of a difference between a bridge signal of a bridge consisting of four single resistors and a corresponding sine fit for an external rotating field of the strength 10 mT.

FIG. 3a shows a graphical representation of a difference between a bridge signal of a bridge consisting of four single resistors and a corresponding sine fit for an external rotating field of the strength 10 mT. The graphical representation shown in FIG. 3a is designated 300 in its entirety. Again a rotational angle in a range from 0° to 360° is plotted on an abscissa 310. An ordinate 312 shows a difference between a bridge signal of a bridge consisting of four single resistors and a corresponding sine fit in arbitrary units (a. u.). The difference between the bridge signal of the bridge consisting of four single resistors and the corresponding sine fit is represented by a first curve 320 as a function of the rotational angle. It is to be noted that, for a calculation of the difference curve 320 describing a difference signal, a bridge circuit (or a bridge) consisting of four single resistors was used. The single resistors are identical to the resistors whose resistance signals have already been shown with respect to FIGS. 1a and 1b. The output signal of the bridge consisting of four single resistors was then approximated by a sinusoidal signal, and the difference between the output signal of the bridge and the associated sinusoidal signal was represented as curve 320. The graphical representation 300 further shows a second curve 322. The second curve 322 represents a sine fit to the difference signal described by the first curve 320, wherein the sine fit has a period of 120°.

In FIG. 3a, there is thus shown the difference between the bridge output signal and the sine approximation (sine fit) of the bridge output signal. For the connection of four single resistors to form an angle-sensitive Wheatstone bridge, two resistor pairs with reference magnetizations set antiparallel to each other were used. It can be seen that, both when using a single resistor and when using the bridge circuit, the result is a difference signal between the useful signal (single resistor signal and/or bridge output signal) and the associated sinusoidal fit signal to the useful signal, respectively, a difference signal with a period of 120°. In other words, after connecting four single resistors to form an angle-sensitive Wheatstone bridge, the 120° periodic difference signal between measurement (bridge output signal) and ideal sine fit (to the bridge output signal) already obtained with a single resistor is maintained.

Figure 3B:
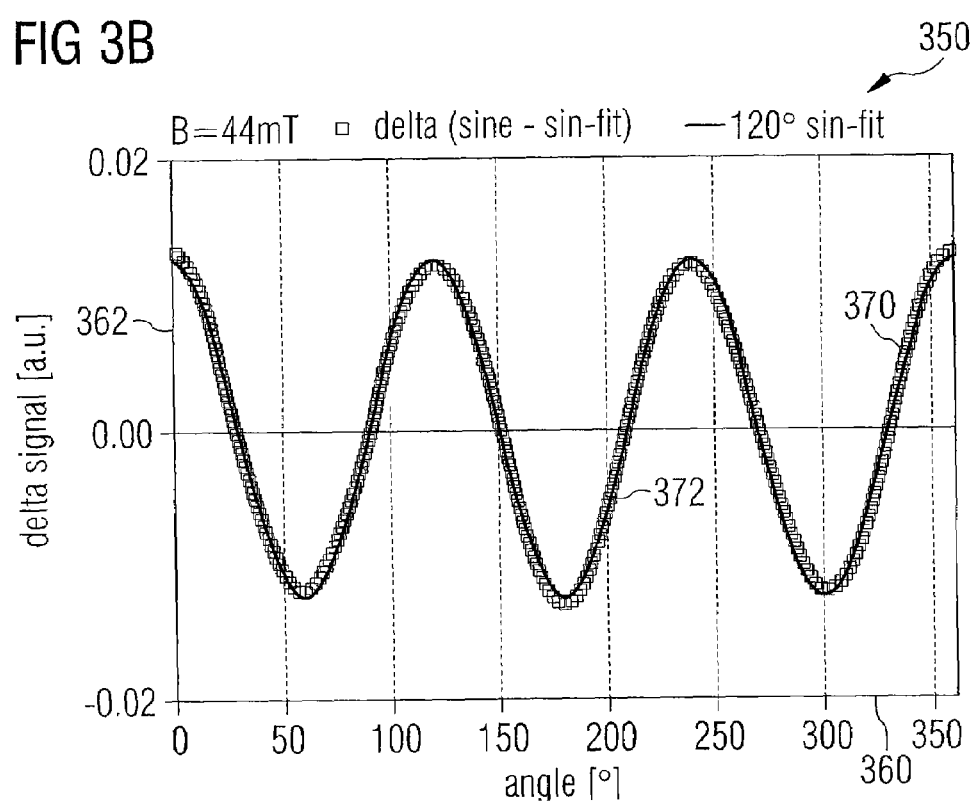
FIG. 3b is a graphical representation of a difference between a bridge signal of a bridge consisting of four single resistors and a corresponding sine fit for an external rotating field of the strength 44 mT.

FIG. 3b shows a graphical representation of a difference between a bridge signal (bridge output signal) of a bridge consisting of four single resistors and a corresponding sine fit for an external rotating field of the strength 44 mT. The graphical representation shown in FIG. 3b is designated 350 in its entirety. The graphical representation 350 is analogous to the graphical representation 300, wherein the graphical representation 350 represents the situation for an external magnetic field of the strength 44 mT, while the graphical representation 300 is valid for an external rotating field of the strength 10 mT. The graphical representation 350 shown in FIG. 3b again has an abscissa 360 and an ordinate 362. A first curve 370 (drawn as a bold line) represents a course of a difference signal between the bridge signal and the corresponding sinusoidal fit signal, while a second curve 372 drawn as a thin line describes a sine fit to the difference signal represented by the first curve 370.

When comparing the graphical representations 300, 350 shown in FIGS. 3a and 3b, it can be seen that, for a bridge circuit consisting of four single resistors, a difference between the bridge output signal and a sine fit to the bridge output signal has a period of 120°. The magnitude of the difference depends on the strength of the external rotating field. For a rotating field of 10 mT, the amplitude of this difference is larger by about the factor 3 than for the external rotating field of the strength 44 mT. The difference between the bridge output signal and the sine fit (of the period 360°) to the bridge output signal may thus again be approximated by a sine signal and/or sinusoidal signal (of the period 120°).

For a strength of the external rotating field of 44 mT, this approximation is possible with very high accuracy, while an approximation (fit) for a strength of the external rotating field of 10 mT results in perceptible errors.

Summarizing, the magnetization of the free layer in a magnetic field sensor may follow the external field better when the strength of the external field is increased. This may be seen, for example, by comparing the graphical representations 100, 150 shown in FIGS. 1a and 1b. As a consequence, the difference between the resistance signal of a single resistor and the associated sine fit to the resistance signal of the single resistor is significantly smaller when the strength of the external rotating field is larger. The difference between a resistance signal of a single resistor and a corresponding sine fit to the resistance signal of the single resistor may be seen from the graphical representations 200, 250 shown in FIGS. 2a and 2b.

Irrespective of the strength of the external magnetic field, however, the result for a single resistor is a difference signal between a simulated and/or measured value of the resistance signal and a sine fit to the simulated and/or measured angle-dependent value of the resistance signal, wherein the difference signal has a period of 120°. In the case where several single resistors are put together to a bridge circuit, the result is also a difference signal between an output signal of the bridge circuit and a sine fit to the output signal of the bridge circuit with a period of 120°.

Summarizing it can thus be said that, by a uniaxial anisotropy of the sensor layer in a magnetic rotational angle sensor, there results a difference signal periodic in 120° between a measured signal and an ideal sine fit to the measured signal. This difference signal periodic in 120° may be extracted.

Figure 4:
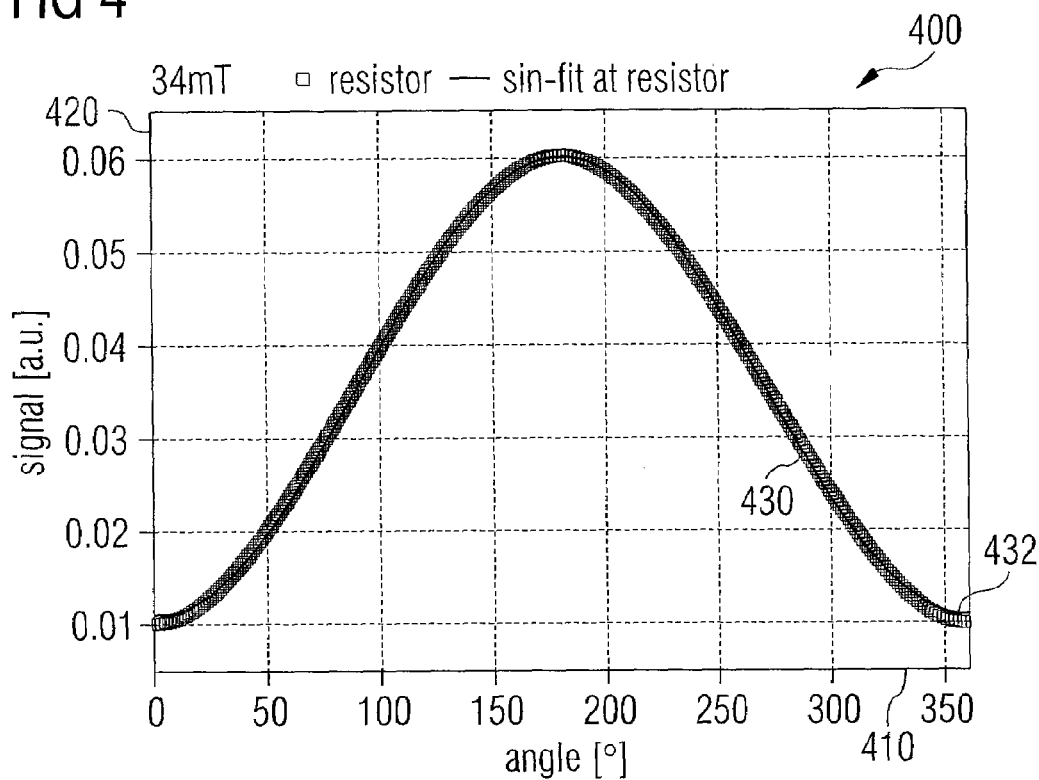
FIG. 4 is a graphical representation of a simulated resistance signal of a single resistor as a function of a rotational angle for an external rotating field of the strength 34 mT.
Figure 5:
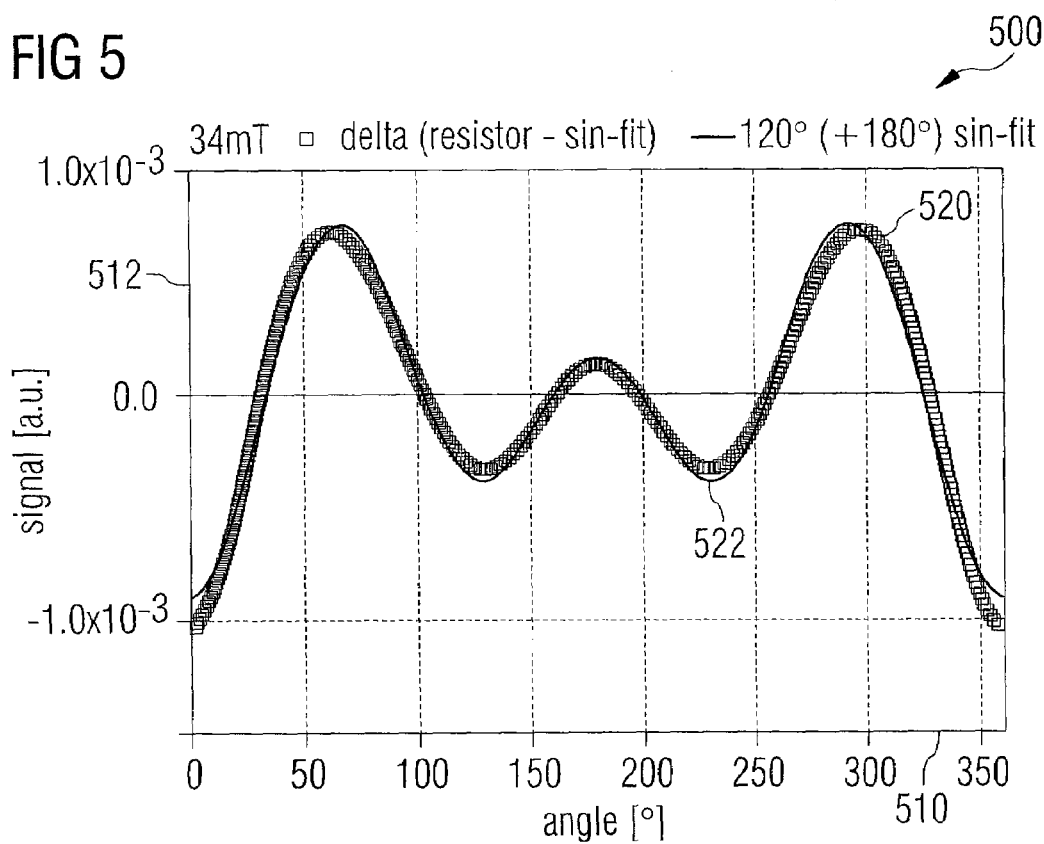
FIG. 5 is a graphical representation of a difference between a simulated resistance signal of a single resistor and a corresponding sine fit as a function of a rotational angle for an external rotating field of the strength 34 mT.
Figure 6:
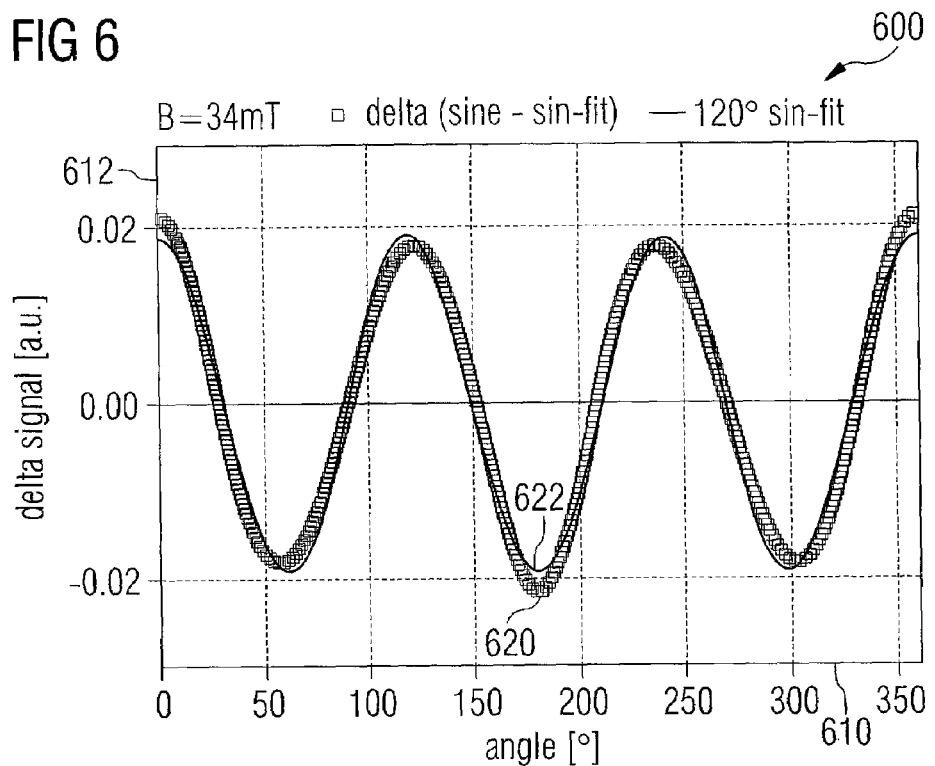
FIG. 6 is a graphical representation of a difference between a bridge signal of a bridge consisting of four single resistors and a corresponding sine fit for an external rotating field of the strength 34 mT.

In a real sensor, however, not only the uniaxial anisotropy of the sensor layer influences the sensor properties. Instead, limited pinning strengths (a so-called "exchange bias" field) of the pinned layer and exchange coupling strengths to the reference layer are responsible for a deviation of an angle-dependent resistance of a GMR structure from an ideal sine course. FIGS. 4, 5 and 6 represent the described relationships for a case close to reality. For measurements and/or simulations whose results are shown in FIGS. 4, 5 and 6, experimentally determined coupling strengths between the layers, magnetic anisotropies as well as a GMR structural width of 12 µm were considered. In other words, the used GMR structure has a structural width of 12 µm.

FIG. 4 shows a graphical representation of a simulated resistance signal of a single resistor as a function of a rotational angle (field angle) for an external rotating field of the strength 34 mT. The graphical representation shown in FIG. 4 is designated 400 in its entirety. A rotational angle (field angle) between 0° and 360° is plotted on an abscissa 410. A magnitude of the resistance signal is plotted in arbitrary units (a. u.) on an ordinate 420. The resistance signal is generated by a single GMR resistor. A first curve 430 shows a course of the resistance signal as a function of an external rotational angle and/or field angle. All real coupling and anisotropy contributions were taken into account, and a structural width of the GMR resistor of 12 µm was assumed. A second curve 432 was fitted to the first curve 430. The second curve 433 is indicated by a thin line, while the first curve 430 is drawn with a bold line. The second curve 432 thus represents a sine fit to the simulated resistance signal of the single resistor. Such a sine fit may, for example, be generated by a minimization of the error squares (non-linear least square fit).

FIG. 5 shows a graphical representation of a difference between a simulated resistance signal of a single resistor and a corresponding sine fit as a function of a rotational angle (field angle) for an external rotating field of the strength 34 mT. The graphical representation shown in FIG. 5 is designated 500 in its entirety. A rotational angle (field angle) between 0° and 360° is plotted on an abscissa 510. An ordinate 520 shows a magnitude of a difference between a simulated resistance signal and a corresponding sine fit. A first curve 520 represented as a bold line describes the difference (and/or the difference signal) between a simulated resistance signal of a single resistor, such as it is described by the first curve 430 shown in FIG. 4, and a sine fit to the simulated resistance signal, such as it is shown as a second curve 432 in FIG. 4. It can be seen from FIG. 5 that the difference (and/or the difference signal) between the resistance signal indicating the behavior of a single resistor and the ideal sine fit comprises both a main part with a period of 120° and a further part with a period of 180°. The main part with the period of 120° contributes about 60% to the overall difference signal, while the further part with the period of 180° contributes about 40%. The further part with the period of 180° is caused by the magnetizations stable to a limited extent of the reference system in an external magnetic field. The difference signal describing a difference between the simulated resistance signal of a single resistor and the sine fit to the resistance signal of the single resistor may be approximated by a superposition of two sinusoidal signals. A first sinusoidal signal with a period of 120° and a second sinusoidal signal with a period of 180° may be used to obtain a 120°+180° sine fit. The 120°+180° sine fit to the difference signal described by the first curve 520 can be seen as a second curve 522 drawn as a thin line in FIG. 5.

FIG. 6 shows a graphical representation of a difference between a bridge signal of a bridge consisting of four single resistors and a corresponding sine fit for an external rotating field of the strength 34 mT. The graphical representation shown in FIG. 6 is designated 600 in its entirety. It is assumed that the shown signals are generated by a Wheatstone bridge, wherein the same resistors are used as single resistors as in a determination of the curve courses 430, 432, 520, 522 shown in FIGS. 4 and 5.

The graphical representation 600 has an abscissa 610 on which there is plotted a rotational angle in a range between 0° and 360°. An ordinate 612 describes the magnitude of a difference signal (delta signal) between a bridge output signal of a bridge consisting of four single resistors and a sine fit to the bridge output signal of the bridge. It is shown that the difference signal between the bridge output signal and the sine fit to the bridge output signal, which is represented as a function of the rotational angle in the form of a first curve 620, substantially has a period of 120°.

The graphical representation 600 further includes a second curve 622 approximating the first curve 620 as sine fit curve. The second curve 622 has a period of 120° and is thus also referred to as 120° sine fit. It can be seen from FIG. 6 that the second curve 622 approximates the first curve 620 describing the difference signal between the bridge output signal and a sine fit to the bridge output signal in good approximation.

Summarizing, considering all real coupling and anisotropy contributions by a single resistor, a resistance signal may be generated that differs from an ideal sine fit, wherein an occurring difference may be approximated by a superposition of two parts having a period of 120° and 180°. The corresponding exemplary difference signal 520 is shown in FIG. 5 together with the associated exemplary fit curve (sine fit) 522.

If, however, the single resistors are suitably connected to form a bridge circuit, the difference signal between the bridge output voltage and the associated sine fit of the bridge output voltage essentially includes a component with a period of 120°. The corresponding exemplary difference signal 620 and the associated exemplary sine fit 622 with a period of 120° are shown in FIG. 6.

Thus it can be said that, by connecting resistor pairs with antiparallel reference magnetization and thus difference curves shifted by 180°, an error component with a period of 180° may be compensated. Thus, as shown in FIG. 6, there essentially remains a function with a period of 120° as difference signal between the bridge output voltage and the sine fit of the bridge output voltage. If a sine and a cosine signal component is used in a rotational angle sensor, this applies both to the sine and to the cosine signal component.

Thus it can be said that, in a magnetic rotational angle sensor, particularly due to uniaxial anisotropies, a difference signal between a measured signal of the sine main component or cosine main component and an ideal sinusoidal signal (sine fit to the sine main component and/or cosine main component) is generated, the difference signal essentially showing a part periodic in 120° over an angle of the external rotating field. The amplitude of the difference signal varies as a function of the strength of the magnetic field and becomes smaller with increasing field strength. The phase of the difference signal is coupled to the phase of the associated sine main signal and/or cosine main signal. Combining measured main components and/or associated main component signals with such a difference signal as correction signal may thus get the measured main component signal closer to an ideal sinusoidal signal. This helps to reduce a residual angle error.

The present invention thus aims to reduce a residual error favored in the anisotropy in a determination of an angle based on residual signals provided by a magnetoresistive angle sensor. For this purpose, residual error compensation parameters are calculated in general, which may be used for a reduction of the anisotropy-induced residual error.

In the following, a first approach is described allowing to determine the residual error compensation parameters using periodicities of difference signals of the sine and cosine components provided by angle sensors according to the giant magneto resistance (GMR angle measurement sensors) and the corresponding sine fits. In other words, a corresponding sine fit is generated for a sine component provided by a GMR angle measurement sensor. A difference between the sine component and the corresponding sine fit is again sinusoidal. The difference is then represented by a parameterized function. In the same way, a cosine component provided by the GMR angle measurement sensor is approximated by an associated sinusoidal fit curve (sine fit). Again, a difference between the cosine component and the associated sinusoidal fit curve to the cosine component is represented by a parameterized function.

A basic idea of the present invention is thus the description of the difference signals of the sine and/or cosine components and the corresponding sine fits via a parameterization.

It is to be noted that, in the following, it is always assumed that a magnetoresistive angle sensor provides two signals phase-shifted with respect to each other. In the following, these two signals are referred to as sine component and cosine component. The sine component and the cosine component have a nearly sinusoidal course. Deviations from a sinusoidal course are essentially caused by anisotropy errors of the magnetoresistive angle sensor. Both the sine component and the cosine component may be described in good approximation by an associated fit curve. The fit curve is described by an ideal sinusoidal curve adapted to the actual angle-dependent course of the associated sine component and/or cosine component. For the adaptation, amplitude, offset and phase position of the fit curve must be determined, for example, while the period of the fit curve is equal to a basic period of the sine component and/or the cosine component (typically 360°) and is thus known a priori. A difference between the sinusoidal fit curve and the sine component is referred to as residual error of the sine component in the following, a difference between the sinusoidal fit curve to the cosine component and the cosine component is referred to as residual error of the cosine component in the following. In other words, the residual error of the sine component is the deviation of the real sine component from an ideal sinusoidal course. Something similar applies to the residual error of the cosine component.

As already explained with respect to FIGS. 1a, 1b, 2a, 2b, 3a, 3b, 4, 5 and 6, the residual error of the sine component and/or the residual error of the cosine component is thus essentially periodic in 120° and has a sinusoidal course. The residual error of the sine component may thus be represented by a correction curve having a sinusoidal angle dependence. It is to be noted that this result was confirmed both by measurements and by the simulation results shown in FIGS. 1a, 1b, 2a, 2b, 3a, 3b, 4, 5 and 6. In other words, the residual error of the sine component and the residual error of the cosine component is substantially periodic in 120° and may be significantly reduced with sinusoidal corrections curves of exactly this period.

Furthermore, it is possible to use not only a sinusoidal correction curve with a given period (corresponds to a frequency), but it is also possible to superpose several sinusoidal correction curves with different periods for the compensation of the residual error of the sine component and/or the residual error of the cosine component. For example, correction curves with the periods 90°, 120°, 180° and 360° may be used.

The residual error of the sine component and/or the residual error of the cosine component may thus be approximated by a fit function (and/or fit curve), so that a compensation and/or reduction of the residual error is possible. The fit function thus consists of a single sine function or a sum of sine functions of the following form:

$$\Delta_{SIGNAL}=P1*\sin(X*\phi+P2)+P3.$$

Here, $\phi$ represents the current angle position. X sets the period of the sinusoidal function. X=2 applies to a period of 180°, X=3 applies to a period of 120°, and X=4 applies to a period of 90°. P1 represents an amplitude of the sinusoidal function, P2 represents a phase of the sinusoidal function, and P3 represents an offset of the sinusoidal function. As already mentioned, a fit function (correction curve) may consists of a sum of sinusoidal functions, so that, if necessary, the three parameters P1, P2 and P3 are to be determined for each of the individual functions, wherein X is different for each of the individual sinusoidal functions. Besides, it is to be noted that the terms sine function and sinusoidal function are essentially used as synonyms within the present description. That is because any sinusoidal function may be derived from a sine function by merely inserting a phase shift.

Furthermore it is to be noted that, for X=1, a sinusoidal function with a period of 360° may be generated that is also applicable for a reduction of the residual error of the sine component and/or of the residual error of the cosine component.

Figure 7:
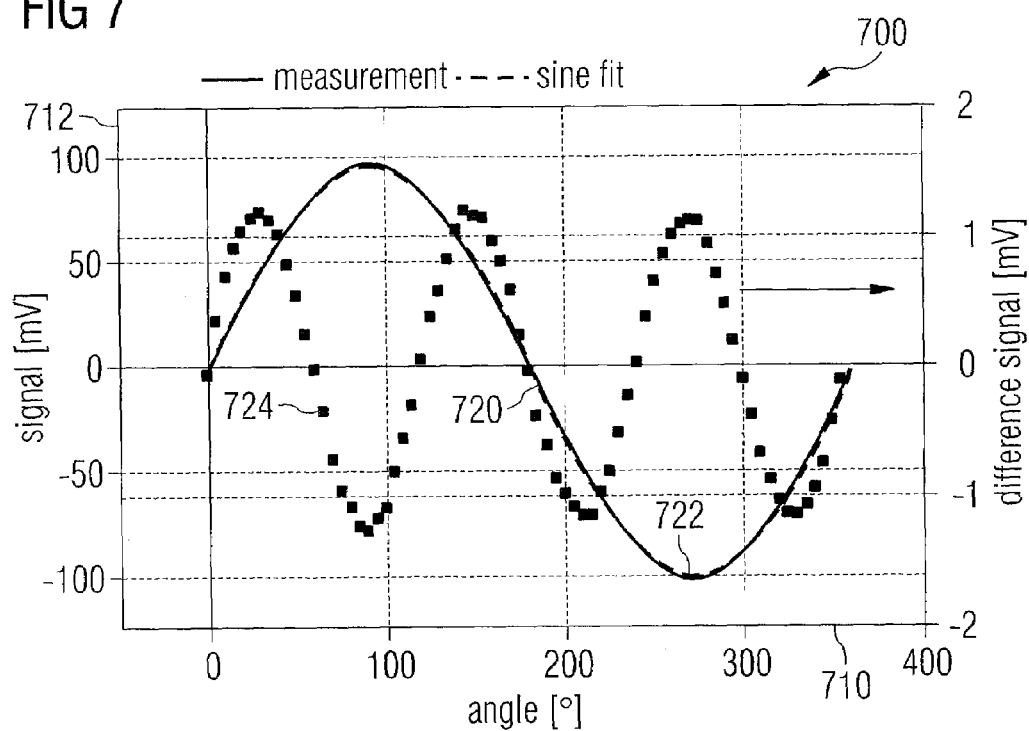
FIG. 7 is a graphical representation of an exemplary sine main component, a sine fit to the sine main component and a difference between the sine main component and the sine fit.

FIG. 7 shows a graphical representation of an exemplary sine main component, a sine fit to the sine main component and a difference between the sine main component and the sine fit. The graphical representation is designated 700 in its entirety. An angle between 0° and 400° is plotted on an abscissa 710. A first ordinate 712 shows a signal of the sine main component in a value range from −100 mV to +100 mV. A second ordinate 714 shows a difference signal between the sine main component and the sine fit to the sine main component in a value range between −2 mV and +2 mV.

A first curve 720 shown as a solid line shows a measured course of the sine main component and/or a sine main signal. The sine main component may, for example, be a sine component provided by a magnetoresistive angle sensor. A second curve 722 represented as a dashed line shows an ideal sine fit to the first (measured or simulatively generated) curve 720. In other words, the second curve 722 describes an adaptation function and/or adaptation curve adapted to the angle-dependent course of the first curve, i.e. the measured and/or simulated sine main signal. In other words, parameter of the second curve 722 representing a sinusoidal fit curve was determined so that a deviation between the second curve 722 and the first curve 720 is as small as possible.

A third curve 724 shows the difference between the sine main component and the sine fit to the sine main component, i.e. the difference between the first measured curve 720 and the second curve 722 representing an ideal sine fit to the measured curve 720. It is to be noted once again that the first curve 720 represents measured and/or simulated values for one of the two main signals (and/or main components) provided by the magnetoresistive angle sensor. The course of the third curve 724 representing the difference between the measured first curve 720 and the ideal sine fit to the first curve described by the second curve 722 shows that the above difference may be described very well by only a sinusoidal correction function with a period of 120° in the case shown. Thus, a correction value whose magnitude may be derived from the correction function may be added to a measured value of a main component depending on an angle. If correction functions are known for both main components (sine main component and cosine main component) provided by the angle sensor, the corresponding correction function may be added to each of the two main components. In that way, corrected main components are generated whose rotational angle-dependent course deviates less from an ideal sine shape than a rotational angle-dependent course of the original main components and/or main component signals provided by the angle sensor. The corrected main components and/or corrected main component signals may then be used for a calculation of a corrected rotational angle, for example via an arctan calculation. In other words, an angle-dependent representation of the differences between measurement values for the main components and ideal sine fit curves to the measurement values for the main components may be used to add respectively corresponding correction functions to both main components, thus making sinusoidal functions as ideal as possible available for an arctan calculation.

Based on the previously described calculation of correction functions formed by fit functions describing a difference between the angle-dependent course of the main components and ideal sinusoidal fit curves thereto, the following will explain a procedure for the determination of calibration and compensation parameters for a sine component compensation and a procedure for a calibration and a compensation of the measured main components for an angle measurement in a sensor arrangement. The described use of correction functions requires a process modified with respect to the conventional procedure for a sensor calibration for an angle determination with the help of the angle sensor.

The determination of the calibration and compensation parameters for the sine component compensation includes the following steps:

1. Taking measurement data in an angle range between 0° and 360°
2. Fit of the two main components of a measurement signal (main sine, main cosine) with a sinusoidal signal (also referred to as sine signal or sine fit curve) for the determination of a main offset, a main amplitude and a main phase for the main sine and the main cosine and for the determination of a possibly deviating orthogonality between the main sine and the main cosine.
3. The calculation of an angle-dependent difference between a sine fit curve and a measurement curve (determined by the angle-dependent measurement data) for the two main signals to obtain a difference curve.
4. Fit of a 120° periodic and/or 90° periodic and/or 180° periodic and/or 360° periodic sine signal (sinusoidal signal) to the difference curve. Determination of offset, amplitude and phase position of the individual 120° periodic and/or 90° periodic and/or 180° periodic and/or 360° periodic sine parts.

In other words, the two main components (main sine, main cosine) provided by the magnetoresistive angle sensor, are taken as a function of the angle in an angle range between 0° and 360°. A first signal with a sinusoidal angle dependence (also referred to as first sinusoidal adaptation function) is then fitted and/or adapted to the first main component (main sine). This allows to determine main offset, main amplitude and main phase of the measured first main component. Besides, a similar procedure is also performed for the second main component, i.e. the main cosine. Based on the determined values for main offset, main amplitude and main phase for the first main component (main sine) and the second main component (main cosine), there may then be calculated corrected main components and/or main component signals. Corresponding offset and amplitude deviations may be compensated and the first measured main component and the second measured main component may further be combined so that the result is a phase shift of 90° (orthogonality) between the corrected main component signals. Furthermore, the angle-dependent difference between the first sinusoidal signal (sine fit curve) fitted to the first main component (main sine) and the measured angle-dependent course of the first main component (measurement curve) is calculated. Similarly, the angle-dependent difference between the second sinusoidal signal fitted to the second main component of the measurement signal (main cosine) and the measured angle-dependent course of the second main component is calculated (resulting in a second angle-dependent difference). Finally, a first sinusoidal fit signal is adapted to the first angle-dependent difference by a suitable selection of parameters so that a deviation between the first sinusoidal fit signal and the first angle-dependent difference is as small as possible. The first sinusoidal fit signal may have a period of 90°, 120°, 180° or 360° or be formed from a superposition of several sinusoidal signals with the above periods. The associated parameters, i.e. offset values, amplitude values and phase positions of the individual parts of the first sinusoidal fit signal are determined. Similarly, the second angle-dependent difference is approximated by a second sinusoidal fit signal, wherein offset values, amplitude values and phase positions of sinusoidal components contained in the second sinusoidal fit signal are again determined as parameters.

A calibration and a compensation of the measured main components in an angle measurement with the sensor arrangement (magnetoresistive angle sensor) includes the following steps:

1. Measurement of the individual main components (main sine and main cosine).
2. Calibration of the main components with respect to offset, amplitude and orthogonality.
3. Calculation of a still anisotropy-errored angle.
4. Calculation of angle-dependent correction values for anisotropy compensation for the angle calculated in 3. with the aid of the previously determined correction sine function(s).
5. Perhaps adaptation of the amplitudes of the correction functions to the current temperature via the temperature coefficient of the signal amplitudes.
6. Compensation of the corrected main components with the correction values calculated in 4.
7. Calculation of the corrected angle from the compensated and calibrated main components.

In other words, the two main components (main sine and main cosine) are measured in a fist step. Thereupon, offset and amplitudes for both main components are calibrated, for example such that calibrated main components arise, which have equal amplitude and no offset anymore. Furthermore, the two main components are calibrated so that the calibrated main components have orthogonality, i.e. show a phase shift of 90° at a change of the rotational angle of the magnetoresistive angle sensor. From the main components calibrated in the manner described, then a still anisotropy-errored angle is calculated. A first angle-dependent correction value for the first main component (main sine) is calculated by evaluating the first sinusoidal fit signal for the still anisotropy-errored angle. The evaluation of the first sinusoidal fit signal takes place using the parameters for offset, amplitude, and phase position for the individual sine signals, which form the first sinusoidal fit signal in their sum. In other words, the individual sine functions are evaluated using the mentioned parameters for the still anisotropy-errored angle. In analog manner, a second angle-dependent correction value is formed for the second main component. If required, then the quantity of the first angle-dependent correction value for the first main component and of the second angle-dependent correction value for the second main component is adapted to the current temperature at which the angle sensor is. To this end, a temperature coefficient of the signal amplitudes of the main components supplied from the angle sensor is used. Thereupon, the first main component calibrated with respect to offset, amplitude and orthogonality is combined with the first angle-dependent correction value for the first main component in order to compensate for anisotropy errors. In similar manner, the second main component calibrated with respect to offset, amplitude, and orthogonality is combined with the second angle-dependent correction value for the second main component, whereby anisotropy errors can again be compensated for. Thus, a calibrated and compensated first main component and a calibrated and compensated second main component arise. From the calibrated and compensated first main component and the calibrated and compensated second main component, a corrected angle value may then be calculated.

Figure 8A:
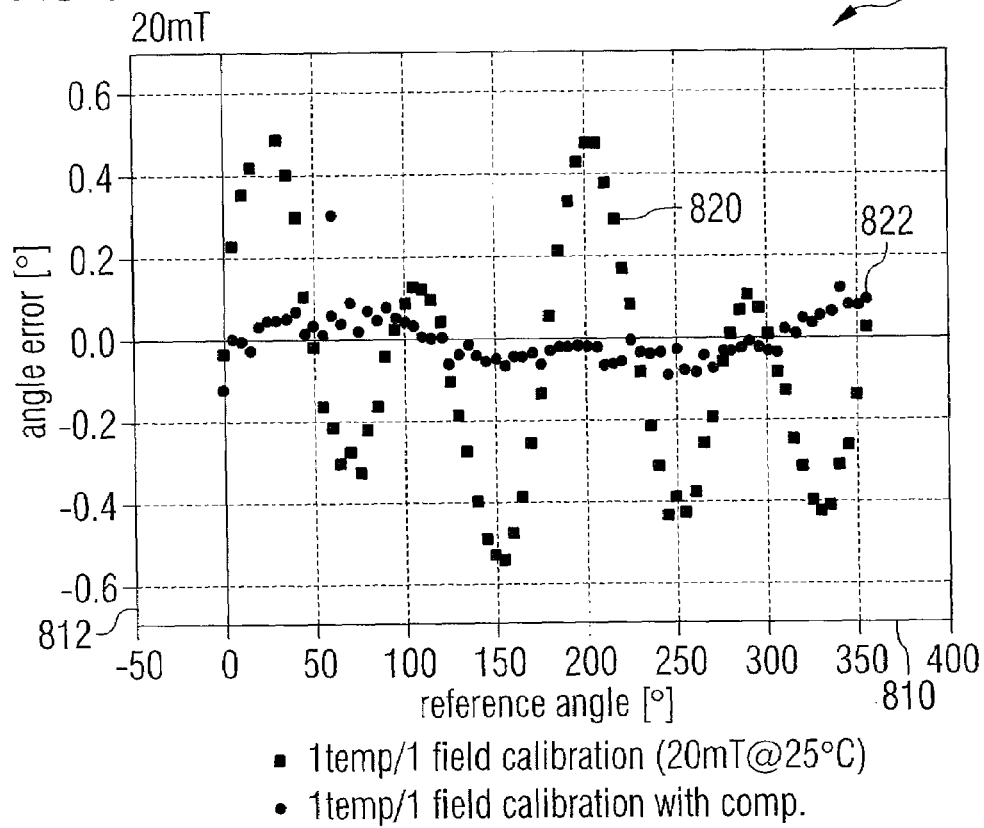
FIG. 8a is a graphical representation of an angle error in an external rotating field of the strength 20 mT after amplitude, offset and phase calibration for an external rotating field of the strength 20 mT and after an anisotropy compensation of the main components.

FIG. 8a shows a graphical illustration of an angle error at an external rotating field of the strength 20 mT after amplitude, offset, and phase calibrating with an external rotating field of the strength 20 mT, as well as after anisotropy compensation of the main components. The graphical illustration in its entirety is designated with 800. An abscissa 810 shows a reference angle in a range between −50° and 400°. An ordinate 812 shows an angle error in a range between −0.6° and +0.6°. Furthermore, there is shown a first curve course 820 formed by discrete values of the angle error of a magnetoresistive angle sensor, with only amplitude, offset, and phase calibrating having been performed. A second curve course 822 describes the angle error as a function of the reference angle using a compensation of an anisotropy error. It is to be noted here that for the amplitude, offset, and phase calibrating, as well as for the compensation of the anisotropy error, parameters used have been taken up each at magnetic field of the strength 20 mT and at a temperature of 25° C. The strength of the magnetic field also was 20 mT during the determination of the angle error. The graphical illustration 800 in FIG. 8a thus shows, on the basis of real measurement data, how the angle-dependent residual angle error illustrated by the first curve course 820 can be reduced significantly from ±0.54° to ±0.12° by taking a 120°-periodic correction function determined from the main signal into account after only offset, amplitude, and phase calibrating. Due to the use of the 120°-periodic correction function, a course of the residual angle error illustrated by the second curve course 822 results. The course for the residual error still present despite the use of the 120°-periodic correction function consists in the fact that a sine function (or sinusoidal function) with a period of 120° serving as correction function cannot describe experimentally determined correction functions for the two main signals of the angle sensor ideally well. In other words, an experimentally ascertained difference between a main component and an accompanying sinusoidal fit signal cannot be illustrated by a single sinusoidal function (or correction function) with a period of 120° in ideal manner.

Figure 8B:
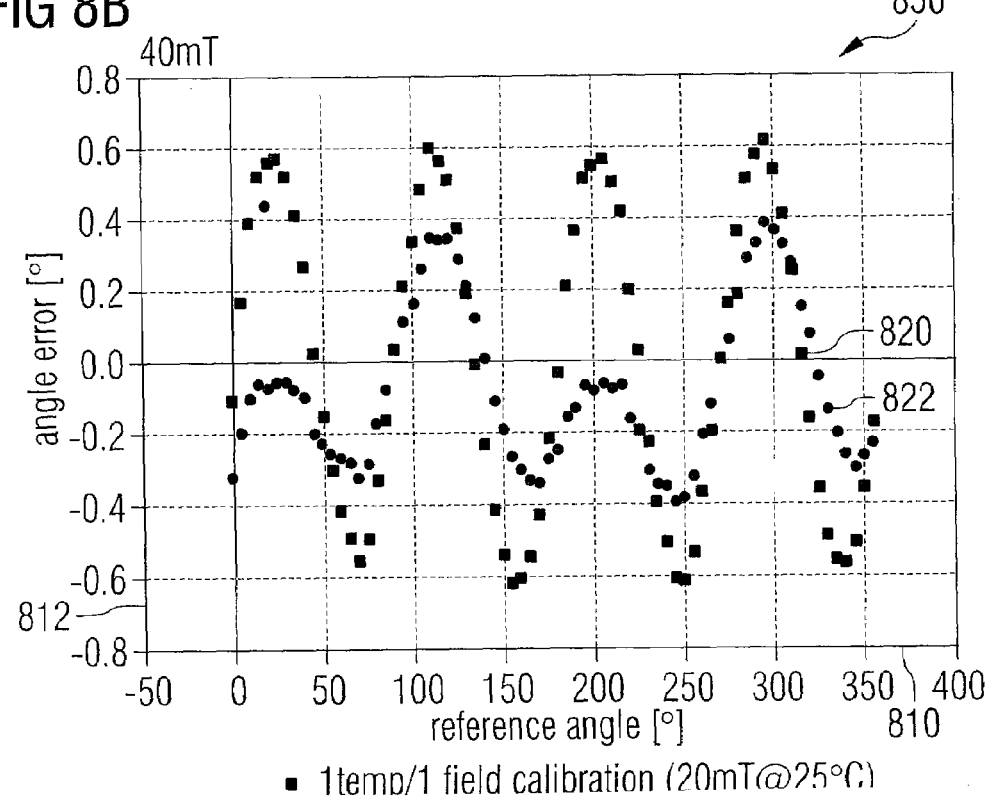
FIG. 8b is a graphical representation of an angle error for an external rotating field of the strength 40 mT after amplitude, offset and phase calibration for an external rotating field of the strength 20 mT and after an anisotropy compensation of the main components.

FIG. 8b shows a graphical illustration of an angle error at an external rotating field of the strength 40 mT after amplitude, offset, and phase calibrating at an external rotating field of the strength 20 mT and after an anisotropy compensation of the main components. The graphical illustration in its entirety is designated with 850. The graphical illustration 850 substantially corresponds to the graphical illustration 800 as to its content. Hence, the same features in the graphical illustrations 800, 850 are provided with the same reference numerals and will not be explained here again.

However, it is to be pointed out that the curve courses shown in the graphical illustration 850 have been captured at a magnetic field of the strength 40 mT, wherein calibrating the angle sensor or an accompanying evaluation means has taken place at a magnetic field of the strength 20 mT. In other words, the graphical illustration 850 of FIG. 8b shows, at a real example, the angle-dependent residual error at an external magnetic field of 40 mT, wherein anisotropy correction functions have been applied to the main signals, which have been determined at 20 mT. Compared with the optimally corrected signal at 20 mT shown in the graphical illustration 800 of FIG. 8a, at an external magnetic field of the strength 40 mT, a residual angle error results, which is greater than in the ideal case at the external magnetic field of the strength 20 mT. The residual angle error when using an anisotropy correction is, at a magnetic field of the strength 40 mT, still significantly below the angle error without anisotropy correction. Instead of an angle error of ±0.62° without anisotropy compensation, a residual angle error of only ±0.39° is achieved with anisotropy compensation.

In other words, even if the magnetic field clearly differs from the magnetic field at which a determination of the anisotropy compensation parameters (residual error compensation parameters) has taken place, the residual angle error can be decreased as opposed to a case without anisotropy compensation, using the anisotropy compensation.

Figure 9A:
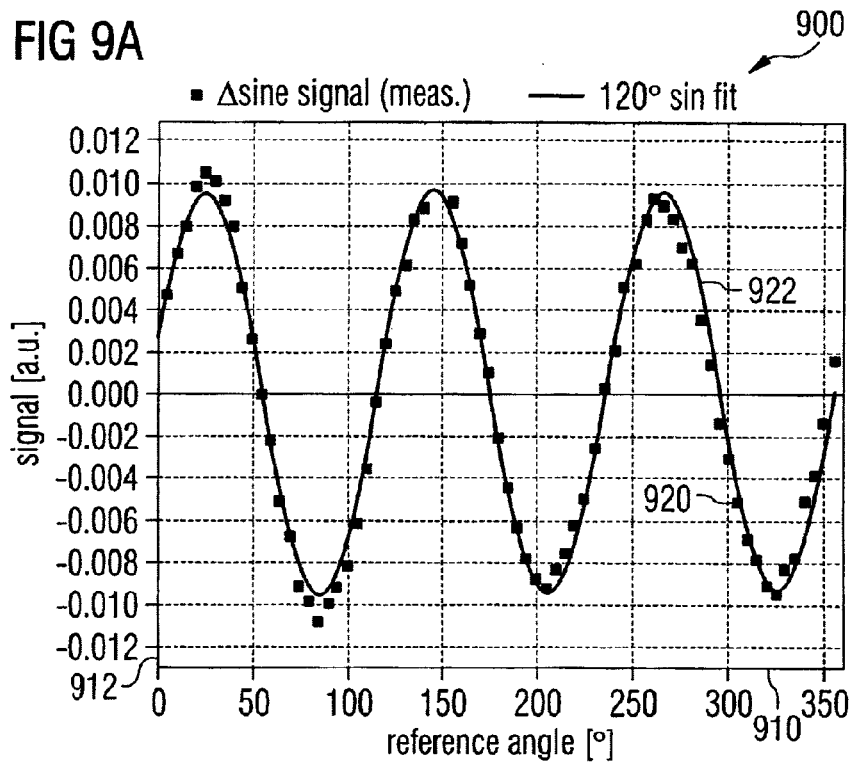
FIG. 9a is a graphical representation of a difference signal between a sine main signal and a corresponding sine fit, and a sine function periodic in 120° fitted to the difference signal.

FIG. 9a shows a graphical illustration of a difference signal between a sine main signal and a corresponding sine fit, as well as a 120°-periodic sine function fitted to the difference signal. The graphical illustration in its entirety is designated with 900. An abscissa 910 shows a reference angle in a range between 0° and 360°. An ordinate 912 describes the difference between the sine main signal and a corresponding sinusoidal fit (sine fit) in arbitrary units (a. u.). The difference signal between the sine main signal and the corresponding sine fit is illustrated in form of discrete values forming a first curve course 920 (squares). A second curve course 922 (solid line) shows a sinusoidal 120°-periodic fit curve at the first curve course 920. It turns out that the fit curve, which forms the second curve course 920, approximates the first curve course 920 in good manner. The difference between the sine main signal and the corresponding sine fit can thus be illustrated in good approximation by a 120°-periodic function (fit curve) with sinusoidal angle dependence.

Figure 9B:
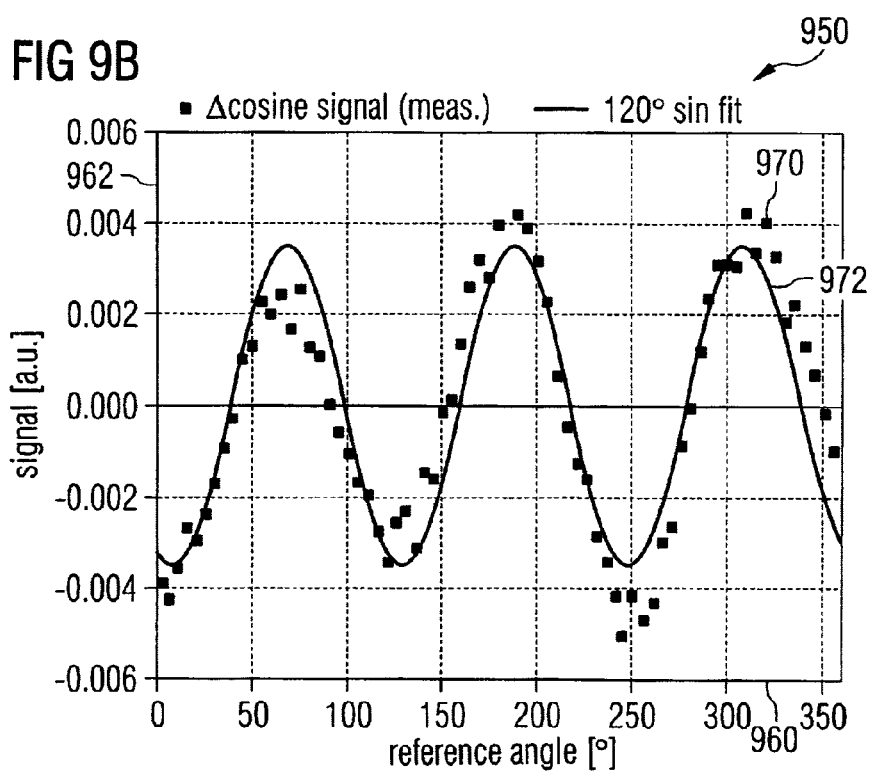
FIG. 9b is a graphical representation of a difference signal between a cosine main signal and a corresponding sine fit, and a sine function periodic in 120° fitted to the difference signal.

FIG. 9b shows a graphical illustration of a difference signal between a cosine main signal and a corresponding sine fit, as well as a 120°-periodic sine function fitted to the difference signal. The graphical illustration in its entirety is designated with 950. An abscissa 960 again shows a reference angle in a range between 0° and 360°, an ordinate describes an angle-dependent course of the difference between the cosine main signal and the sine fit to the cosine main signal in arbitrary units (a. u.). A first curve course 970 is formed of discrete values for the difference between the cosine main signal and a sinusoidal fit to the cosine main signal (squares). A second curve course 972 (solid line) illustrates a sinusoidal fit to the first curve course 970, wherein the first curve course has a period of 120°.

It is pointed out that the first curve course 920 in the graphical illustration 900 and the first curve course 970 in the graphical illustration 950 represent an ideal correction function for the sine main signal and the cosine main signal, respectively. The second curve course 922 in the graphical illustration as well as the second curve course 972 in the graphical illustration 950, however, describe corresponding 120°-periodic sine fits to the ideal correction functions 920, 970.

By way of example, the residual error compensation parameters for the actual correction functions for main sine and main cosine are also given here:

|  | main sine | main cosine |
|---|---|---|
| amplitude | 0.0035 | 0.00961 |
| phase | 66.53° | 194.78° |
| offset | 0 | 0 |

The compensation parameters indicated apply for the above-explained example.

For this example, an anisotropy-induced angle error prior to the compensation is +/−0.54°. A residual angle error after the compensation is +/−0.12°.

As already explained above, the amplitude of the correction function depends on the field strength of the external field interspersing the angle sensor. This means that after the calibrating at a field (i.e. after a determination of the parameters of the correction function at a field of certain strength) the correction functions are not always ideally fitting, when the angle sensor is operated at a field strength lying within a certain specified interval (i.e. a certain field window). As a result therefrom, an increased residual error results, when the angle sensor is operated at a field other than the calibrating field. On the basis of FIG. 8a, it has already been shown that a residual angle error increases, when the strength of the magnetic field differs from the strength of the calibrating magnetic field at which calibrating has taken place.

FIG. 10 shows a graphical illustration of a residual angle error at a temperature of 25° C. as a function of a strength of a magnetic rotating field for the case of calibrating at a magnetic rotating field of the strength 20 mT and for the case of calibrating at a magnetic rotating field of the strength 20 mT including an anisotropy correction. The graphical illustration in its entirety is designated with 1000. An abscissa 1010 describes the strength of a magnetic field present at the angle sensor in the range between 0 and 80 mT. An ordinate 1020 shows an angle error in degrees. A first curve 1030 describes an angle error without anisotropy compensation depending on a strength of the magnetic field. A second curve 1040 describes an angle error with anisotropy compensation as a function of the strength of the magnetic field. From a comparison of the first curve 1030 and the second curve 1040, an effect of the anisotropy compensation in a field range from 5 mT to 20 mT can be recognized. The first curve 1030 (squares) illustrates the residual angle error as a function of the external magnetic field after amplitude, offset, and phase calibrating. Taking anisotropy compensation parameters, acquired for a magnetic field of the strength 20 mT, into account for the two signal main components, a substantially constant reduction in the residual angle error by 0.2° to 0.3° can be achieved over a viewed range of the magnetic field strength.

FIG. 11 shows a graphical illustration of a residual angle error at a magnetic rotating field of the strength 20 mT as a function of a temperature for the case of calibrating at a magnetic rotating field of the strength 20 mT and for the case of calibrating at a magnetic rotating field of the strength 20 mT including an anisotropy correction. The graphical illustration in its entirety is designated with 1100. On an abscissa 1110, a temperature at which the angle sensor is plotted in a range between −75° C. and 175° C. An ordinate 1120 shows an angle error in a range between 0 and 0.9°. A first curve 1130 describes an angle error without anisotropy compensation depending on the temperature. A second curve 1132 describes an angle error with anisotropy compensation depending on the temperature. A further measurement point 1136 describes and angle error with an anisotropy compensation and a temperature adaptation of the anisotropy compensation for a temperature of 150° C. The graphical illustration 1100 of FIG. 11 highlights how the anisotropy compensation parameters determined at 25° C. and 20 mT may also contribute to a reduction in the residual angle error in a temperature range between −40° C. and +150° C. Here, it is to be noted that without taking a temperature dependence of signal amplitudes (with a temperature coefficient of about −0.24%/K) using fixed (i.e. temperature-independent or signal-amplitude-independent) correction signals or correction quantities into account, the correction is too small at low temperatures. Hence, the correction at low temperature is slightly less effective than at the temperature at which calibrating took place. At higher temperatures, however, the correction is too strong with respect to the actual signal height (i.e. the amplitude of a measurement signal provided from the angle sensor), so that there is overcompensation at higher temperatures. With an anisotropy compensation, even a residual angle error greater than without the anisotropy compensation may result. But if the amplitude of the correction signal (or of the correction quantities) is weighted with the temperature coefficient of the signal amplitudes, a clear reduction in the residual angle error can be achieved also at high temperatures. For example, this can be seen from the further measurement point 1136 for a temperature of 150° C.

A decrease in a residual angle error in a magnetoresistive angle sensor may also be achieved by taking advantage of periodicities of the difference signals of the sine/cosine components of GMR angle measurement sensors and the corresponding sine fits via a lookup table. In other words, the angle-dependent difference between one of the two main components (main sine or main cosine) and a sinusoidal fit (sine fit) to the main component may be described by a lookup table, wherein periodicities of the difference may be taken advantage of. By parameterization of the angle-dependent difference (difference function) between the main components (main signals) and sine fits to the main components (main signals) by means of only a 120°-periodic function, reality cannot be reproduced optimally. In other words, the angle-dependent difference (difference function) cannot be illustrated with ideal accuracy by a single 120°-periodic function. Hence, for achieving a further improved error reduction, the build-up of a lookup table is advantageous. Such a lookup table stores an accompanying value of the anisotropy error, that is of the angle-dependent difference, for each angle (or at least for a plurality of angles). With this, the anisotropy error may be compensated (calculated away) out of a main component (main signal), whereby one can again calculate back to the actual angle.

With this, in similar manner as using the 120°-periodic sine fit functions (or sine fit functions with another period), the first main component (main sine) and the second main component (main cosine) can be optimally corrected for via the lookup table at least at calibrating conditions. The use of a lookup table is the least computation-intensive correction here, but requires the presence of a memory for the lookup table.

In the previously described use of a lookup table, the sequence for a measurement and compensation of the data is also similar as in the approximation of the difference between a main component and the accompanying sine fit by a function (for example a sine function or a combination of several sinusoidal functions). For the use of the lookup table, the lookup table has, however, to be filed in a memory and provided for use. A calculation of the compensation values (correction quantities) via the evaluation of a sine function (sine calculation) is omitted.

Using a lookup table, the residual error can be completely removed at calibrating conditions in an ideal case. Due to truncations and calculation inaccuracies, however, a minimum residual error is to be reckoned with. But this is smaller than in the approximation of the differences between a main signal and the accompanying sine fit by a function.

FIG. 12 shows a flowchart of an inventive method for the determination of correction parameters according to a first embodiment of the present invention. The flowchart in its entirety is designated with 1200. The flowchart describes the determination of residual error compensation parameters for the decrease of the residual angle error by approximation of a difference between a main signal and an accompanying sine fit by a function as well as by the generation of a lookup table.

The procedure for the determination of the correction parameters for the correction of the anisotropy-induced angle errors includes the determination of two main components, which are provided from the angle sensor. For this, a sine measurement 1210 is required, with the aid of which the sine main component (main sine) is ascertained. In similar manner, the cosine main component (main cosine) is ascertained with a cosine measurement 1212. Both the sine main component and the cosine main component are measured here for a plurality of rotational angles.

In a sine fit step 1220, a sine fit is then approximated to the sine main component, which is now known for several rotational angles. Here, amplitude, offset, and phase of a sine fit function to the sine main component are ascertained. The sine fit function to the sine main component is otherwise also referred to as first sinusoidal fit function. By analogy, in a cosine fit step 1222, a sine fit function to the cosine main component is ascertained, wherein the amplitude, offset, and phase of the sine fit function to the cosine main component are determined. The sine fit function to the cosine main component is otherwise also referred to as second sinusoidal fit function. Based on the sine fit function to the sine main component and the sine fit function to the cosine main component, in an orthogonality calculation step 1230, then an orthogonality between the sine main component and the cosine main component is calculated. The orthogonality calculation step 1230 may also include the production of orthogonality between the signals of the sine main component and the cosine main component.

In a further step 1240, residual error compensation parameters are determined, which can be used for a correction of the anisotropy error. In a first alternative 1242, an angle-dependent difference between the sine main component and the sine fit function to the sine main component can be approximated or fitted by a function with a sinusoidal angle dependence or a superposition of several functions with a sinusoidal angle dependence. Here, angle-dependent functions with a period of 90°, 120°, 180°, or 360° can be used, with amplitude, offset, and phase each being ascertained.

Furthermore, in a second alternative 1244, it is possible to store differences between the sine main component and the sine fit function to the sine main component in a lookup table. Thereby, a correction of anisotropy errors can also be enabled. An analog procedure may take place in a further step 1250 for the cosine main component.

FIG. 13 shows a flowchart of an inventive method for the correction of measurement values using correction parameters determined with the method according to the first embodiment of the present invention. The flowchart in its entirety is designated with 1300. The procedure for the correction of the measurement values with the correction parameters includes determining the two main components provided from the angle sensor, that is a sine measurement 1310 of the sine main component and a cosine measurement 1312 of the cosine main component. The sine main component is corrected with respect to amplitude, offset, and phase in a sine correction 1320. Here, parameters having been determined in the sine fit step 1220 can be used.

Likewise, the cosine main component is corrected with respect to amplitude, offset, and phase in a cosine correction 1322. The sine correction 1320 provides a corrected sine main component, and the cosine correction 1322 a corrected cosine main component. The sine correction 1320 and the cosine correction 1322 may also include an orthogonality correction of the sine main component and the cosine main component, respectively, wherein the sine main component and the cosine main component may for example be combined in suitable manner, so that orthogonality is produced. Based on the corrected sine main component and the corrected cosine main component, in an angle calculation step 1330, then an anisotropy-errored angle is calculated. For the angle calculation, one of the known algorithms can be used, for example an evaluation of an arctan function.

Based on the corrected sine main component and the anisotropy-errored angle, in a first correction step 1340, a corrected and residual-error-compensated first main component 1342 is formed. In the first correction step 1340, a component anisotropy correction is performed. Thus, depending on the anisotropy-errored angle (also referred to as residual-errored angle), error-dependent correction values can be ascertained with the aid of the previously determined correction sine function or the previously determined superposition of several correction sine functions. To this end, previously determined amplitude, offset, and phase parameters for the correction sine function are used, and the correction sine function or the superposition of correction sine functions is evaluated for the residual-errored angle calculated in the angle calculation 1330. Likewise, it is possible to perform a component anisotropy correction by means of a previously built lookup table in the first correction step 1340. Here, an entry in the lookup table is evaluated, which is set by the residual-errored angle. The entry of the lookup table then determines a correction value.

The corrected residual-error-compensated sine main component 1342 is generated by adding the correction value to the corrected sine main component or subtracting it from the corrected sine main component.

In analog manner, in a second correction step 1350, a corrected and residual-error-compensated cosine main component 1352 can be generated from the corrected sine main component. From the corrected and residual-error-compensated sine main component 1342 and the corrected and residual-error-compensated cosine main component 1352, a residual-error-compensated angle is calculated in a second angle calculation 1360. Here, for example, an arctan function can be evaluated in order to calculate the residual-error-compensated angle from the ratio of the corrected and residual-error-compensated sine main component and the corrected and residual-error-compensated cosine main component.

Furthermore, it is possible to take advantage of periodicities of the residual angle error of GMR angle measurement sensors (angle sensors according to the gigantic magnetoresistive effect) when improving the accuracy of magnetoresistive rotational angle sensors and compensate for the same when combining with parameterized sine fits. As measurements have shown, a residual angle error (without component calibrating) as a function of the angle may exhibit fluctuations that are periodic in 90° and/or 180° and/or 360°, depending on which error type is dominant. By a combination with sinusoidal correction curves with a period of 90° and/or 180° and/or 360°, the residual angle error can be decreased with this, provided that the parameters of the correction curves are known. In the determination of the correction curves, it is again possible to use not only a single sine correction, but also to superimpose several sinusoidal compensations (e.g. with periods of 90°, 180°, and 360°). In principle, the correction thus works very similarly to the individual component correction, only that the resulting overall angle error is employed for the sine fit.

In other words, an anisotropy error is decreased by at first calculating residual-errored angle values for a plurality of actual angle values (reference rotational angle values). Differences between the residual-errored angle values and the actual angle values can then be determined depending on either the actual angle values or the residual-errored angle values. Here, it is advantageous to illustrate the differences between the residual-errored angle value and the actual angle value as a function of the residual-errored angle value. As it has turned out by measurements, the angle-dependent course of the differences is periodic and can be approximated by a sinusoidal function having a sinusoidal dependence on the residual-errored rotational angle. The sinusoidal function (also referred to as fit function) is fixed by a few parameters. The sinusoidal function may be a single sine function or a superposition of several sine functions. The sinusoidal function may here be regarded as correction function.

The correction of anisotropy errors is possible using the correction function and in a very simple manner. Only a residual-errored angle value is to be determined in conventional way. Thereupon, the correction function is to be evaluated for the residual-errored angle value, whereby a correction quantity is formed. This correction quantity is added to the residual-errored angle or subtracted from the residual-errored angle, whereby a residual-error-corrected angle develops.

Thus, the procedure for the determination of the calibration parameters of the main components and the compensation parameters for the residual error compensation can be summarized as follows:

1. Capture of measurement data (measurement values for the sine main component and the cosine main component) for rotational angles in the range between 0° and 360°.
2. Fit of a sine to the sine main component of the measurement signal (provided from the rotational angle sensor); fit of a sine to the cosine main component of the measurement signal (provided from the angle sensor); determination of main offset, main amplitude error, and orthogonality error, if required, between main sine and main cosine (sine main component and cosine main component).
3. Determination of a (residual-errored) measurement angle with the aid of the individual calibrated components (calibrated sine main component, calibrated cosine main component).
4. Determination of the angle-dependent residual error (of the measurement angle).
5. Fit of a 90°-periodic and/or 180°-periodic and/or 360°-periodic sine signal to the angle-dependent characteristic of the residual angle error (calculated in 4.) and determination of amplitude, offset, and phase of the 90°-periodic and/or 180°-periodic and/or 360°-periodic fit function(s).

The procedure for calibrating measured main components and a compensation for a residual angle error in the angle measurement in a sensor arrangement (magnetoresistive angle sensor) can be summarized as follows:

1. Measurement of the two main components (sine main component, cosine main component; main sine, main cosine).

2. Calibrating the sine main component and the cosine main component with respect to offset, amplitude, and orthogonality.
3. Calculation of a still anisotropy-errored measurement angle with the aid of the calibrated components (main components).
4. Compensation of the measurement angle with corresponding 90°-periodic and/or 180°-periodic and/or 360°-periodic correction components with the aid of previously determined amplitudes, offset, as well as phase positions of the correction functions.

FIG. 14 shows a graphical illustration of an angle error depending on a reference angle for the case of a compensation of component offset, component amplitude, and orthogonality, for the case of a residual error compensation with a 90°-periodic sine signal, and for the case of a residual error compensation with a 90°-periodic sine signal and a 180°-periodic sine signal. The graphical illustration in its entirety is designated with 1400. On an abscissa 1410, a reference angle is plotted in a range between 0° and 360°. An ordinate 1420 shows an angle error in a range between −0.7° and +0.7°. A first curve 1430 (squares) describes a residual angle error using calibrating amplitude, offset, and phase depending on a reference angle. A second curve 1440 (circles) describes an angle error with compensation of the anisotropy error with a sinusoidal signal of the period of 90° depending on the reference angle. A third curve 1450 (triangles) describes an angle error with compensation of the anisotropy error with a first sinusoidal correction signal of 90° period and a second sinusoidal correction signal of 180° period.

In other words, in the capture of the measurement data shown, at first an angle has been calculated based on a corrected sine main component and a corrected cosine main component, wherein the corrected sine main component and the corrected cosine main component were corrected with reference to amplitude, offset, and phase. A correction angle having a sinusoidal angle dependence with a period of 90° was then added to the residual-errored angle resulting therefrom. According to this method, a residual error as it is shown in the second curve 1440 could be achieved. The adding of a further correction quantity, which has a sinusoidal dependence with a period of 180° on the residual-errored angle, yields a residual error as it is illustrated in the third curve 1450 as a result.

FIG. 14 thus shows the procedure in the compensation of a residual angle error on the basis of real measurement data. The first curve 1430 (squares) reproduces the residual angle error as a function of the angle after amplitude, offset, and phase calibrating. The second curve 1440 (circles) describes the reduced residual error, after a 90°-periodic portion has been subtracted. In addition thereto, a correction of the angle error behavior by a 180°-periodic portion (third curve 1450) leads to a significant reduction in the residual angle error. The residual angle error can thus be decreased from originally about 0.54° to 0.12°.

In order to facilitate understanding of the described error compensation, the parameters of the error compensation functions will still be indicated here. The sinusoidal error compensation function in a period of 90° has an amplitude of 0.3520, a phase of 5.38°, and an offset of −0.0544. The second error compensation function with a period of 180° has an amplitude of 0.2031, a phase of 30.39° as well as an offset of 0.0000. An anisotropy angle error prior to the compensation described is +/−0.54°, a residual angle error after the compensation is +/−0.12°.

FIG. 15 shows a graphical illustration of an angle error at a temperature of 25° as a function of a strength of a magnetic rotating field for the case of a compensation of component offset, component amplitudes, and orthogonality, for the case of a residual error compensation with a 90°-periodic sine signal, and for the case of a residual error compensation with a 90°-periodic sine signal and a 180°-periodic sine signal. The graphical illustration in its entirety is designated with 1500. On an abscissa 1510, the strength of the magnetic field is plotted in a range between 0 and 90 mT. An ordinate 1520 shows an angle error in a range between 0° and 2.2°. A first curve 1530 (squares) describes an angle error in an amplitude, offset, and phase compensation, wherein the calibration parameters for the compensation are acquired at a magnetic field of 20 mT. A second curve 1540 describes the angle error in an additional anisotropy error compensation with a sinusoidal signal with a period of 90°. The second curve is characterized by circles. A third curve 1550 describes the angle error for an anisotropy error compensation with a first sinusoidal signal with a period of 90° and a second sinusoidal signal with a period of 180°. The third curve is characterized by triangles.

From the graphical illustration 1500 of FIG. 15, it can be seen that the characteristic of the residual angle error as a function of the reference angle has a dependence on the magnetic field strength. FIG. 15 comparatively shows a residual angle error depending on the magnetic field strength for the case only after the calibrating (first curve 1530, squares), after a residual error compensation of the 90°-periodic portions (second curve 1540, circles), and after a compensation of the 90°-periodic portions and the 180°-periodic portions (third curve 1550, triangles). In this, always the same compensation functions acquired at 20 mT were applied. It becomes obvious that when using a residual error compensation, a partly clear reduction in the residual angle error is achieved in an application-relevant field range between 15 mT and 45 mT.

FIG. 16 shows a graphical illustration of an angle error for a magnetic rotating field of the strength 20 mT as a function of the temperature for the case of a compensation of component offset, component amplitudes, and orthogonality, for the case of a residual error compensation with a 90°-periodic sine signal, and for the case of a residual error compensation with a 90°-periodic sine signal and a 180°-periodic sine signal.

The graphical illustration in its entirety is designated with 1600. On an abscissa 1610, a temperature of the angle sensor is plotted in a range between −75° and +175°. An ordinate 1620 shows an angle error in a range between 0.05° and 0.90°. A first curve 1630 describes the angle error for the case that only an amplitude, offset, and phase compensation is performed. Parameters for these compensations have been ascertained at 25° C. A second curve 1640 (circles) describes an angle error with an error correction with a sinusoidal correction quantity with a period of 90°. A third curve 1650 (circles) describes a temperature-dependent course of the angle error for an error correction with a first sinusoidal correction quantity with a period of 90° and a second sinusoidal correction quantity with a period of 180°.

On the basis of FIG. 16, it can be seen that the characteristic of the first angle error as a function of the reference angle has a dependence on the temperature. A comparison of FIGS. 15 and 16 further shows that (for practically relevant temperatures and magnetic field strengths) the dependence of the residual angle error on the temperature is lower than the dependence on the magnetic field strength. FIG. 16 further shows that for application-relevant temperatures, a clear reduction in the residual angle error can be achieved by the anisotropy error compensation. Besides, it is to be noted that for the temperature range between −40° C. and +150° C. compensation functions acquired at 25° C. were applied.

Furthermore, it is possible to take advantage of periodicities of the residual angle error of GMR angle measurement sensors and compensate for the residual angle error via a combination by means of a lookup table. Since a parameterization of the difference function between a residual-errored angle and a reference angle with the aid of a sinusoidal fit function or a combination of several sinusoidal fit functions (for example with a period of 90° and/or 120° and/or 180° and/or 360°) cannot optimally reproduce reality, the build-up of a lookup table is advantageous for the achievement of further enhanced error reduction. Such a table stores the corresponding residual angle errors for each angle (or at least for a plurality of angles). In other words, the lookup table contains, for a plurality of rotational angles, the difference between a residual-errored angle provided from the angle sensor and an actual angle or reference angle. If this difference, which can also be understood as anisotropy-induced residual angle error, is known, the actual angle can be determined with knowledge of the residual-errored angle by mere addition or subtraction of the difference. In other words, with the aid of the entries of the lookup table, the actual angle (rotational angle) can be calculated back due to an anisotropy-errored angle provided from an angle sensor. The use of a lookup table represents the least computation-intensive possibility for the correction of an anisotropy error. A disadvantage in the use of a lookup table is the fact that a memory is required, in which the lookup table can be filed.

Besides, it is to be noted that the sequence for measurement and compensation of data using a lookup table is the same as with an approximation of a residual angle error by a sinusoidal function. Instead of parameters describing a difference between a residual-errored angle and a reference angle by parameterization of one or more sinusoidal functions, in the use of a lookup table the angle-dependent difference between a calculated residual-errored angle and an actual angle (or reference angle) is directly entered into the lookup table.

In an ideal case, with the aid of the lookup table, the residual error can be removed completely (at the same conditions as in the calibrating, that is at equal temperature and equal magnetic field strength). Due to truncations and calculation inaccuracies, however, a minimum residual error has to be reckoned with. It can, however, be assumed that this is smaller than in a case in which the difference between the residual-errored angle and the actual angle is approximated by a sine function or by several sine functions.

FIG. 17 shows a flowchart of an inventive method for the determination of correction parameters according to a second embodiment of the present invention. The flowchart in its entirety is designated with 1700 and describes a determination of correction parameters for the correction of an anisotropy error in a magnetoresistive angle sensor. The determination of the correction parameters includes the measurement of the sine component provided from the angle sensor within the scope of a sine measurement 1710. The sine measurement thus generates a sine main component 1712. In similar manner, a cosine main component 1718 is generated with a cosine measurement 1716. From the sine main component 1712, amplitude, offset, and phase of a fit curve are determined by a sine fit 1720. From the cosine main component 1718, amplitude, offset, and phase of a further fit curve are determined in similar manner with the aid of a cosine fit 1724. It is possible to normalize the sine main component 1712 with reference to the amplitude in the determination of the sine fit 1720, and to eliminate the offset. Something similar can be performed with the cosine main component 1718 in the cosine fit 1724. Here, it is to be noted that the sine measurement 1710 and the cosine measurement 1716 have to be executed several times and for several various rotational angles for the sine fit 1720 and the cosine fit 1724. Following the sine fit 1720 and the cosine fit 1724, an orthogonality of the sine main component 1712 and of the cosine main component 1718 can be calculated. The calculation of the orthogonality is designated with 1730. The calculation of the orthogonality may also include an orthogonality correction, wherein the sine main signal and the cosine main signal can be combined so that these comprise a phase shift of 90° at a change of the rotational angle, i.e. are orthogonal to each other. After the orthogonality calculation 1730, an angle calculation 1740 may take place. Here, a residual-errored angle 1742 can be calculated based on the sine main component 1712 and the cosine main component 1718. It is preferred that calibrating the sine main component 1712 and calibrating the cosine main component 1718 also goes into the calculation of the angle. Furthermore, it is preferred that the sine main component 1712 and the cosine main component 1718 are calibrated with reference to the orthogonality prior to the angle calculation 1740. Based on the residual-errored angle 1742, an angle-dependent residual error may then be calculated. To this end, it is necessary to know the actual angle present at the angle sensor as reference angle. The angle-dependent residual error then is the difference between the actual angle and the residual-errored angle 1742. If the above-described measurements are performed for a plurality of rotational angles, the residual-errored angle is known for a plurality of actual rotational angles. Conversely, the angle-dependent residual error can be calculated for various values of the residual-errored angle 1742. A course of the angle-dependent residual error, which thus is known as a function of the residual-errored angle, can now be approximated by a sinusoidal course or a combination of several sinusoidal courses. It is the obvious thing that the sinusoidal course or the sinusoidal courses have a period of 90°, 180°, or 360°. For the sinusoidal course or the sinusoidal courses, amplitude, offset, and phase can each be determined. Thus, the angle-dependent residual error is described as a function of the residual-errored angle by a sinusoidal function or a superposition of several sinusoidal functions. The parameters of this function or these functions are determined and can be used in a later correction of a measurement value.

On the other hand, it is possible to file the difference between the actual angle (reference angle) and the residual-errored angle, that is the angle-dependent residual error, in a lookup table or value table. Here, value pairs may each be filed, with a first entry of a given value pair characterizing the residual-errored angle, and with a second entry of the given value pair describing the accompanying residual error. The plurality of value pairs for various actual angles (and thus also for various residual-errored angles) here form a lookup table, which can be stored for later use in a correction of measurement values. Besides, it is to be noted that it also is sufficient to file only values of the angle-dependent residual error for given values of the residual-errored angle in a lookup table. The position of the entry with an angle-dependent residual error here implicitly fixes the accompanying residual-errored angle.

Figure 18:
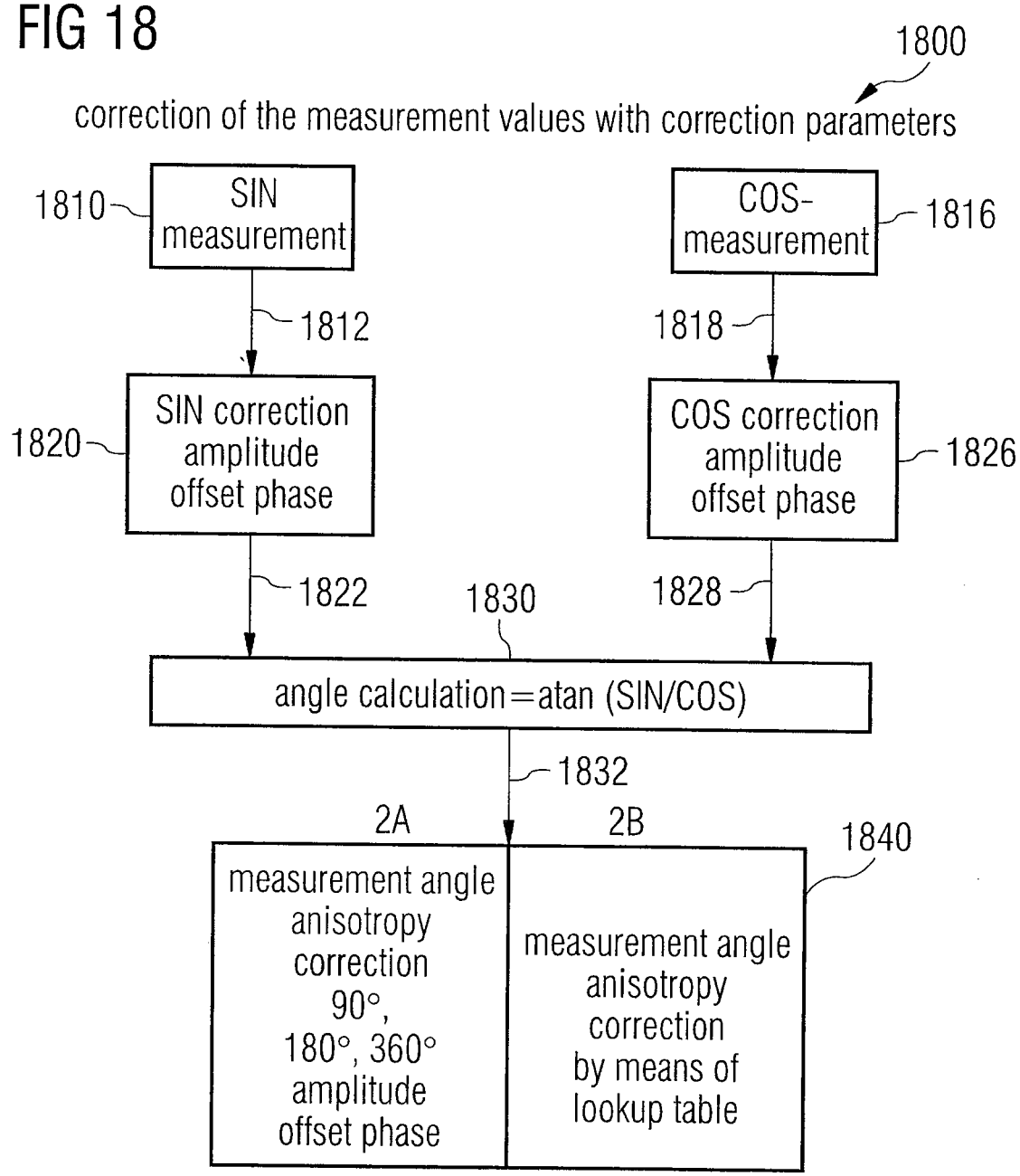
FIG. 18 is a flow diagram of an inventive method for the correction of measurement values using correction parameters ascertained with the inventive method according to the second embodiment of the present invention.

FIG. 18 shows a flowchart of an inventive method for the correction of measurement values using correction parameters ascertained with the inventive method according to the second embodiment of the present invention. The flowchart in its entirety is designated with 1800. The method for the correction of measurement values with correction parameters includes performing a sine measurement 1810, with the aid of which a sine main component 1812 can be ascertained. In similar manner, a cosine main component 1818 is determined with the aid of a cosine measurement 1816. Then, a sine correction 1820 is applied to the sine main component 1812. With this, amplitude and offset of the sine main component 1812 are calibrated. The phase of the sine main component can also be changed, whereby a corrected sine main component 1822 arises. In similar manner, the cosine main component 1818 is subjected to a cosine correction 1826. In the cosine correction, amplitude, offset, and phase position of the cosine main component are again calibrated, whereby a corrected cosine main component 1828 arises. Besides, it is to be noted that the correction of the phase of the sine main component 1812 as well as the correction of the phase of the cosine main component 1818 are performed so that the corrected sine main component 1822 and the corrected cosine main component 1828 are orthogonal to each other. The correction of the two phases may thus also be seen as orthogonality correction. In the phase or orthogonality correction of the sine main component 1812 and the cosine main component 1818, for example, the sine main component 1812 and the cosine main component 1818 can be combined with each other in a weighted manner, wherein the weighting depends on how strongly the sine main component and the cosine main component 1818 deviate from orthogonality.

Based on the corrected sine main component 1822 and the corrected main component 1828, then an angle calculation 1830 can be performed, which provides a residual-errored angle 1832. The measurement-errored angle 1832 can then be corrected with an angle correction 1840. To this end, based on the residual-errored angle 1832, angle-dependent correction values can be calculated with the aid of the previously determined correction sine functions. In other words, the residual-errored angle 1832 is substituted into a correction sine function, the residual parameters (amplitude, phase, offset) of which have been previously calculated as correction parameters. A correction value can here be determined from a single sine function or from a superposition of several sine functions, wherein the sine functions preferably have a period of 90°, 180°, or 360°. A correction value thus calculated may be adapted to the current temperature using the temperature coefficient of the signal amplitudes, under certain circumstances. Finally, the ascertained correction value can be added to the residual-errored angle 1832 or subtracted from the residual-errored angle 1832, whereby a residual-error-compensated angle develops.

Besides, it is also possible to determine a correction value on the basis of the residual-errored angle 1832 in a lookup table. Here, only the entry of the lookup table pertaining to the residual-errored angle is to be found, and the entered correction value to be read out. The correction value may then be added to the residual-errored angle or subtracted from the residual-errored angle, so that the residual-error-compensated angle develops.

Furthermore, it is to be stated that an anisotropy-rooted residual error of a magnetoresistive angle sensor can also be reduced in an implementation-friendly manner by the use of a non-linear transmission element with a polynomial characteristic curve. It has been found out that the 120°-periodic portion of the anisotropy error superimposed on the sine main component provided from the angle sensor and the corresponding cosine main component has its course in a non-linear translation of the orthogonal magnetic field components (magnetic field sine component and magnetic field cosine component) into an electric sine main signal or cosine main signal (also referred to as sine signal or cosine signal). The electric signal has a polynomial-like distortion of the component measurement signal. Based on this finding, implementation-friendly correction methods are devised so as to calculate an absolute angle as error-free as possible from the measured angle component signals (e.g. sine main component and cosine main component).

Am implementation-friendly correction method can start out from a polynomial fit of the sine and cosine transfer function. As described above, the residual error of the sine component and of the cosine component is substantially distorted in non-linear manner and can be reduced noticeably with a correction of the inverse function. In other words, the sine main component provided from the angle sensor describes a magnetic field component in a first direction in a non-linearly distorted manner. The magnetic field component varies with the rotational angle in a sinusoidal manner. By the non-linear distortion, the sine main component has a course that is no longer purely sinusoidal. The same applies for the cosine main component, which describes a second magnetic field component orthogonal to the first magnetic field component.

The non-linear distortion in a mapping of a magnetic field component to the accompanying main component, i.e. a mapping of the first magnetic field component to the sine main component and of the second magnetic field component to the cosine main component (wherein the first magnetic field component and the second magnetic field component ideally are perpendicular to each other), can be described in a good approximation with a polynomial function. In this, in principle, it is possible to use an arbitrarily complex polynomial. Square and cubic polynomial portions are relevant for practice, since technically still realizable.

The transfer function with which a magnetic field component is mapped to an accompanying errored signal component provided from the magnetoresistive angle sensor (also referred to as error function or distortion function) thus substantially consists of a polynomial of the form of:

$$COS_{sig}=A_{cos}+B_{cos}*X+C_{cos}*X^2+D_{cos}*X^3,$$

with $$X=\cos(\alpha+\phi_{cos})$$

and $$SIN_{sig}=A_{sin}+B_{sin}*Y+C_{sin}*Y^2+D_{sin}*Y^3,$$

with $$Y=\cos(\alpha+\phi_{sin}).$$

$COS_{sig}$ and $SIN_{sig}$ here are the errored signal components from the magnetoresistive sensor. $\alpha$ is the angle of an externally applied magnetic field (magnetic rotating field). $A_{cos}$, $B_{cos}$, $C_{cos}$, $D_{cos}$, $A_{sin}$, $B_{sin}$, $C_{sin}$, and $D_{sin}$ are sensor-specific polynomial-amplitude parameters or polynomial coefficients. $\phi_{cos}$ and $\phi_{sin}$ are component phase shifts. All parameters $A_{cos}$, $B_{cos}$, $C_{cos}$, $D_{cos}$, $A_{sin}$, $B_{sin}$, $C_{sin}$, $D_{sin}$, $\phi_{cos}$, and $\phi_{sin}$ are to be determined and then calibrated in a system.

As an example, several values for the parameters are to be given here, wherein the distortion is illustrated in exaggerated manner here for illustration:

For example, the following applies for the cosine main component:

$$\phi_{cos}=0.1;\ A_{cos}=0.1;\ B_{cos}=0.9;\ C_{cos}=0.05;\ D_{cos}=0.3.$$

For example, the following applies for the sine main component:

$$\phi_{sin}=-0.05;\ A_{sin}=-0.05;\ B_{sin}=0.95;\ C_{sin}=0.03;\ D_{sin}=0.2.$$

Figure 19:
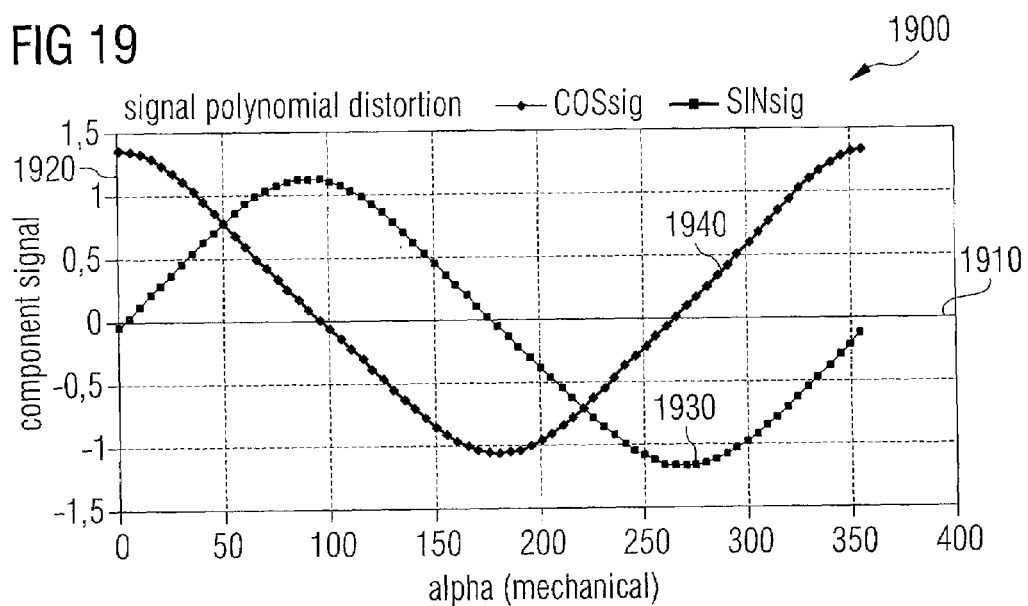
FIG. 19 is a graphical representation of two component signals after a polynomial distortion as a function of a rotational angle.

FIG. 19 shows a graphical illustration of two component signals depending on a rotational angle after a polynomial distortion. The graphical illustration in its entirety is designated with 1900. On an abscissa 1910, the mechanical rotational angle Alpha(mechanical) is plotted in a range between 0° and 400°. An ordinate 1920 describes the value of the sine component signal (sine main component) and the cosine component signal (cosine main component) in a value range from −1.5 to +1.5. A first curve 1930 describes the dependence of the sine component signal $SIN_{sig}$ depending on the mechanical rotational angle Alpha(mechanical). A second curve 1940 describes the rotational-angle-dependent course of the cosine component signal $COS_{sig}$.

It can be seen that the sine component signal $SIN_{sig}$ and the cosine component signal $COS_{sig}$ have an almost sinusoidal course, which shows, however, slight distortions as well as an offset shift.

Figure 20:
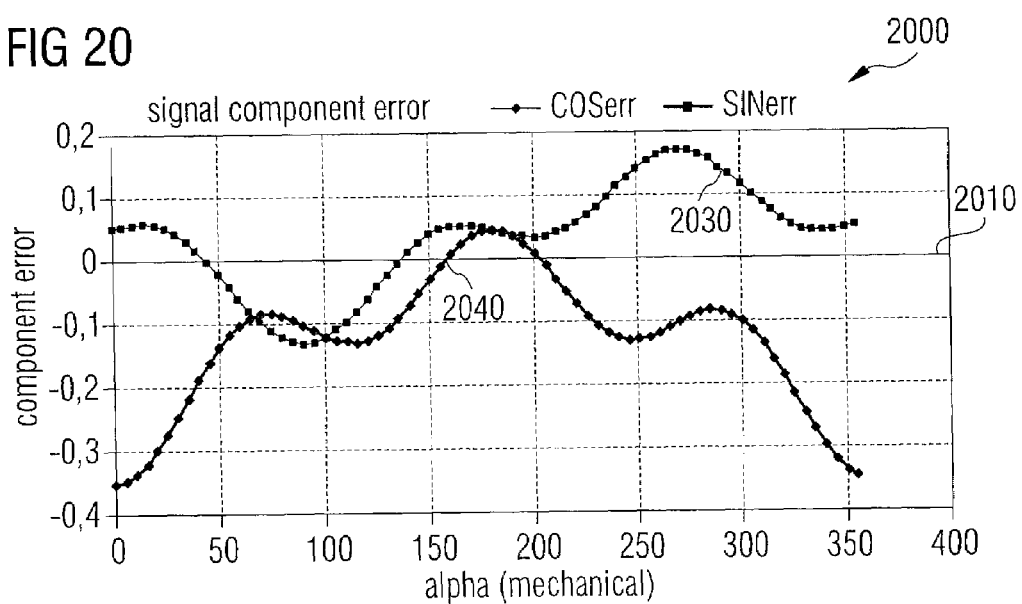
FIG. 20 is a graphical representation of two component errors after a polynomial distortion as a function of a rotational angle.

FIG. 20 shows a graphical illustration of signal component errors after a polynomial distortion depending on a rotational angle. The graphical illustration in its entirety is designated with 2000. On an abscissa 2010, a mechanical rotational angle Alpha(mechanical) is plotted in a range between 0° and 400°. An ordinate 2020 shows a component error in a range between −0.4 to +0.2. The sine component error for the sine main component is here defined as difference between an ideal sinusoidal signal and the polynomial-like distorted sine component signal, as it is for example shown by the first curve 1930 of the graphical illustration 1900. The cosine component error is defined as difference between an ideal cosine signal (with a period of 360°) and the polynomial-like distorted cosine component signal, as it is for example shown by the second curve 1940 of the graphical illustration 1900.

Thus, the first curve 2030 describes the sine component error $SIN_{err}$ for the sine component signal depending on the rotational angle Alpha(mechanical). Furthermore, a second curve 2040 shows the cosine component error $COS_{err}$ for the cosine component signal depending on the rotational angle.

Figure 21:
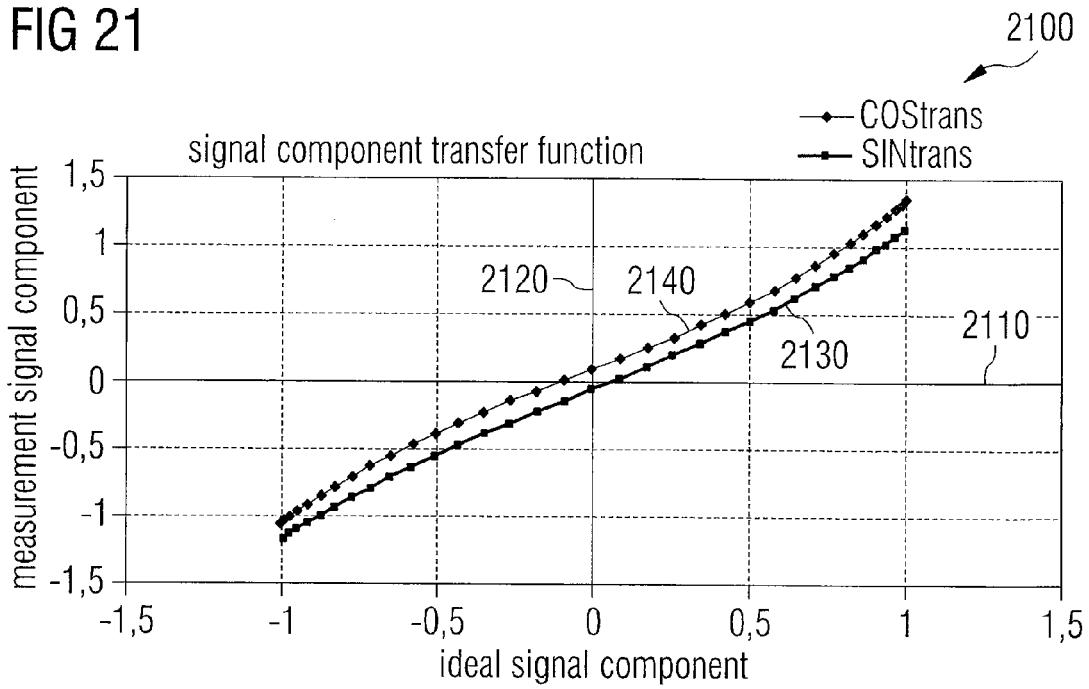
FIG. 21 is a graphical representation of a signal component transfer function.

FIG. 21 shows a graphical illustration of a signal component transfer function. The graphical illustration in its entirety is designated with 2100. On an abscissa 2110, an ideal signal component (ideal sine signal component or ideal cosine signal component) is plotted in a range between −1.5 to +1.5. An ordinate 2120 shows a measurement signal component, that is a main component actually provided from a magnetoresistive angle sensor (sine component or cosine main component). A first curve 2130 describes how the ideal sine signal component is distorted in the formation of the sine measurement signal component (in fact provided from the magnetoresistive angle sensor). In other words, an ideal angle sensor would provide the ideal sine signal component, but a real angle sensor only provides the sine measurement signal component. A second curve 2140 describes how the ideal cosine signal component is mapped to a cosine measurement signal component in a rotational angle sensor. It may again be assumed that an ideal angle sensor would provide an ideal cosine signal component, while a real angle sensor in fact provides the cosine measurement signal component.

In order to cancel the distortion of the ideal sine signal component and the ideal cosine signal component (also designated as X and Y) by a non-ideal angle sensor, correction parameters have to be ascertained. In order to calculate back to the above-described parameters $A_{cos}$, $B_{cos}$, $C_{cos}$, $D_{cos}$, $A_{sin}$, $B_{sin}$, $C_{sin}$, $D_{sin}$, $\phi_{cos}$, and $\phi_{sin}$, an equation system has to be set up, which is very complicated to solve. In other words, from the knowledge of the measured errored measurement signal components $COS_{sig}$ and $SIN_{sig}$, which are provided from the magnetoresistive sensor for a non-external magnetic field, the parameters ($A_{cos}$, $B_{cos}$, $C_{cos}$, $D_{cos}$, $A_{sin}$, $B_{sin}$, $C_{sin}$, $D_{sin}$, $\phi_{cos}$, and $\phi_{sin}$) can be calculated. The signals X and Y ideally to be expected are also known at least in sufficiently good approximation. Thus, the distortion of the errored measurement signal components $COS_{sig}$ and $SIN_{sig}$ provided from the magnetoresistive sensor can be described in form of a polynomial with known coefficients. For a correction of the distortion, it is now necessary to determine the inverse function to the polynomial distortion. It is, however, very difficult to find an inverse function to a third-order polynomial function in analytical way. Such an analytical inverse function will in a general case also always comprise root functions, which are only very difficult to implement in a simple calculating unit. Hence, it is a main idea of the present embodiment to describe the inverse function, which is able to cancel the above-described polynomial distortion, in good approximation by a further polynomial. In other words, so as to simplify a complex calculation path in a calculation of an inverse function to the distortion function, it is proposed to calculate the back transform of the distorted component signal into a linear and error-corrected signal also via a polynomial fit.

For the case of magnetoresistive angle sensors, here a simplification can be taken advantage of, which is based on the geometry of the magnetoresistive angle sensor. In a magnetoresistive angle sensor utilizing the gigantic magnetoresistive effect (GMR angle sensor), substantially an offset, a linear amplitude portion, and a third-order component work. Thus, a correction function generating corrected signals $COS_{corr}$ and $SIN_{corr}$ from the main component signals (measurement signal components) $COS_{sig}$ and $SIN_{sig}$ provided from the angle sensor can be illustrated in the following way:

$$COS_{corr}=COS_{sig}+A'_{cos}+B'_{cos}*COS_{sig}+D'_{cos}*COS^3_{sig}$$

$$SIN_{corr}=SIN_{sig}+A'_{sin}+B'_{sin}*SIN_{sig}+D'_{sin}*SIN^3_{sig}.$$

Based on the given description of the correction function, substantially the parameters $A'_{cos}$, $B'_{cos}$, $D'_{cos}$, $A'_{sin}$, $B'_{sin}$, and $D'_{sin}$ thus are to be calculated.

This may take place in various ways. It is possible, for example, to accommodate a signal component transfer function, as it is shown in FIG. 21 and described on the basis of FIG. 21. The signal component transfer function describes the measurement signal components as a function of the ideal signal components. The correction function is an inverse function of the signal component transfer function. The inverse function can be generated by mirroring the axes of the bisectrix of the first and third quadrants. In other words, for every determined measurement point representable as a pair of values, the components of this pair of values are to be exchanged so as to obtain the inverse function. The inverse function of the signal component transfer function thus obtained, which is described by discrete value pairs, may then be fitted, for example, by a third-order polynomial. The fitted third-order polynomial then represents the correction function. As already described, due to geometric symmetries, the square elements can be omitted. Due to the inverse function of the signal component transfer function known in form value pairs, only the six parameters $A'_{cos}$, $B'_{cos}$, $D'_{cos}$, $A'_{sin}$, $B'_{sin}$, and $D'_{sin}$ mentioned are to be determined. This may take place with a polynomial fit method.

The six polynomial coefficients $A'_{cos}$, $B'_{cos}$, $D'_{cos}$, $A'_{sin}$, $B'_{sin}$, and $D'_{sin}$ may, however, also be determined by a fit performed over the residual angle error. Thus, for the determination of the polynomial coefficients of the correction function, the residual angle error or angle error has to be determined. To this end, it is necessary to orthogonalize the corrected signals $COS_{corr}$ and $SIN_{corr}$. For example, this may take place by applying the following orthogonalization function:

$$Y_{ortho} = \frac{Y_{corr} - X_{corr} * \sin(\varphi)}{\cos(\varphi)} \text{ with}$$

$$X_{corr} = COS_{corr} \text{ and}$$

$$Y_{corr} = SIN_{corr}.$$

A measured angle may then be calculated from the orthogonalized signals $Y_{ortho}$ and $Y_{corr}$ with the aid of the relation $$\alpha_{meas} = \arctan\left(\frac{Y_{ortho}}{X_{corr}}\right)$$

The angle error or measurement angle error $\alpha_{err}$ here is $$\alpha_{err} = \alpha_{meas} - \alpha_{targ}.$$

In other words, a signal provided from the magnetoresistive angle sensor is at first distorted (actually: equalized) with the aid of the polynomial correction function, so as to obtain a corrected cosine component $COS_{corr}$ and a corrected sine component $SIN_{corr}$. Due to the corrected cosine component and the corrected sine component, an orthogonalization is then performed, and a measurement angle $\alpha_{meas}$ is finally calculated. The six polynomial coefficients are then optimized so that the calculated measurement angle $\alpha_{meas}$ shows minimum deviation from the actual angle or reference angle $\alpha_{targ}$. If the six polynomial coefficients of the correction functions are all determined, a measured angle can be calculated or corrected based thereupon, and the sine main component provided from the angle sensor and the accompanying cosine main component can be corrected based thereupon, so that an anisotropy error of the sine main component, the cosine main component and an angle calculated therefrom can be decreased.

Figure 22:
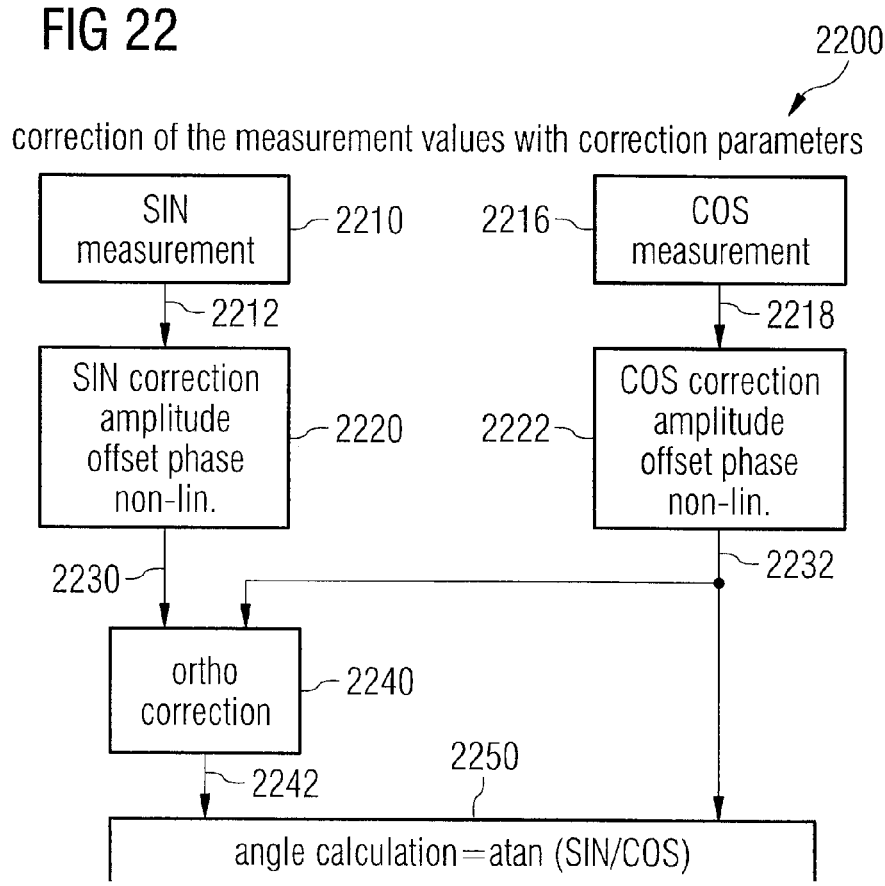
FIG. 22 is a flow diagram of an inventive method for the correction of measurement values according to a third embodiment of the present invention.

FIG. 22 shows a flowchart of an inventive method for the correction of measurement values according to a third embodiment of the present invention. The flowchart in its entirety is designated with 2200. The flowchart shows a procedure in a correction of measurement values with correction parameters describing a non-linear correction function (for example a correction polynomial). The method includes a sine measurement 2210. As a result of the sine measurement 2210, a sine main component 2212 is provided, which is supplied from the rotational angle sensor. A cosine measurement 2216 providing a cosine main component 2218 takes place in similar manner.

A sine correction 2220 is applied to the sine main component 2212. The sine correction includes calibrating amplitude and offset of the sine main component 2212. Furthermore, the sine correction may optionally include calibrating the phase. Finally, the sine correction also includes a non-linear distortion of the sine main component, which may for example be achieved by applying a third-order polynomial to the sine main component. Here, it is to be noted that the order of the correction steps can be chosen so that optimum correction of distortions takes place. Besides, it is to be noted that calibrating amplitude and offset may take place in one step with the non-linear distortion of the sine main component, for example. Here, only the coefficients of the non-linear correction function (e.g. of the correction polynomial) are to be adapted correspondingly. Besides, it is advantageous that the non-linear correction includes the amplitude and offset correction, since the required computation effort can be decreased greatly with this. A phase correction may be omitted within the scope of the sine correction, when an orthogonality correction is performed following the sine correction.

The cosine main component 2218 is also subjected to a cosine correction 2222. The cosine correction takes place in the same manner as the sine correction. Parameters used for a non-linear distortion within the scope of the cosine correction 2222 (polynomial coefficients $A'_{cos}$, $B'_{cos}$, and $D'_{cos}$, of a correction polynomial) can be equal to the parameters used in the sine correction 2220 (e.g. the polynomial coefficients $A'_{sin}$, $B'_{sin}$, and $D'_{sin}$ of the sine correction polynomial) or differ from the parameters of the sine correction. Equal parameters may be used when the sensors for the sine main component and the cosine main component are similar and similar conditions also exist otherwise.

The sine correction 2220 provides a corrected sine main signal 2230, whereas the cosine correction 2222 provides a corrected cosine main signal 2232. Based on the corrected sine main signal and on the corrected cosine main signal, then an orthogonality correction 2240 is performed, whereby an orthogonality-corrected sine main signal 2242 is generated. Based on the orthogonality-corrected sine main signal 2242 and the corrected cosine main signal 2232, then an angle calculation 2250 is performed, which finally provides a measurement angle $\alpha_{meas}$. The angle calculation may for example include an evaluation of an arctan function. For example, an arctan of a quotient of the orthogonality-corrected sine main signal 2242 and of the corrected cosine main signal 2232 can be formed to ascertain the measurement angle $\alpha_{meas}$.

As already mentioned previously, the sequence for the ascertainment of the correction parameters (i.e. for example the polynomial parameters of the correction polynomials for the sine correction 2220 and the cosine correction 2222) may take place in the same way as the just described correction itself. Preferably, in the ascertainment of the correction parameters, a FIT algorithm is applied, which optimizes all parameters (or correction parameters) for the smallest angle error. An angle error here is the deviation between the calculated angle $\alpha_{meas}$ and an actual angle or reference angle $\alpha_{targ}$, which has to be determined by external means. Here, it is preferred to take a plurality of rotational angles into account in the optimization of the parameters.

Besides, it is pointed out that in the orthogonality correction 2240 (but also generally in each orthogonality correction in which sinusoidal signals with a phase shift deviating from 90° are combined to generate orthogonal signals) an especially computation-efficient method can be employed. Conventionally, the equation $$Y_{ortho} = \frac{Y_{corr} - X_{corr} * \sin(\phi)}{\cos(\phi)}$$

can be used for achieving a phase shift for orthogonality calibrating. This equation can be simplified for implementation in a calculating system.

Here, it is assumed that an addition of two sinusoidal signals of equal frequency but different phase position in turn provides a third sinusoidal signal of equal frequency, the phase position of which deviates from the phase position of the first signal and of the second signal. A phase shift the third signal has with reference to the first signal and the second signal, respectively, here depends on the amplitude of the second added sine signal. A phase shift therefore is only possible using addition and multiplications, without having to calculate a sine function sin (.) or a cosine function cos (.). Thus:

$$Y_{ortho} = Y_{corr} + F * X_{corr}.$$

Here, F is a parameter that has to be determined only once and that can always stay the same for a correction (e.g. an orthogonality correction) in a calculating system.

Figure 23:
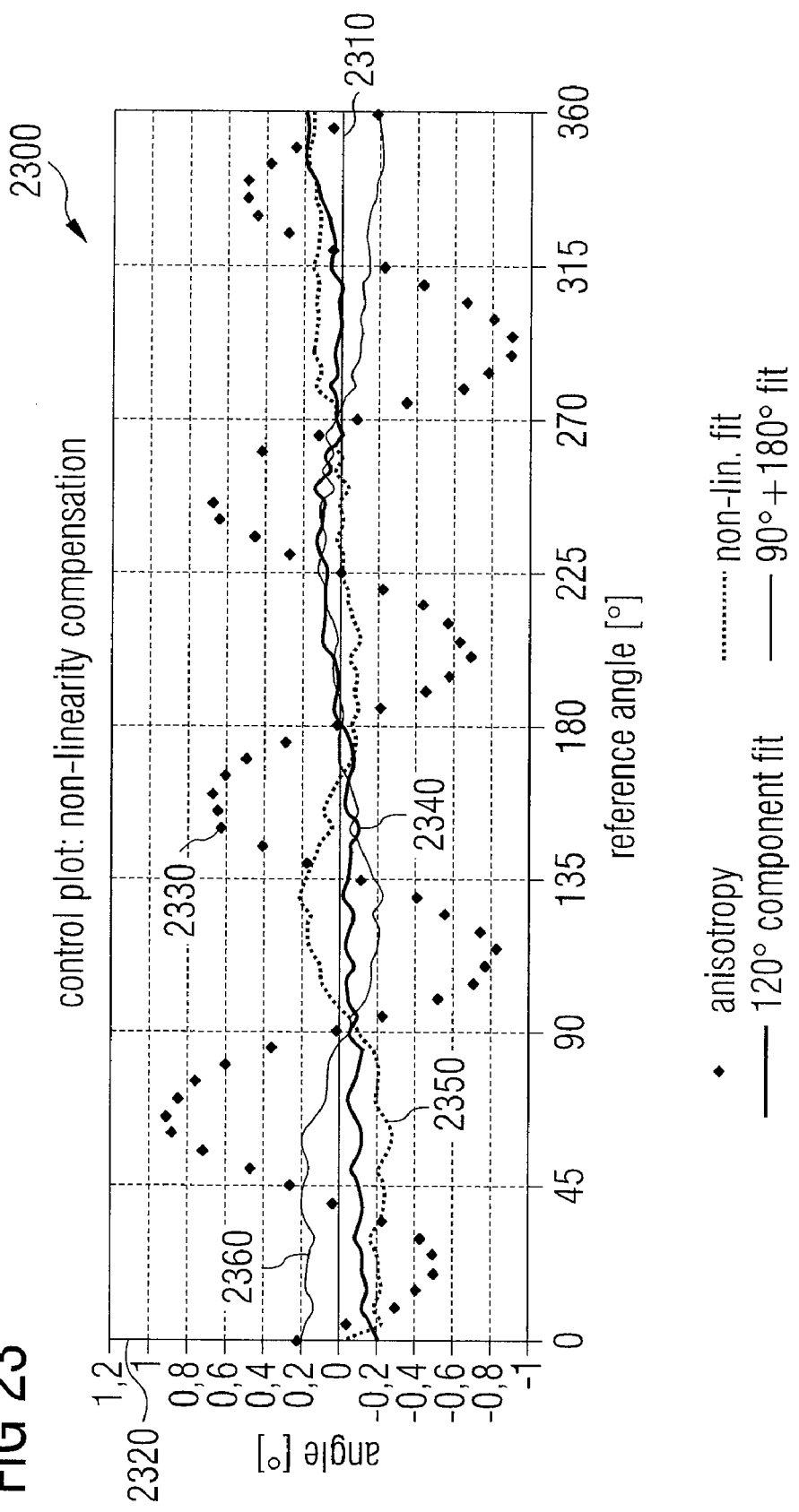
FIG. 23 is a graphical representation of an angle error as a function of a reference angle for various calibration and residual error compensation methods.

FIG. 23 shows a graphical illustration of an angle error depending on a reference angle for various calibrating and residual error compensation methods. The graphical illustration in its entirety is designated with 2300 and gives an overview of which residual angle error can be achieved with various compensation methods. On an abscissa 2310, a reference angle is plotted here between 0 degrees and 360 degrees. An ordinate 2320 shows an angle error in a range between −1 degree and +1.2 degrees.

A first curve 2330, the course of which is described by discrete values, shows an anisotropy-induced angle error depending on the reference angle, wherein no measures whatsoever for reducing the anisotropy-induced angle error are taken into account. A second curve 2340 describes a residual angle error when using a 120°-component fit. In other words, the second curve 2340 describes a case in which the sine main component and the cosine main component have been corrected with a correction quantity having a period of 120°, in order to decrease anisotropy-induced angle errors.

A third curve 2350 describes the angle-dependent angle error for the case that the sine main component and the cosine main component for a correction of the anisotropy-induced residual error have been distorted in non-linear manner ("nonlin-fit"). In other words, parameters for a non-linear transfer function or distortion function, which has been applied on the sine main component and the cosine main component, respectively, have been determined.

A fourth curve 2360 describes a residual angle error in an anisotropy correction of the residual-errored angle with a combination of a 90°-periodic sinusoidal function and a 180°-periodic sinusoidal function ("90°+180° fit"). As described previously, a residual-errored angle was calculated here, to which then a corresponding correction value on the basis of a superposition of two sinusoidal functions was added.

By an evaluation of the graphical illustration 2300, a residual error after calibrating can be determined for various correction methods. Without taking a measure for decreasing an anisotropy error into account, the residual error after the calibrating is 0.907°. This error may also be referred to as anisotropy error. However, if a 120°-component fit is performed, the residual error after the calibrating is only 0.199 degrees. The anisotropy error correction is here applied to the sine main signal and the cosine main signal. If a 90°+180° angle fit is employed for decreasing the anisotropy error, the residual error after the calibrating is 0.215 degrees. The anisotropy error correction here acts on the residual-errored angle value. An anisotropy error correction with the aid of a non-linearity fit entails a residual error of 0.252 degrees after the calibrating. Here, a non-linear transfer function is applied to the sine main signal and the cosine main signal.

From the above comparison, it can be seen that the 120°-component fit provides the first results. The polynomial fit (non-linearity fit), however, offers advantages in the implementation of the correction function, since it is easier to evaluate a polynomial function than a sinusoidal function.

Figure 24:
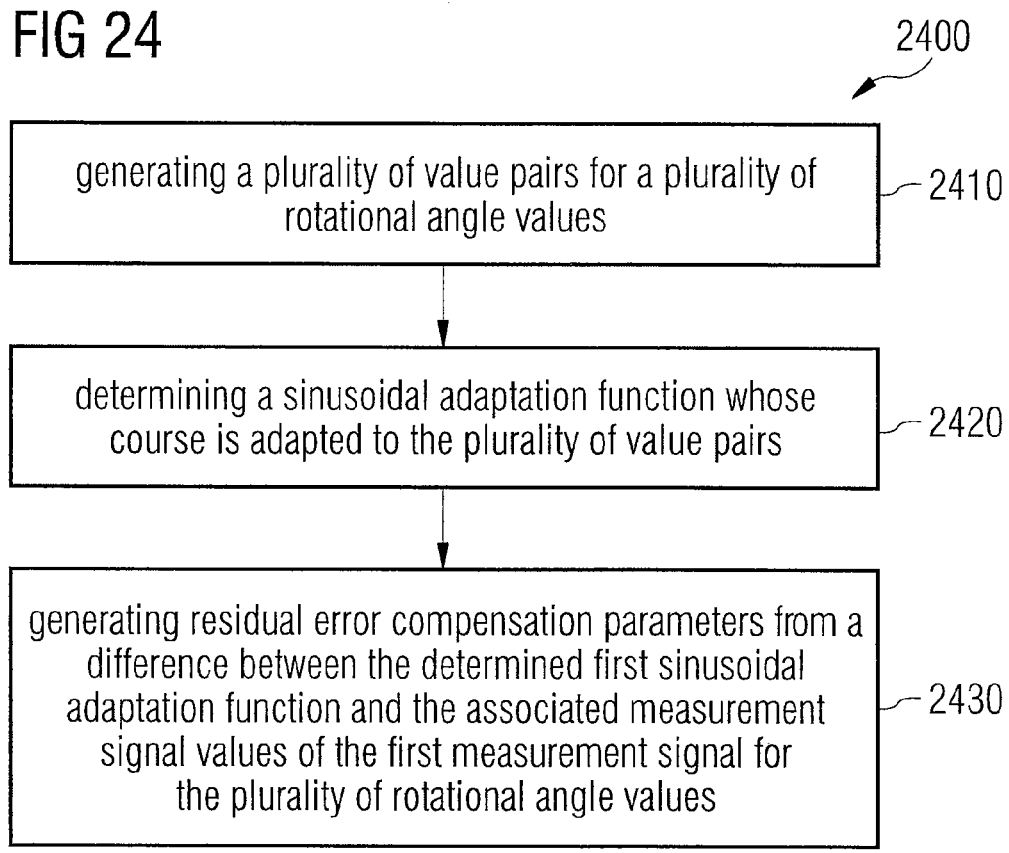
FIG. 24 is a flow diagram of an inventive method for determining correction parameters according to a fourth embodiment of the present invention.

FIG. 24 shows a flowchart of an inventive method of determining correction parameters according to a fourth embodiment of the present invention. The flowchart in its entirety is designated with 2400. The method shown is designed so as to determine residual error compensation parameters for a magnetoresistive angle sensor, wherein the angle sensor provides a first measurement signal depending on a rotational angle describing an angle between a magnetic field direction of a measurement magnetic field and a preferred direction of the magnetoresistive angle sensor. The method shown includes a first step 2410 in which a plurality of value pairs for a plurality of rotational angle values are generated. Each value pair of the plurality of value pairs comprises a rotational angle value and an associated measurement signal value of the first measurement signal.

In a second step 2420, a sinusoidal fit function is ascertained, the course of which is adapted to the plurality of value pairs.

In a third step 2430, a residual error compensation parameter is generated from a difference between the ascertained first sinusoidal fit function and the associated measurement signal values of the first measurement signal for the plurality of rotational angle values. In other words, the difference between the ascertained first sinusoidal fit function and the associated measurement signal values of the first measurement signal is described by a plurality of residual error compensation parameters.

Figure 25:
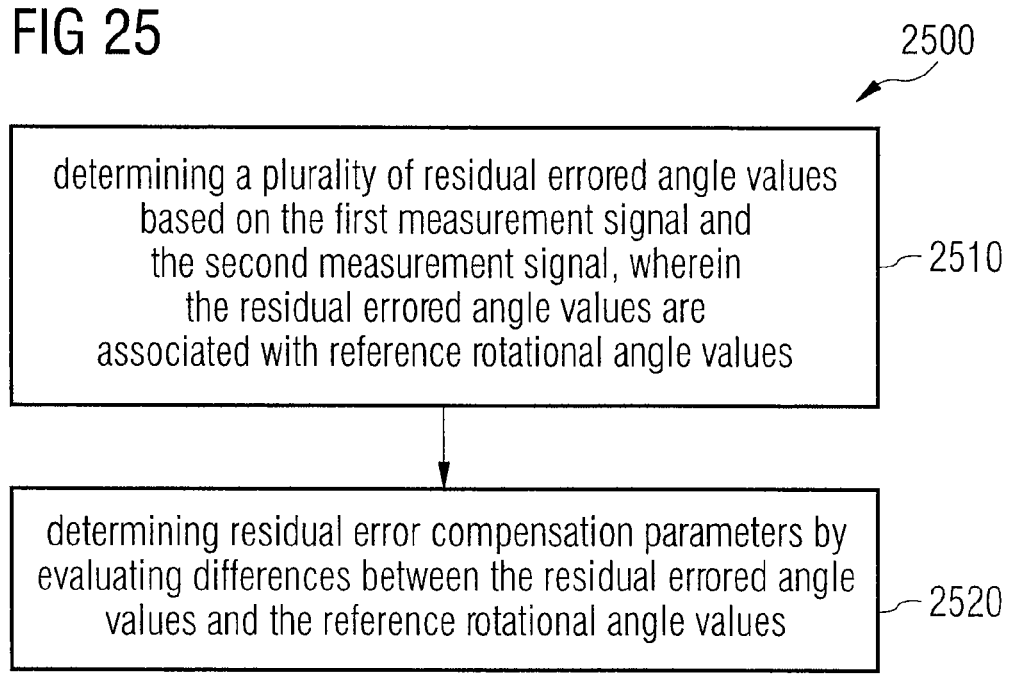
FIG. 25 is a flow diagram of an inventive method for determining correction parameters according to a fifth embodiment of the present invention.

FIG. 25 shows a flowchart of an inventive method for the determination of correction parameters according to a fifth embodiment of the present invention. The flowchart in its entirety is designated with 2500. The method shown is suited to determine residual error compensation parameters for a magnetoresistive angle sensor. Here, it is assumed that the magnetoresistive angle sensor provides a first measurement signal and a second measurement signal depending on a rotational angle describing an angle between a magnetic field direction of a measurement magnetic field and a preferred direction of the magnetoresistive angle sensor.

In a first step 2510, a plurality of residual-errored angle values is ascertained based on the first measurement signal and the second measurement signal, wherein the residual-errored angle values are associated with reference rotational angle values.

In a second step 2520, residual error compensation parameter are ascertained by evaluating differences between the residual-errored angle values and the reference angle values for the plurality of reference rotational angle values.

In summary, it can be stated that the present invention provides a method for the reduction of the angle error of angle sensors of magnetoresistive sensor elements based on the gigantic magnetoresistive effect or the tunnel magnetoresistive effect (GMR effect, TMR effect). The method for the reduction of the angle error is characterized in that deviations from measurement quantities and ideal behavior are used for compensation. Defined periodicities of the deviations from measurement quantities and ideal behavior are here used for parameterized compensation of the measurement quantities. Furthermore, deviations from measurement quantities and ideal behaviors can be deposited in a lookup table and used later for compensation of the measurement quantities. The correction amplitudes acquired at a temperature and filed in the lookup table can also be adapted to the current temperature (at which the angle sensor is) via a typical temperature coefficient of the GMR/TMR signal amplitude. In similar manner, correction amplitudes acquired at a temperature, which are used for parameterized compensation of the measurement quantities, can be adapted to the current temperature via a typical temperature coefficient of the GMR/TMR signal amplitude.

A further inventive method for the reduction of the angle error of angle sensors of magnetoresistive sensor elements based on the GMR effect or the TMR effect is characterized in that deviations of angles ascertained from the measurement quantities from reference angles are used for compensation. Here, again defined periodicities of the deviations of the angles ascertained from the measurement quantities from the accompanying reference angles (describing an ideal performance) can be used for a parameterized compensation of the determined angle. Besides, the deviations of the angles ascertained from the measurement quantities from the reference angles can be deposited in a lookup table and used for the compensation of errors at an ascertained angle.

In general, it can also be stated that the present invention provides a method for the reduction of the angle error of angle sensors of magnetoresistive sensor elements based on the anisotropic magnetoresistive effect (AMR effect), the gigantic magnetoresistive effect (GMR effect), or the tunnel magnetoresistive effect (TMR effect). The method according to the invention is characterized in that deviations of components/measurement quantity and ideal performance are calibrated according to a certain method. To this end, a polynomial representing deviations of measurement quantity and ideal performance and used for a compensation of the measurement quantities can be ascertained. It is preferred that correction functions used to calculate back to an ideal behavior from the measurement quantity are also represented in form of polynomials. The correction functions are then used for the compensation of the measurement quantities, that is for the decrease of anisotropy-induced errors. The correction functions, which are suitable to calculate back the ideal behavior from the measurement quantity, can also be represented in form of simplified polynomials, wherein the square portion can be omitted, for example. With this, the computation performance is increased and the required computation time decreased. The simplified polynomials may then be used as correction functions for a compensation of the measurement quantities. Correction functions suitable to calculate back the ideal behavior from the components/measurement quantities can be deposited in a lookup table for implementation reasons. Thereby, the computation performance can also be improved and the computation time decreased. The entries of the lookup table can be used for the compensation of the measurement quantities provided from the angle sensor. The polynomial correction amplitudes (polynomial coefficients) acquired at a temperature can be adapted to the current temperature via the typical temperature coefficient of the polynomial parameters of the AMR, GMR, or TMR signal amplitudes. In other words, temperature coefficients for the polynomial coefficients can be determined, so that the polynomial coefficients are adapted to the temperature. It is also possible to adapt the polynomial coefficients depending on a signal amplitude of the measurement signals provided from the angle sensor. The polynomial correction amplitudes (polynomial coefficients) acquired at a temperature and filed in a lookup table can further be adapted to the current temperature via a typical temperature coefficient of the GMR/TMR signal amplitude. In other words, the polynomial coefficients can be scaled with the signal amplitude of the signals provided from the magnetic field sensor.

Furthermore, the present invention provides a method for the reduction of an orthogonality error with a simple calculating unit. Here, to a first component measurement signal, at least a second component measurement signal is superimposed by simple addition or subtraction, in order to attain a phase shift of the first measurement signal. Thus, orthogonality can be generated between the first measurement signal and the second measurement signal (component measurement signal).

The present invention thus generally provides a method for the reduction of an anisotropy error in a magnetoresistive angle sensor. The present invention particularly enables an implementation-friendly reduction in the anisotropy-rooted measurement error in a magnetoresistive angle sensor. Thus, the present invention enables an anisotropy-induced angle error to be reduced with a very simple calculating unit, using only additions and multiplications. Furthermore, only a very small memory area is required for the filing of compensation parameters.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of determining residual error compensation parameters for a magnetoresistive angle sensor, wherein the angle sensor provides a first measurement signal depending on a rotational angle describing an angle between a magnetic field direction of a measurement magnetic field and a preferred direction of the magnetoresistive angle sensor, comprising the steps of:

generating a first plurality of value pairs for a plurality of rotational angle values, wherein each value pair of the first plurality of value pairs comprises a rotational angle value and an associated measurement signal value of the first measurement signal;

ascertaining a first sinusoidal fit function, the course of which is adapted to the first plurality of value pairs; and generating the residual error compensation parameters from a difference between the ascertained first sinusoidal fit function and the associated measurement signal values of the first measurement signal for the plurality of rotational angle values.

2. A method according to claim 1, wherein the angle sensor further provides a second measurement signal, comprising the further steps of:

generating a second plurality of value pairs for the plurality of rotational angle values, wherein each value pair of the second plurality of value pairs comprises a rotational angle value and an associated measurement signal value of the second measurement signal;

ascertaining a second sinusoidal fit function, the course of which is adapted to the second plurality of value pairs; and generating further residual error compensation parameters from a difference between the ascertained second sinusoidal fit function and the associated measurement signal values of the second measurement signal for the plurality of rotational angle values.

3. A method according to claim 1, wherein generating the residual error compensation parameters comprises approximating the angle-dependent differences between the ascertained first sinusoidal fit function and the associated measurement signal values of the first measurement signal by a first angle-dependent function;

wherein, in approximating, function parameters of the first angle-dependent function are ascertained such that the first angle-dependent function approximates the angle-dependent differences between the ascertained first sinusoidal fit function and the associated measurement signal values of the first measurement signal in a best possible manner with reference to a mathematical distance measure; and wherein the ascertained function parameters of the first angle-dependent function form the residual error compensation parameters.

4. A method according to claim 2, wherein generating the further residual error compensation parameters comprises approximating the angle-dependent differences between the ascertained second sinusoidal fit function and the associated measurement signal values of the second measurement signal by a second angle-dependent function;

wherein, in approximating, function parameters of the second angle-dependent functions are ascertained such that the second angle-dependent function approximates the angle-dependent differences between the ascertained second sinusoidal fit function and the associated measurement signal values of the second measurement signal in a best possible manner with reference to a mathematical distance measure; and wherein the ascertained function parameters of the second angle-dependent function form the further residual error compensation parameters.

5. A method according to claim 3, wherein the first angle-dependent function comprises a periodic angle dependence, and wherein the second angle-dependent function comprises a periodic angle dependence.

6. A method according to claim 3, wherein the first angle-dependent function is a sine function, wherein the function parameters to be ascertained of the first angle-dependent function comprise an amplitude of the sine function and a phase position of the sine function.

7. A method according to claim 6, wherein the function parameters of the first angle-dependent function to be ascertained comprise an offset of the sine function.

8. The method of determining residual error compensation parameters of claim 6, wherein the first sinusoidal fit function comprises a basic period, and wherein the first angle-dependent function comprises a period equal to a fraction of the basic period.

9. A method according to claim 6, wherein the first sinusoidal fit function comprises a basic period of 360 degrees, and wherein the first angle-dependent function comprises a period of 120 degrees.

10. A method according to claim 6, wherein an offset of the first angle-dependent function is set to zero.

11. A method according to claim 3, wherein the first angle-dependent function is a superposition of at least two sinusoidal functions, wherein the function parameters of the first angle-dependent function to be ascertained are amplitudes and phase positions of the at least two sinusoidal functions.

12. A method according to claim 1, wherein generating the residual error compensation parameters comprises filing the differences between the ascertained first sinusoidal fit function and the associated measurement signal values of the first measurement signal for the plurality of rotational angles in a lookup table, wherein the filed differences form the residual error compensation parameters.

13. A method according to claim 1, further comprising the step of:

ascertaining a field strength dependence of the residual error compensation parameters by repeating the steps of generating a first plurality of value pairs for a plurality of rotational angle values, of ascertaining a first sinusoidal fit function, and of generating the residual error compensation parameters for at least two field strength values of the measurement magnetic field interspersing the angle sensor.

14. A method according to claim 1, further comprising the step of:

ascertaining a temperature dependence of the residual error compensation parameters by repeating the steps of generating a first plurality of value pairs for a plurality of rotational angle values, of ascertaining a first sinusoidal fit function, and of generating the residual error compensation parameters for at least two temperatures at which the angle sensor is.

15. A method according to claim 1, further comprising the step of:

ascertaining an amplitude dependence of the residual error compensation parameters by repeating the steps of generating a first plurality of value pairs for a plurality of rotational angle values, of ascertaining a first sinusoidal fit function, and of generating the residual error compensation parameters for at least two amplitude values of the first measurement signal.

16. A method according to claim 1, further comprising the steps of:

precorrecting a first sensor signal provided from the angle sensor by calibrating an amplitude of the first sensor signal and an offset of the first sensor signal, in order to obtain a precorrected first sensor signal;

precorrecting a second sensor signal provided from the angle sensor by calibrating an amplitude of the second sensor signal and an offset of the second sensor signal, in order to obtain a precorrected second sensor signal;

combining the precorrected first sensor signal and the precorrected second sensor signal, in order to obtain the first measurement signal and the second measurement signal, wherein combining the precorrected first sensor signal and the precorrected second sensor signal takes place using a phase position of the first sinusoidal fit function and of the second sinusoidal fit function in such a manner that the first measurement signal and the second measurement signal comprise a phase shift of 90° at a change of the rotational angle.

17. A method of decreasing a residual angle error in a magnetoresistive angle sensor, wherein the magnetoresistive angle sensor provides a first measurement signal and a second measurement signal depending on a rotational angle describing an angle between a magnetic field direction of a measurement magnetic field and a preferred direction of the magnetoresistive angle sensor, comprising the steps of:

ascertaining of a residual-errored angle quantity using the first measurement signal and the second measurement signal;

providing residual error compensation parameters and further residual error compensation parameters according to a method of determining residual error compensation parameters for a magnetoresistive angle sensor, wherein the angle sensor provides a first measurement signal depending on a rotational angle describing an angle between a magnetic field direction of a measurement magnetic field and a preferred direction of the magnetoresistive angle sensor, comprising the steps of:

generating a first plurality of value pairs for a plurality of rotational angle values, wherein each value pair of the first plurality of value pairs comprises a rotational angle value and an associated measurement signal value of the first measurement signal;

ascertaining a first sinusoidal fit function, the course of which is adapted to the first plurality of value pairs; and generating the residual error compensation parameters from a difference between the ascertained first sinusoidal fit function and the associated measurement signal values of the first measurement signal for the plurality of rotational angle values;

ascertaining a first correction quantity using the residual error compensation parameters and the residual-errored angle quantity;

ascertaining a second correction quantity using the further residual error compensation parameters and the residual-errored angle quantity;

correcting the first measurement signal with the first correction quantity, in order to obtain a first residual-error-corrected measurement signal;

correcting the second measurement signal with the second correction quantity, in order to obtain a second residual-error-corrected measurement signal; and ascertaining a residual-error-corrected angle quantity using the first residual-error-corrected measurement signal and the second measurement-error-corrected measurement signal.

18. A method according to claim 17, wherein, in the method of determining residual error compensation parameters:

generating the residual error compensation parameters comprises approximating the angle-dependent differences between the ascertained first sinusoidal fit function and the associated measurement signal values of the first measurement signal by a first angle-dependent function;

in the step of approximating, function parameters of the first angle-dependent function are ascertained such that the first angle-dependent function approximates the angle-dependent differences between the ascertained first sinusoidal fit function and the associated measurement signal values of the first measurement signal in a best possible manner with reference to a mathematical distance measure; and the ascertained function parameters of the first angle-dependent function form the residual error compensation parameters; and wherein the step of ascertaining the first correction quantity comprises evaluating the first angle-dependent function for the residual-errored angle quantity, wherein the function parameters of the first angle-dependent function are fixed by the residual error compensation parameters.

19. A method according to claim 17, wherein, in the method of determining residual error compensation parameters:

generating the residual error compensation parameters comprises approximating the angle-dependent differences between the ascertained first sinusoidal fit function and the associated measurement signal values of the first measurement signal by a first angle-dependent function;

in the step of approximating, function parameters of the first angle-dependent function are ascertained such that the first angle-dependent function approximates the angle-dependent differences between the ascertained first sinusoidal fit function and the associated measurement signal values of the first measurement signal in a best possible manner with reference to a mathematical distance measure;

the ascertained function parameters of the first angle-dependent function form the residual error compensation parameters;

the first angle-dependent function is a sine function; and the function parameters to be ascertained of the first angle-dependent function comprise an amplitude of the sine function and a phase position of the sine function; and wherein the step of ascertaining the first correction quantity comprises evaluating the sine function forming the first angle-dependent function for the residual-errored angle quantity, wherein amplitude, phase, and offset of the sine function are fixed by the residual error compensation parameters.

20. A method according to claim 17, wherein, in the method of determining residual error compensation parameters:

generating the residual error compensation parameters comprises filing the differences between the ascertained first sinusoidal fit function and the associated measurement signal values of the first measurement signal for the plurality of rotational angles in a lookup table, and the filed differences form the residual error compensation parameters; and wherein ascertaining the first correction quantity comprises reading out the first correction quantity from a field of the lookup table pertaining to the residual-errored angle quantity.

21. A method according to claim 17, wherein correcting the first measurement signal comprises adding the correction quantity to the first measurement signal or subtracting the correction quantity from the first measurement signal.

22. A method according to claim 17, wherein ascertaining the first correction quantity takes place taking a temperature dependence of the first correction quantity into account.

23. A method according to claim 22, wherein ascertaining the first correction quantity comprises scaling the first correction quantity depending on a temperature at which the angle sensor is, using a temperature coefficient, wherein the temperature coefficient is a measure for a change in a signal amplitude of the first measurement signal with a change in the temperature.

24. A method according to claim 17, wherein ascertaining the first correction quantity comprises scaling the first correction quantity depending on a signal amplitude of the first measurement signal.

25. A method according to claim 17, wherein ascertaining the first correction quantity comprises scaling the first correction quantity depending on a magnetic field strength of the measurement magnetic field.

26. A method according to claim 17, further comprising the steps of:
precorrecting a first sensor signal provided from the angle sensor by calibrating an amplitude of the first sensor signal and an offset of the first sensor signal, in order to obtain a precorrected first sensor signal;
precorrecting a second sensor signal provided from the angle sensor by calibrating an amplitude of the second sensor signal and an offset of the second sensor signal, in order to obtain a precorrected second sensor signal; and
combining the precorrected first sensor signal and the precorrected second sensor signal, in order to obtain the first measurement signal and the second measurement signal, wherein combining the precorrected first sensor signal and the precorrected second sensor signal takes place using a phase position of the first sinusoidal fit function and of the second sinusoidal fit function in such a manner that the first measurement signal and the second measurement signal comprise a phase shift of 90 degrees at a change in the rotational angle.

27. A method of determining residual error compensation parameters for a magnetoresistive angle sensor, wherein the magnetoresistive angle sensor provides a first measurement signal and a second measurement signal depending on a rotational angle describing an angle between a magnetic field direction of a measurement magnetic field and a preferred direction of the magnetoresistive angle sensor, comprising the steps of:
ascertaining a plurality of residual-errored angle values based on the first measurement signal and the second measurement signal for a plurality of reference rotational angle values, so that the residual-errored angle values are associated with the reference rotational angle values; and
ascertaining the residual error compensation parameters by evaluating angle-dependent differences between the ascertained residual-errored angle values and the reference rotational angle values for the plurality of reference rotational angle values.

28. A method according to claim 27, wherein ascertaining the residual error compensation parameters comprises approximating the angle-dependent differences between the ascertained residual-errored angle values and the reference rotational angle by an angle-dependent function,
wherein, in approximating, function parameters of the angle-dependent function are ascertained such that the angle-dependent function approximates the angle-dependent differences between the ascertained residual-errored angle values and the reference rotational angle values in a sufficiently accurate manner with reference to a mathematical distance measure; and
wherein the ascertained function parameters of the angle-dependent function form the residual error compensation parameters.

29. A method according to claim 28, wherein the angle-dependent function comprises a periodic angle dependence.

30. A method according to claim 28, wherein the angle-dependent function is a sine function,
wherein the function parameters to be ascertained of the angle-dependent function comprise an amplitude of the sine function and a phase position of the sine function.

31. A method according to claim 30, wherein the function parameters to be ascertained of the angle-dependent function comprise an offset of the sine function.

32. A method according to claim 28, wherein the first measurement signal is periodic with reference to a rotational angle and comprises a basic period, and wherein the angle-dependent function comprises a period equal to a fraction of the basic period.

33. A method according to claim 28, wherein the first measurement signal comprises a basic period of 360 degrees, and wherein the angle-dependent function comprises a period of 90 degrees.

34. A method according to claim 28, wherein an offset of the first angle-dependent function is set to zero.

35. A method according to claim 28, wherein the angle-dependent function is a superposition of at least two sinusoidal functions, and
wherein the ascertained function parameters of the angle-dependent function are amplitudes and phase positions of the at least two sinusoidal functions.

36. A method according to claim 35, wherein the first measurement signal is periodic with reference to the rotational angle and comprises a basic period, and
wherein the angle-dependent function is a superposition of at least a first sine function, the period of which is one quarter of the basic period, and a second sine function, the period of which is half the basic period.

37. A method according to claim 36, wherein the first measurement signal comprises a basic period of 360 degrees, wherein the first sine function comprises a period of 90 degrees, and wherein the second sine function comprises a period of 180 degrees.

38. A method according to claim 27, wherein ascertaining the residual error compensation parameters comprises filing the difference between the residual-errored angle values and the reference rotational angle values for the plurality of reference rotational angle values in a lookup table,
wherein filed entries of the lookup table form the residual error compensation parameters.

39. A method according to claim 27, wherein ascertaining the residual error compensation parameters comprises the further steps of:
distorting the first measurement signal by applying a non-linear transfer function to the first measurement signal, wherein the first non-linear transfer function is described by a first set of parameters;
optimizing the parameters of the first set of parameters, so that the angle-dependent differences between the residual-errored angle values and the reference rotational angle values become sufficiently small with reference to a mathematical distance measure, wherein ascertaining the residual-errored angle values takes place using the distorted first measurement signal, and wherein the optimized parameters of the first set of parameters form the residual error compensation parameters or a subset of the residual error compensation parameters.

40. A method according to claim 39, wherein ascertaining the residual error compensation parameters comprises the further steps of:

distorting the second measurement signal by applying a second non-linear transfer function to the second measurement signal, wherein the second non-linear transfer function is described by a second set of parameters;

optimizing the parameters of the second set of parameters, so that the angle-dependent differences between the residual-errored angle values and the reference rotational angle values become sufficiently small with reference to a mathematical distance measure, wherein ascertaining the residual-errored angle values takes place using the distorted second measurement signal, and wherein the optimized parameters of the first set of parameters together with the optimized parameters of the second set of parameters form the residual error compensation parameters.

41. A method according to claim 27, wherein ascertaining the residual error compensation parameters comprises the further steps of:

distorting the first measurement signal by applying a first non-linear transfer function to the first measurement signal, wherein the first non-linear transfer function is described by a first set of parameters;

distorting the second measurement signal by applying a second non-linear transfer function to the second measurement signal, wherein the second non-linear transfer function is described by a second set of parameters;

optimizing the parameters of the first set of parameters and the parameters of the second set of parameters, so that the angle-dependent differences between the residual-errored angle values and the reference rotational angle values become sufficiently small with reference to a mathematical distance measure, wherein ascertaining the residual-errored angle values takes place using the distorted first measurement signal and the distorted second measurement signal, and wherein the optimized parameters of the first set of parameters together with the optimized parameters of the second set of parameters form the residual error compensation parameters.

42. A method according to claim 39, wherein the first non-linear transfer function is a first third-order polynomial function, wherein the parameters of the first set of parameters are polynomial coefficients of the first polynomial function.

43. A method according to claim 40, wherein the second non-linear transfer function is a second third-order polynomial function, wherein the parameters of the second set of parameters are polynomial coefficients of the second polynomial function.

44. A method according to claim 42, wherein a square element of the first third-order polynomial function disappears and/or wherein a square element of the second third-order polynomial function disappears.

45. A method according to claim 39, wherein the first non-linear transfer function is fixed by entries of a first lookup table determining an association between values of the first measurement signal and accompanying values of the distorted first measurement signal, wherein the entries of the first lookup table form the first set of parameters; and/or wherein the second non-linear transfer function is fixed by entries of a second lookup table determining an association between values of the second measurement signal and accompanying values of the distorted second measurement signal, wherein the entries of the second lookup table form a second set of parameters.

46. A method according to claim 39, further comprising the steps of:

combining the distorted first measurement signal and the distorted second measurement signal, wherein combining takes place such that, by combining, two signals comprising a phase shift of 90 degrees at a change in the rotational angle are formed; and using the signals formed by combining for ascertaining the plurality of residual-errored angle values.

47. A method according to claim 46, wherein a deviation of 90 degrees of a phase shift between the distorted first measurement signal and the distorted second measurement signal is filed as an orthogonality error parameter.

48. A method according to claim 46, wherein combining the distorted first measurement signal and the distorted second measurement signal comprises summing the distorted first measurement signal and a product of the distorted second measurement signal and a temporally constant value.

49. A method according to claim 27, further comprising the steps of:

precorrecting a first sensor signal provided from the angle sensor by calibrating an amplitude of the first sensor signal and an offset of the first sensor signal, in order to obtain the first measurement signal; and precorrecting a second sensor signal provided from the angle sensor by calibrating an amplitude of the second sensor signal and an offset of the second sensor signal, in order to obtain the second measurement signal.

50. A method of decreasing a residual angle error in a magnetoresistive angle sensor, wherein the magnetoresistive angle sensor provides a first measurement signal and a second measurement signal depending on a rotational angle describing an angle between a magnetic field direction of a measurement magnetic field and a preferred direction of the magnetoresistive angle sensor, comprising the steps of:

ascertaining a residual-errored angle quantity using the first measurement signal and the second measurement signal;

providing residual error compensation parameters according to a method of determining residual error compensation parameters for a magnetoresistive angle sensor, wherein the magnetoresistive angle sensor provides a first measurement signal and a second measurement signal depending on a rotational angle describing an angle between a magnetic field direction of a measurement magnetic field and a preferred direction of the magnetoresistive angle sensor, comprising the steps of:

ascertaining a plurality of residual-errored angle values based on the first measurement signal and the second measurement signal for a plurality of reference rotational angle values, so that the residual-errored angle values are associated with the reference rotational angle values; and ascertaining the residual error compensation parameters by evaluating angle-dependent differences between the ascertained residual-errored angle values and the reference rotational angle values for the plurality of reference rotational angle values;

wherein ascertaining the residual error compensation parameters comprises approximating the angle-dependent differences between the ascertained residual-errored angle values and the reference rotational angle by an angle-dependent function, wherein, in approximating, function parameters of the angle-dependent function are ascertained such that the angle-dependent function approximates the angle-dependent differences between the ascertained residual-errored angle values and the reference rotational angle values in a sufficiently accurate manner with reference to a mathematical distance measure; and wherein the ascertained function parameters of the angle-dependent function form the residual error compensation parameters; and ascertaining a residual-error-corrected angle quantity using the residual error compensation parameters and the residual-errored angle quantity.

51. A method according to claim 50, wherein ascertaining the residual-error-corrected angle quantity comprises the steps of:

evaluating the angle-dependent function for the residual-errored angle quantity, in order to obtain a correction quantity, wherein the function parameters of the angle-dependent function are fixed by the residual error compensation parameters; and adding the correction quantity to the residual-errored angle quantity or subtracting the correction quantity from the residual-errored angle quantity, in order to obtain the residual-error-corrected angle quantity.

52. A method according to claim 50, wherein, in the method of determining residual error compensation parameters:

ascertaining the residual error compensation parameters comprises filing the difference between the residual-errored angle values and the reference rotational angle values for the plurality of reference rotational angle values in a lookup table, and filed entries of the lookup table form the residual error compensation parameters; and wherein ascertaining the residual-error-corrected angle quantity comprises the steps of:

ascertaining a correction quantity by reading out the correction quantity from a field of the lookup table pertaining to the residual-errored angle quantity; and adding the correction quantity to the residual-errored angle quantity or subtracting the correction quantity from the residual-errored angle quantity.

53. A method according to claim 51, wherein ascertaining the correction quantity takes place taking a temperature dependence of the correction quantity into account.

54. A method according to claim 51, wherein ascertaining the correction quantity comprises scaling the correction quantity depending on a temperature at which the angle sensor is, using a temperature coefficient, wherein the temperature coefficient is a measure for a change in a signal amplitude of the first measurement signal with a change in the temperature.

55. A method according to claim 51, wherein ascertaining the correction quantity comprises scaling the correction quantity depending on an amplitude of the first measurement signal.

56. A method according to claim 51, wherein ascertaining the correction quantity comprises scaling the correction quantity depending on a magnetic field strength of the measurement magnetic field.

57. A method of decreasing a residual angle error in a magnetoresistive angle sensor, wherein the angle sensor provides a first measurement signal and a second measurement signal depending on a rotational angle describing an angle between a magnetic field direction of a measurement magnetic field and a preferred direction of the magnetoresistive angle sensor, comprising the steps of:

providing residual error compensation parameters according to a method of determining residual error compensation parameters for a magnetoresistive angle sensor, wherein the magnetoresistive angle sensor provides a first measurement signal and a second measurement signal depending on a rotational angle describing an angle between a magnetic field direction of a measurement magnetic field and a preferred direction of the magnetoresistive angle sensor, comprising the steps of:

ascertaining a plurality of residual-errored angle values based on the first measurement signal and the second measurement signal for a plurality of reference rotational angle values, so that the residual-errored angle values are associated with the reference rotational angle values; and ascertaining the residual error compensation parameters by evaluating angle-dependent differences between the ascertained residual-errored angle values and the reference rotational angle values for the plurality of reference rotational angle values, wherein ascertaining the residual error compensation parameters comprises the further steps of:

distorting the first measurement signal by applying a non-linear transfer function to the first measurement signal, wherein the first non-linear transfer function is described by a first set of parameters;

optimizing the parameters of the first set of parameters, so that the angle-dependent differences between the residual-errored angle values and the reference rotational angle values become sufficiently small with reference to a mathematical distance measure, wherein ascertaining the residual-errored angle values takes place using the distorted first measurement signal, and wherein the optimized parameters of the first set of parameters form the residual error compensation parameters or a subset of the residual error compensation parameters;

ascertaining a first residual-error-corrected measurement signal based on the first measurement signal using the residual error compensation parameters;

ascertaining a second residual-error-corrected measurement signal based on the second measurement signal using the residual error compensation parameters; and ascertaining a residual-error-corrected angle quantity using the first residual-error-corrected measurement signal and the second residual-error-corrected measurement signal.

58. A method according to claim 57, wherein, in the method of determining residual error compensation parameters:

the first non-linear transfer function is a first third-order polynomial function, and the parameters of the first set of parameters are polynomial coefficients of the first polynomial function; and wherein ascertaining the first residual-error-corrected measurement signal comprises applying the first polynomial function to the first measurement signal, wherein a function value of the first polynomial function represents the first residual-error-corrected measurement signal, and wherein the polynomial coefficients of the first polynomial function are fixed by the residual error compensation parameters; and/or wherein ascertaining the second residual-error-corrected measurement signal comprises applying the second polynomial function to the second measurement signal, wherein a function value of the second polynomial function represents the second residual-error-corrected measurement signal, and wherein the polynomial coefficients of the second polynomial function are fixed by the residual error compensation parameters.

59. A method according to claim 57, wherein, in the method of determining residual error compensation parameters:
- the first non-linear transfer function is fixed by entries of a first lookup table determining an association between values of the first measurement signal and accompanying values of the distorted first measurement signal, wherein the entries of the first lookup table form the first set of parameters; and/or
- the second non-linear transfer function is fixed by entries of a second lookup table determining an association between values of the second measurement signal and accompanying values of the distorted second measurement signal, wherein the entries of the second lookup table form a second set of parameters;
- wherein ascertaining the first residual-error-corrected measurement signal comprises reading out a first entry fixed by the first residual-errored measurement signal from the first lookup table and determining the first residual-error-corrected measurement signal based on the first entry; and/or
- wherein ascertaining the second residual-error-corrected measurement signal comprises reading out a second entry fixed by the second residual-errored measurement signal from the second lookup table and determining the second residual-error-corrected measurement signal based on the second entry.

60. A method according to claim 57, further comprising the steps of:
- precorrecting a first sensor signal provided from the angle sensor by calibrating an amplitude of the first sensor signal and an offset of the first sensor signal, in order to obtain the first measurement signal;
- precorrecting a second sensor signal provided from the angle sensor by calibrating an amplitude of the second sensor signal and an offset of the second sensor signal, in order to obtain the second measurement signal.

61. A method according to claim 57, wherein ascertaining the residual-error-corrected angle quantity comprises the further steps of:
- combining the first residual-error-corrected measurement signal and the second residual-error-corrected measurement signal, wherein combining takes place using the orthogonality error parameters in such a manner that two orthogonality-corrected signals develop, which comprise a phase shift of 90 degrees at a change in the rotational angle; and
- deriving the residual-error-corrected angle quantity from the two orthogonality-corrected signals.

62. The method of decreasing a residual angle error of claim 57, wherein ascertaining the first residual-error-corrected measurement signal comprises adapting the residual error compensation parameters depending on a temperature at which the rotational angle sensor is; and
- wherein ascertaining the second residual-error-corrected measurement signal comprises adapting the residual error compensation parameters depending on the temperature at which the rotational angle sensor is.

63. A method according to claim 57, wherein ascertaining the first residual-error-corrected measurement signal comprises adapting the residual error compensation parameters depending on a magnetic field strength of the measurement magnetic field.

64. A method according to claim 57, wherein ascertaining the second residual-error-corrected measurement signal comprises adapting the residual error compensation parameters depending on a magnetic field strength of the measurement magnetic field.

* * * * *